United States Patent
Aoyama et al.

(10) Patent No.: US 11,056,632 B2
(45) Date of Patent: Jul. 6, 2021

(54) THERMOELECTRIC CONVERSION SUBSTRATE, THERMOELECTRIC CONVERSION MODULE AND METHOD FOR PRODUCING THERMOELECTRIC CONVERSION SUBSTRATE

(71) Applicant: Panasonic Intellectual Property Management Co., Ltd., Osaka (JP)

(72) Inventors: Takuji Aoyama, Hyogo (JP); Satoshi Maeshima, Kyoto (JP); Tatsuo Sasaoka, Osaka (JP); Junya Tanaka, Osaka (JP); Noboru Yamamoto, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 93 days.

(21) Appl. No.: 16/190,388

(22) Filed: Nov. 14, 2018

(65) Prior Publication Data
US 2019/0081229 A1     Mar. 14, 2019

Related U.S. Application Data

(63) Continuation of application No. PCT/JP2017/019462, filed on May 25, 2017.

(30) Foreign Application Priority Data

May 31, 2016   (JP) .............................. JP2016-109267

(51) Int. Cl.
*H01L 35/08* (2006.01)
*H01L 35/32* (2006.01)
(Continued)

(52) U.S. Cl.
CPC .............. *H01L 35/32* (2013.01); *H01L 23/36* (2013.01); *H01L 23/38* (2013.01); *H01L 35/08* (2013.01);
(Continued)

(58) Field of Classification Search
CPC ......... H01L 35/32; H01L 35/08; H01L 35/34; H01L 35/30; H01L 23/36; H01L 23/38; H01L 35/36; F25B 21/02; F25B 2321/023
See application file for complete search history.

(56) References Cited

U.S. PATENT DOCUMENTS

2010/0127299 A1* 5/2010 Smith ...................... F21K 9/00
                                                                                257/99
2013/0199593 A1   8/2013 Higashida et al.
(Continued)

FOREIGN PATENT DOCUMENTS

JP    2004-079883      3/2004
JP    2013-542578     11/2013
(Continued)

OTHER PUBLICATIONS

International Search Report of PCT application No. PCT/JP2017/019462 dated Aug. 15, 2017.

*Primary Examiner* — Eli S Mekhlin
*Assistant Examiner* — Dujuan A Horton
(74) *Attorney, Agent, or Firm* — McDermott Will and Emery LLP

(57) ABSTRACT

A thermoelectric conversion substrate includes an insulating substrate and at least one thermoelectric conversion unit. The insulating substrate has a first surface and a second surface at both sides of the insulating substrate in a thickness direction. The at least one thermoelectric conversion unit is incorporated in the insulating substrate. The at least one thermoelectric conversion unit includes a first thermoelec- (Continued)

tric member, a second thermoelectric member, and a first electrode disposed on the first surface of the insulating substrate. The first thermoelectric member includes a first tubular member having insulation property and a first semiconductor filled in the first tubular member. The second thermoelectric member includes a second tubular member having insulation property and a second semiconductor filled in the second tubular member. The second semiconductor has carriers different from carriers of the first semiconductor. The first electrode electrically connects the first semiconductor of the first thermoelectric member to the second semiconductor of the second thermoelectric member.

13 Claims, 48 Drawing Sheets

(51) Int. Cl.
*H01L 35/30* (2006.01)
*H01L 35/34* (2006.01)
*H01L 23/38* (2006.01)
*H01L 23/36* (2006.01)
*F25B 21/02* (2006.01)

(52) U.S. Cl.
CPC .............. *H01L 35/30* (2013.01); *H01L 35/34* (2013.01); *F25B 21/02* (2013.01); *F25B 2321/023* (2013.01)

(56) References Cited

U.S. PATENT DOCUMENTS

2015/0144171 A1   5/2015   Taniguchi et al.
2015/0153237 A1*  6/2015   Tsuboi .................. H02N 2/186
                                                  374/152

FOREIGN PATENT DOCUMENTS

JP    2004-007408      1/2014
WO    2014/045353 A1   3/2014

* cited by examiner

THERMOELECTRIC CONVERSION SUBSTRATE, THERMOELECTRIC CONVERSION MODULE AND METHOD FOR PRODUCING THERMOELECTRIC CONVERSION SUBSTRATE

RELATED APPLICATIONS

This application is a continuation of the PCT International Application No. PCT/JP2017/019462 filed on May 25, 2017, which claims the benefit of foreign priority of Japanese patent application No. 2016-109267 filed on May 31, 2016, the contents all of which are incorporated herein by reference.

BACKGROUND

1. Technical Field

The present disclosure generally relates to a thermoelectric conversion substrate, a thermoelectric conversion module, and a method for producing a thermoelectric conversion substrate and, more particularly, to a thermoelectric conversion substrate using a Peltier element, a thermoelectric conversion module, and a method for producing a thermoelectric conversion substrate.

2. Description of the Related Art

Conventionally, for example, Unexamined Japanese Patent Publication No. 2014-7408 has proposed a production method as a method for producing a thermoelectric conversion apparatus. First, this production method prepares an insulating base material. This insulating base material includes a thermoplastic resin. A plurality of first and second via holes extend through the insulating base material in the thickness direction. The first and second via holes are respectively filled with first and second conductive pastes. In this case, the first conductive paste is obtained by forming an alloy powder with a plurality of metal atoms maintaining a predetermined crystal structure into a paste by adding an organic solvent. And the second conductive paste is obtained by forming a powder of a metal of a type different from the above alloy powder into a paste by adding an organic solvent.

An upper surface protective member and a lower surface protective member are respectively disposed on an upper surface and a lower surface of the insulating base material to form a multilayer structure. This multilayer structure has an air gap inside thereof. In this case, the upper surface protective member has an upper surface pattern that comes into contact with predetermined first and second conductive pastes, and the lower surface protective member has a lower surface pattern that comes into contact with the predetermined first and second conductive patterns.

Next, the multilayer structure is then pressurized in a stacking direction while being heated so as to pour the thermoplastic resin into the air gap, and the first and second conductive pastes are solid-phase sintered into first and second interlayer connecting members. At the same time, the first and second interlayer connecting members are electrically connected to the upper surface pattern and the lower surface pattern, respectively. In this manner, a thermoelectric conversion apparatus is produced.

SUMMARY

A thermoelectric conversion substrate according to the present disclosure includes an insulating substrate and at least one thermoelectric conversion unit. The insulating substrate has a first surface and a second surface at both sides of the insulating substrate in a thickness direction. The at least one thermoelectric conversion unit is incorporated in the insulating substrate. The at least one thermoelectric conversion unit includes a first thermoelectric member, a second thermoelectric member, and a first electrode disposed on the first surface of the insulating substrate. The first thermoelectric member includes a first tubular member having insulation property and a first semiconductor filled in the first tubular member. The second thermoelectric member includes a second tubular member having insulation property and a second semiconductor filled in the second tubular member and having carriers different from carriers of the first semiconductor. The first electrode electrically connects the first semiconductor of the first thermoelectric member to the second semiconductor of the second thermoelectric member.

The thermoelectric conversion substrate preferably further includes a second electrode disposed on the second surface of the insulating substrate. The at least one thermoelectric conversion unit includes a plurality of thermoelectric conversion units. The second electrode electrically connects the first semiconductor of the first thermoelectric member in one of the plurality of thermoelectric conversion units to the second semiconductor of the second thermoelectric member in another of the plurality of thermoelectric conversion units. A plurality of thermoelectric conversion units are electrically connected to each other in series such that the first and second semiconductors are alternately arranged.

The first surface of the insulating substrate is preferably spaced apart from each of a first distal end face of the first thermoelectric member and a second distal end face of the second thermoelectric member, the first distal end face and the second distal end face facing the first surface.

The second surface of the insulating substrate is preferably spaced apart from each of a third the distal end face of the first thermoelectric member and a fourth distal end face of the second thermoelectric member, the third distal end face and the fourth distal end face facing the second surface.

The insulating substrate has, at the first surface, a first opening portion reaching the first distal end face of the first thermoelectric member. And the insulating substrate has, at the first surface, a second opening portion reaching the second distal end face of the second thermoelectric member. An area of the first distal end face of the first thermoelectric member is preferably larger than an area of a bottom surface of the first opening portion. And an area of the second distal end face of the second thermoelectric member is preferably larger than an area of a bottom surface of the second opening portion.

The insulating substrate has, at the second surface, a third opening portion reaching the third distal end face of the first thermoelectric member. And the insulating substrate has, at the second surface, a fourth opening portion reaching the fourth distal end face of the second thermoelectric member. An area of the third distal end face of the first thermoelectric member is preferably larger than an area of a bottom surface of the third opening portion. And an area of the fourth distal end face of the second thermoelectric member is preferably larger than an area of a bottom surface of the fourth opening portion.

The insulating substrate includes a multilayer structure including a core insulating layer and a first insulating layer. The core insulating layer includes a first thermoelectric member and a second thermoelectric member. And the first insulating layer includes neither first thermoelectric member nor second thermoelectric member. In addition, the first insulating layer is located at a side in which the first surface of the insulating substrate is positioned, and the core insulating layer is located at a side in which the second surface of the insulating substrate is positioned. A thermal conductivity of the first insulating layer is greater than a thermal conductivity of the core insulating layer.

An insulating substrate includes a multilayer structure including a core insulating layer, a first insulating layer, and a second insulating layer. The core insulating layer includes a first thermoelectric member and a second thermoelectric member. The first insulating layer includes neither first thermoelectric member nor second thermoelectric member. The second insulating layer includes neither first thermoelectric member nor second thermoelectric member. In addition, the core insulating layer is located between the first insulating layer and the second insulating layer. The first insulating layer is located at a side in which the first surface of the insulating substrate is positioned. The second insulating layer is located at a side in which the second surface of the insulating substrate is positioned. A thermal conductivity of each of the first insulating layer and the second insulating layer is greater than a thermal conductivity of the core insulating layer.

A wiring layer is preferably disposed in at least one of a boundary between the core insulating layer and the first insulating layer and a boundary between the core insulating layer and the second insulating layer.

A thermoelectric conversion module according to the present disclosure includes the thermoelectric conversion substrate, an insulating film, and an electronic component. The insulating film is disposed on at least one of the first surface and the second surface of the insulating substrate of the thermoelectric conversion substrate. The electronic component is mounted to the thermoelectric conversion substrate via the insulating film.

A method for producing a thermoelectric conversion substrate according to the present disclosure includes the following steps. First step is preparing a semi-cured core substrate. Second step is forming a plurality of through holes in the semi-cured core substrate. Third step is preparing at least one first thermoelectric member and at least one second thermoelectric member, and inserting the at least one first thermoelectric member and the at least one second thermoelectric member into the plurality of through holes of the semi-cured core substrate. The at least one first thermoelectric member includes a first tubular member filled with a first semiconductor. The at least one second thermoelectric member includes a second tubular member filled with a second semiconductor. The second semiconductor has carriers different from carriers of the first semiconductor. Fourth step is forming an insulating substrate by stacking respective metal foils on both surfaces of the semi-cured core substrate and then hot-pressing the semi-cured core substrate along with the metal foils. The insulating substrate has a first surface and a second surface at both sides of the insulating substrate in a thickness direction. Fifth step is removing a part of the metal foils at a position corresponding to each of locations of the at least one first thermoelectric member and the at least one second thermoelectric member. Sixth step is exposing a distal end face of each of the at least one first thermoelectric member and the at least one second thermoelectric member by removing a part of the insulating substrate at which the part of the metal foils have been removed. Seventh step is providing plating, ranging from each of the distal end face of the at least one first thermoelectric member and the distal end face of the at least one second thermoelectric member to one of the metal foils. Eighth step is forming a first electrode that electrically connects the at least one first thermoelectric member to the at least one second thermoelectric member by partially removing the one of the metal foils at the first surface of the insulating substrate.

The at least one first thermoelectric member includes a plurality of first thermoelectric members. And the at least one second thermoelectric member includes a plurality of second thermoelectric members. This method preferably further includes forming a second electrode by partially removing one of the metal foils at the second surface of the insulating substrate. The second electrode electrically connects one of the plurality of first thermoelectric members to one of the plurality of second thermoelectric members, which are not electrically to each other by the first electrode.

A method for producing a thermoelectric conversion substrate according to the present disclosure includes the following steps. First step is preparing a first metal foil. Second step is preparing at least one first thermoelectric member and at least one second thermoelectric member, and soldering the at least one first thermoelectric member and the at least one second thermoelectric member to the first metal foil, respectively. The at least one first thermoelectric member includes a first tubular member filled with a first semiconductor. And the at least one second thermoelectric member includes a second tubular member filled with a second semiconductor. The second semiconductor has carriers different from carriers of the first semiconductor. Third step is preparing a semi-cured core substrate having opening portions and stacking the semi-cured core substrate on the first metal foil so as to accommodate the at least one first thermoelectric member and the at least one second thermoelectric member in the opening portions. Fourth step is forming an insulating substrate from a cured product of the semi-cured core substrate by stacking a second metal foil on the semi-cured core substrate so as to close the opening portions and then hot-pressing the semi-cured core substrate along with the second metal foil. Fifth step is removing a part of the second metal foil at a position corresponding to each of locations of the at least one first thermoelectric member and the at least one second thermoelectric member. Sixth step is exposing a distal end face of each of the at least one first thermoelectric member and the at least one second thermoelectric member by removing a part of the insulating substrate at which the part of the second metal foil has been removed. Seventh step is providing plating, ranging from each of the distal end face of the at least one first thermoelectric member and the distal end face of the at least one second thermoelectric member to the second metal foil. Eighth step is forming a first electrode that electrically connects the at least one first thermoelectric member to the at least one second thermoelectric member by partially removing the second metal foil on the insulating substrate.

The at least one first thermoelectric member includes a plurality of first thermoelectric members. And the at least one second thermoelectric member includes a plurality of second thermoelectric members. This method preferably further includes forming a second electrode by partially removing the first metal foil on the insulating substrate. The second electrode electrically connects one of the plurality of first thermoelectric members to one of the plurality of second thermoelectric members, which differ from one of the plurality of first thermoelectric members and one of the plurality of second thermoelectric members electrically connected to each other by the first electrode.

A method for producing a thermoelectric conversion substrate according to the present disclosure includes the following steps. First step is preparing a base substrate including at least one second electrode. Second step is preparing at least one first thermoelectric member and at least one second thermoelectric member, and soldering the at least one first thermoelectric member and the at least one second thermoelectric member to the second electrode, respectively. The at least one first thermoelectric member includes a first tubular member filled with a first semiconductor. The at least one second thermoelectric member includes a second tubular member filled with a second semiconductor. The second semiconductor has carriers different from carriers of the first semiconductor. Third step is preparing a semi-cured core substrate having opening portions and stacking the semi-cured core substrate on the base substrate so as to accommodate the at least one first thermoelectric member and the at least one second thermoelectric member in the opening portions. Fourth step is forming an insulating substrate from a cured product of the semi-cured core substrate by stacking a metal foil on the semi-cured core substrate so as to close the opening portions and then hot-pressing the semi-cured core substrate along with the metal foil. Fifth step is removing a part of the metal foil at a position corresponding to each of locations of the at least one first thermoelectric member and the at least one second thermoelectric member. Sixth step is exposing a distal end face of each of the at least one first thermoelectric member and the at least one second thermoelectric member by removing a part of the insulating substrate at which the part of the metal foil has been removed. Seventh step is providing plating, ranging from each of the distal end face of the at least one first thermoelectric member and the distal end face of the at least one second thermoelectric member to the metal foil. Eighth step is forming a first electrode that electrically connects the at least one first thermoelectric member to the at least one second thermoelectric member by partially removing the metal foil on the insulating substrate.

A method for producing a thermoelectric conversion substrate according to the present disclosure includes the following steps. First step is preparing a first metal foil. Second step is preparing at least one first thermoelectric member and at least one second thermoelectric member, and soldering the at least one first thermoelectric member and the at least one second thermoelectric member to the first metal foil, respectively. The at least one first thermoelectric member includes a first tubular member filled with a first semiconductor. The at least one second thermoelectric member includes a second tubular member filled with a second semiconductor. The second semiconductor has carriers different from carriers of the first semiconductor. Third step is preparing a cured or semi-cured core substrate having opening portions and stacking the cured or semi-cured core substrate on the first metal foil so as to accommodate the at least one first thermoelectric member and the at least one second thermoelectric member in the opening portions. Fourth step is pouring a resin into the opening portions to fill the opening portions and stacking a second metal foil on the cured or semi-cured core substrate so as to close the opening portions and then hot-pressing the cured or semi-cured core substrate along with the second metal foil and the resin to form an insulating substrate from the cured core substrate or a cured product of the semi-cured core substrate with a cured product of the resin. Fifth step is removing a part of the second metal foil at a position corresponding to each of locations of the at least one first thermoelectric member and the at least one second thermoelectric member. Sixth step is exposing a distal end face of each of the at least one first thermoelectric member and the at least one second thermoelectric member by removing a part of the insulating substrate at which the part of the second metal foil has been removed. Seventh step is providing plating, ranging from each of the distal end face of the at least one first thermoelectric member and the distal end face of the at least one second thermoelectric member to the second metal foil. Eighth step is forming a first electrode that electrically connects the at least one first thermoelectric member to the at least one second thermoelectric member by partially removing the second metal foil on the insulating substrate.

According to the present disclosure, it is possible to improve quality stability of a thermoelectric conversion unit and suppress damage to the thermoelectric conversion unit.

DETAILED DESCRIPTION OF EMBODIMENT

Prior to describing an exemplary embodiment of the present disclosure, problems found in conventional techniques will be briefly described. In the thermoelectric conversion apparatus disclosed in Unexamined Japanese Patent Publication No. 2014-7408, because the first and second interlayer connecting members are obtained simply by solid-phase sintering the first and second conductive pastes, the first and second interlayer connecting members tend to be damaged when a load is applied on the insulating substrate in the thickness direction.

Whether or not the first and second interlayer connecting members normally function as a thermoelectric conversion unit needs to be checked after the production of a thermoelectric conversion apparatus. In addition, when there are many first and second interlayer connecting members, it is also difficult to specify which interlayer connecting member is defective.

The present disclosure has been made in consideration of the above points, and provides a thermoelectric conversion substrate, a thermoelectric conversion module, and a method for producing a thermoelectric conversion substrate, which can implement stability for high quality of a thermoelectric conversion unit and suppress damage to the thermoelectric conversion unit.

An exemplary embodiment of the present disclosure will be described below.

[(First) Thermoelectric Conversion Substrate]

Figure 1A:
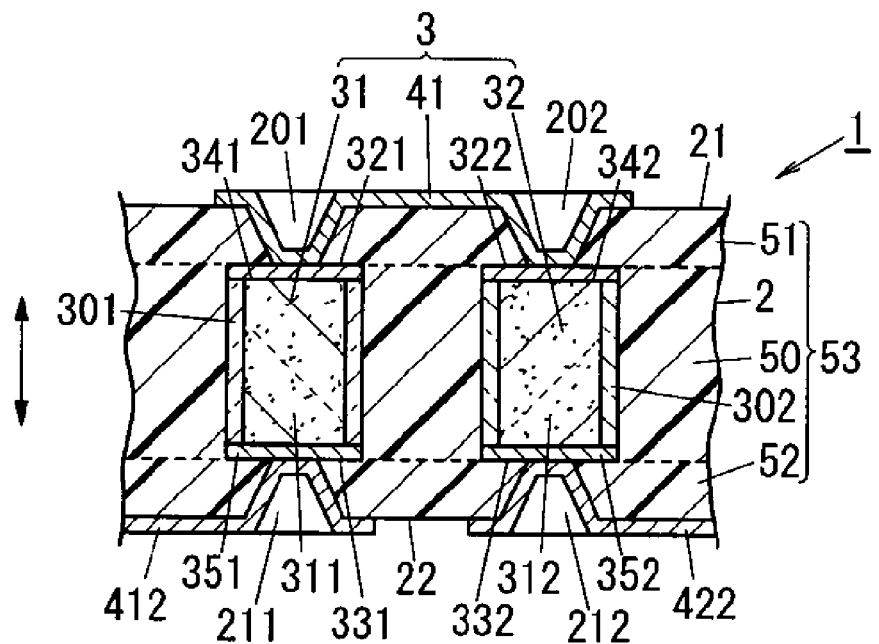
FIG. 1A is a schematic sectional view illustrating an example of a (first) thermoelectric conversion substrate according to an exemplary embodiment of the present disclosure.

FIG. 1A shows an example of thermoelectric conversion substrate 1. Thermoelectric conversion substrate 1 includes insulating substrate 2, and thermoelectric conversion unit 3. Thermoelectric conversion substrate 1 is an example including one thermoelectric conversion unit 3. However, an example including a plurality of thermoelectric conversion units 3 will be described later with reference to FIG. 1B.

Insulating substrate 2 has first surface 21 and second surface 22 on its both sides in a thickness direction. A double-headed arrow in FIG. 1A indicates the thickness direction. First surface 21 and second surface 22 are both surfaces of insulating substrate 2. Either one of the surfaces may be an upper surface or lower surface. Insulating substrate 2 is not specifically limited as long as it has an insulation property. For example, insulating substrate 2 is a substrate obtained by curing a thermosetting resin composition impregnated in a reinforcing material. A specific example of insulating substrate 2 is a glass epoxy substrate. The glass epoxy substrate is a substrate obtained by curing a thermosetting resin composition containing epoxy resin in glass cloth as a reinforcing material. A thermosetting resin composition may contain a filler.

Thermoelectric conversion unit 3 is incorporated in insulating substrate 2. Thermoelectric conversion unit 3 is an element that is a kind of thermoelectric element and converts heat into power. A Peltier element is a specific example of thermoelectric conversion unit 3.

Figure 2A:
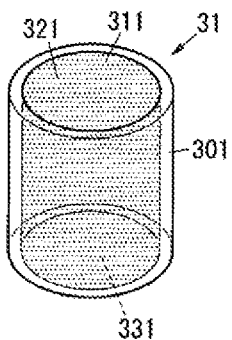
FIG. 2A is a schematic perspective view illustrating an example of a first thermoelectric member.

Thermoelectric conversion unit 3 includes first thermoelectric member 31, second thermoelectric member 32, and first electrode 41. First thermoelectric member 31 includes insulating first tubular member 301 having an insulation property and first semiconductor 311, as shown in FIG. 2A.

First tubular member 301 is not specifically limited as long as it is a tubular member having openings in its both ends and has an insulation property. For example, first tubular member 301 has a length between 0.4 mm and 2.0 mm (inclusive), an outer diameter between 0.4 mm and 2.0 mm (inclusive), an inner diameter between 0.39 mm and 1.88 mm (inclusive), and a thickness between 0.005 mm and 0.1 mm (inclusive). First tubular member 301 preferably has a smaller thermal expansion coefficient than insulating substrate 2. A specific example of first tubular member 301 is a glass tube. First semiconductor 311 is filled in first tubular member 301. A specific example of first semiconductor 311 is a p-type semiconductor. The p-type semiconductor is obtained by, for example, adding a small amount of selenium as an impurity in a bismuth telluride based compound.

It is preferable that distal end portion 341 be provided so as to close one end of first tubular member 301 filled with first semiconductor 311, and distal end portion 351 be provided so as to close the other end. Distal end portion 341 faces first surface 21 of insulating substrate 2, and distal end portion 351 faces second surface 22 of insulating substrate 2. Distal end portion 341 includes a barrier film directly closing an opening of one end of first tubular member 301 and a joining layer provided on the barrier film. The barrier film further includes a Ti layer and an Ni layer provided on the Ti layer. In the barrier film, the Ti layer is in contact with first semiconductor 311 while directly closing the opening of one end of first tubular member 301, and the Ni layer is in contact with the joining layer. The joining layer is formed from, for example, a joining material including Sn, Au, Ag, and Cu. For example, the Ti layer has a thickness between 0.02 µm and 0.3 µm (inclusive), the Ni layer has a thickness between 0.5 µm and 10 µm (inclusive), and the joining layer has a thickness between 0.1 µm and 100 µm (inclusive). Distal end portion 351 is formed in the same manner as distal end portion 341.

Figure 2B:
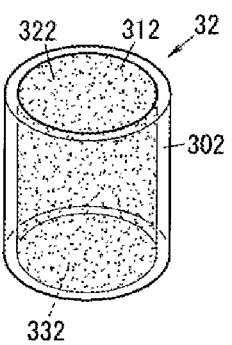
FIG. 2B is a schematic perspective view illustrating an example of a second thermoelectric member.

As shown in FIG. 2B, second thermoelectric member 32 includes insulating second tubular member 302 and second semiconductor 312.

Second tubular member 302 is not specifically limited as long as it is a tubular member having openings in its both ends and has an insulation property. Second tubular member 302 preferably has a smaller thermal expansion coefficient than insulating substrate 2. The size and material of second tubular member 302 are preferably the same as those of first tubular member 301.

Second semiconductor 312 is filled in second tubular member 302. Second semiconductor 312 has carriers different from carriers of first semiconductor 311. If the carriers of first semiconductor 311 are holes, the carriers of second semiconductor 312 are electrons. The carriers for each of first semiconductor 311 and second semiconductor 312 can also be changed to be opposite. A specific example of second semiconductor 312 is an n-type semiconductor. The n-type semiconductor is obtained by, for example, adding a small amount of antimony or indium as an impurity in a bismuth telluride based compound.

It is preferable that distal end portion 342 be provided so as to close one end of second tubular member 302 filled with second semiconductor 312, and distal end portion 352 be provided so as to close the other end. Distal end portion 342 faces first surface 21 of insulating substrate 2, and distal end portion 352 faces second surface 22 of insulating substrate 2. Distal end portions 342 and 352 of second thermoelectric member 32 are formed in the same manner as distal end portions 341 and 351 of first thermoelectric member 31.

As shown in FIG. 1A, first electrode 41 is provided on first surface 21 of insulating substrate 2. It is not limited but a specific example of the material of first electrode 41 is copper. First electrode 41 electrically connects first semiconductor 311 of first thermoelectric member 31 to second semiconductor 312 of second thermoelectric member 32. Note that if first thermoelectric member 31 is provided with distal end portion 341, first electrode 41 is electrically connected to first semiconductor 311 via distal end portion 341. Likewise, if second thermoelectric member 32 is provided with distal end portion 342, first electrode 41 is electrically connected to second semiconductor 312 via distal end portion 342.

Second electrodes 412 and 422 for power supply connection are provided on second surface 22 of insulating substrate 2. Second electrode 412 is electrically connected to first semiconductor 311 of first thermoelectric member 31. If first thermoelectric member 31 is provided with distal end portion 351, second electrode 412 is electrically connected to first semiconductor 311 via distal end portion 351. Second electrode 422 is electrically connected to second semiconductor 312 of second thermoelectric member 32. If second thermoelectric member 32 is provided with distal end portion 352, second electrode 422 is electrically connected to second semiconductor 312 via distal end portion 352. Second electrodes 412 and 422 are electrically insulated from each other.

Connecting a DC power supply to second electrodes 412 and 422 and applying a voltage between the second electrodes 412 and 422 to make a DC current flow can transfer heat from one surface of insulating substrate 2 to the other surface due to a Peltier effect. If, for example, first semiconductor 311 is a p-type semiconductor and second semiconductor 312 is an n-type semiconductor, making a DC current flow from second semiconductor 312 to first semiconductor 311 can transfer heat from first surface 21 of insulating substrate 2 to second surface 22. When a polarity of the DC power supply is reversed to change the direction of a DC current, the transferring direction of heat is reversed. This makes it possible to freely switch between cooling and heating. Note that, contrary to the Peltier effect, a temperature difference may be provided between first surface 21 and second surface 22 of insulating substrate 2 to cause a potential difference due to a Seebeck effect, thereby extracting power.

In thermoelectric conversion substrate 1 shown in FIG. 1A, since first semiconductor 311 and second semiconductor 312 are respectively protected by first tubular member 301 and second tubular member 302, damage to thermoelectric conversion unit 3 can be suppressed even when a load is applied on insulating substrate 2. For example, a direction of loading on insulating substrate 2 is the thickness direction. However, the direction of loading is not limited to this.

As described above, heat transfers inside insulating substrate 2, and insulating substrate 2 slightly thermally expands as the heat transfers. Even if the influence of this thermal expansion reaches first thermoelectric member 31 and second thermoelectric member 32 of thermoelectric conversion unit 3, damage to thermoelectric conversion unit 3 can be suppressed because first semiconductor 311 and second semiconductor 312 are respectively protected by first tubular member 301 and second tubular member 302. This configuration is especially effective when first tubular member 301 and second tubular member 302 each have a smaller thermal expansion coefficient than insulating substrate 2.

First surface 21 of insulating substrate 2 is preferably spaced apart from distal end face 321 of first thermoelectric member 31 which faces first surface 21 in the thickness direction of insulating substrate 2. Proving a level difference between first surface 21 and distal end face 321 in this manner makes it difficult for even a load on first surface 21 in the thickness direction to be directly exerted on distal end face 321. This can further suppress damage to first thermoelectric member 31. Likewise, first surface 21 of insulating substrate 2 is spaced apart from distal end face 322 of second thermoelectric member 32 which faces first surface 21 in the thickness direction of insulating substrate 2. In this case as well, providing a level difference between first surface 21 and distal end face 322 makes it difficult for even a load on first surface 21 in the thickness direction to be directly exerted on distal end face 322. This can further suppress damage to second thermoelectric member 32. For example, the above level difference, i.e., a distance between first surface 21 and each of distal end faces 321 and 322 is between 25 µm and 200 µm (inclusive).

Second surface 22 of insulating substrate 2 is preferably spaced apart from distal end face 331 of first thermoelectric member 31 which faces second surface 22 in the thickness direction of insulating substrate 2. Proving a level difference between second surface 22 and distal end face 331 in this manner makes it difficult for even a load on second surface 22 in the thickness direction to be directly exerted on distal end face 331. This can further suppress damage to first thermoelectric member 31. Likewise, second surface 22 of insulating substrate 2 is spaced apart from distal end face 332 of second thermoelectric member 32 which faces second surface 22 in the thickness direction of insulating substrate 2. In this case as well, providing a level difference between second surface 22 and distal end face 332 makes it difficult for even a load on second surface 22 in the thickness direction to be directly exerted on distal end face 332. This can further suppress damage to second thermoelectric member 32. For example, the above level difference, i.e., a distance between second surface 22 and each of distal end faces 331 and 332 is between 25 µm and 200 µm (inclusive).

Figure 3:
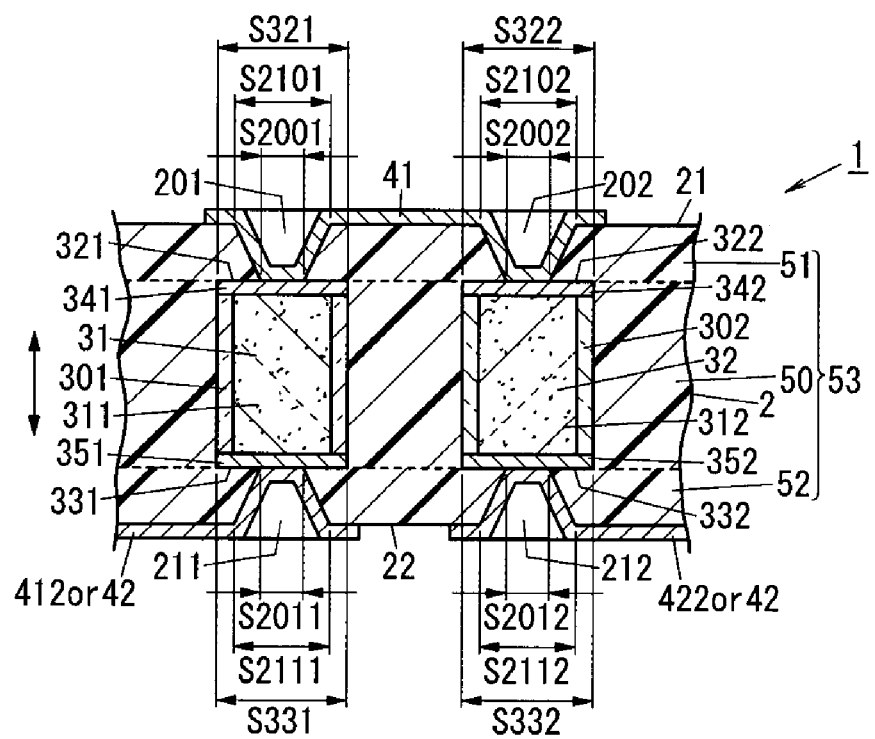
FIG. 3 is a schematic sectional view illustrating the (first) thermoelectric conversion substrate.

First opening portion 201 is preferably provided in first surface 21 of insulating substrate 2. A filled via can be obtained by filling first opening portion 201 with a conductor such as a plate when forming first electrode 41 in first opening portion 201. First opening portion 201 is provided so as to extend from first surface 21 of insulating substrate 2 to distal end face 321 of first thermoelectric member 31 which faces first surface 21. A bottom surface of first opening portion 201 is preferably part of distal end face 321 of first thermoelectric member 31. That is, as shown in FIG. 3, area S321 of distal end face 321 of first thermoelectric member 31 which faces first surface 21 is larger than area S2001 of the bottom surface of first opening portion 201. This can suppress positional shift of first thermoelectric member 31 to first surface 21. Although not shown, area S2001 of the bottom surface of first opening portion 201 may be equal to area S2101 of first surface 21 of first opening portion 201. In this case, a specific example of a shape of first opening portion 201 is a cylindrical shape. Cylindrical first opening portion 201 has a constant inner diameter in a depth direction. The depth direction is the same as the thickness direction of insulating substrate 2. As shown in FIG. 3, area S2001 of the bottom surface of first opening portion 201 is preferably smaller than area S2101. In this case, a specific example of a shape of first opening portion 201 is a bowl shape. Bowl-shaped first opening portion 201 gradually increases in inner diameter from the bottom surface to first surface 21 in the depth direction. Forming first electrode 41 in bowl-shaped first opening portion 201 makes it difficult for first electrode 41 to break.

Second opening portion 202 is preferably provided in first surface 21 of insulating substrate 2. A filled via can be obtained by filling second opening portion 202 with a conductor such as a plate when forming first electrode 41 in second opening portion 202. Second opening portion 202 is provided so as to extend from first surface 21 of insulating substrate 2 to distal end face 322 of second thermoelectric member 32 which faces first surface 21. A bottom surface of second opening portion 202 is preferably part of distal end face 322 of second thermoelectric member 32. That is, as shown in FIG. 3, area S322 of distal end face 322 of second thermoelectric member 32 which faces first surface 21 is larger than area S2002 of a bottom surface of second opening portion 202. This can suppress positional shift of second thermoelectric member 32 to first surface 21. Although not shown, area S2002 of the bottom surface of second opening portion 202 may be equal to area S2102 of first surface 21 of second opening portion 202. In this case, a specific example of a shape of second opening portion 202 is a cylindrical shape. Cylindrical second opening portion 202 has a constant inner diameter in a depth direction. As shown in FIG. 3, area S2002 of the bottom surface of second opening portion 202 is preferably smaller than area S2102. In this case, a specific example of a shape of second opening portion 202 is a bowl shape. Bowl-shaped second opening portion 202 gradually increases in inner diameter from the bottom surface to first surface 21 in the depth direction. Forming first electrode 41 in bowl-shaped second opening portion 202 makes it difficult for first electrode 41 to break.

Third opening portion 211 is preferably provided in second surface 22 of insulating substrate 2. A filled via can be obtained by filling third opening portion 211 with a conductor such as a plate when forming second electrode 412 for power supply connection in third opening portion 211. Second electrode 412 for power supply connection may be replaced by second electrode 42 (to be described later) that electrically connects adjacent thermoelectric conversion units 3. Third opening portion 211 is provided so as to extend from second surface 22 of insulating substrate 2 to distal end face 331 of first thermoelectric member 31 which faces second surface 22. A bottom surface of third opening portion 211 is preferably part of distal end face 331 of first thermoelectric member 31. That is, as shown in FIG. 3, area S331 of distal end face 331 of first thermoelectric member 31 which faces second surface 22 is larger than area S2011 of the bottom surface of third opening portion 211. This can suppress positional shift of first thermoelectric member 31 to second surface 22. Although not shown, area S2011 of the bottom surface of third opening portion 211 may be equal to area S2111 of second surface 22 of third opening portion 211. In this case, a specific example of a shape of third opening portion 211 is a cylindrical shape. Cylindrical third opening portion 211 has a constant inner diameter in a depth direction. As shown in FIG. 3, area S2011 of the bottom surface of third opening portion 211 is preferably smaller than area S2111. In this case, a specific example of a shape of third opening portion 211 is a bowl shape. Bowl-shaped third opening portion 211 gradually increases in inner diameter from the bottom surface to second surface 22 in the depth direction. Forming second electrodes 412 and 42 in bowl-shaped third opening portion 211 makes it difficult for second electrodes 412 and 42 to break.

Fourth opening portion 212 is preferably provided in second surface 22 of insulating substrate 2. A filled via can be obtained by filling fourth opening portion 212 with a conductor such as a plate when forming second electrode 422 for power supply connection in fourth opening portion 212. Second electrode 422 for power supply connection may be replaced by second electrode 42 (to be described later) that electrically connects adjacent thermoelectric conversion units 3. Fourth opening portion 212 is provided so as to extend from second surface 22 of insulating substrate 2 to distal end face 332 of second thermoelectric member 32 which faces second surface 22. A bottom surface of fourth opening portion 212 is preferably part of distal end face 332 of second thermoelectric member 32. That is, as shown in FIG. 3, area S332 of distal end face 332 of second thermoelectric member 32 which faces second surface 22 is larger than area S2012 of the bottom surface of fourth opening portion 212. This can suppress positional shift of second thermoelectric member 32 to second surface 22. Although not shown, area S2012 of the bottom surface of fourth opening portion 212 may be equal to area S2112 of second surface 22 of fourth opening portion 212. In this case, a specific example of a shape of fourth opening portion 212 is a cylindrical shape. Cylindrical fourth opening portion 212 has a constant inner diameter in a depth direction. As shown in FIG. 3, area S2012 of the bottom surface of fourth opening portion 212 is preferably smaller than area S2112. In this case, a specific example of a shape of fourth opening portion 212 is a bowl shape. Bowl-shaped fourth opening portion 212 gradually increases in inner diameter from the bottom surface to second surface 22 in the depth direction. Forming second electrodes 422 or 42 in bowl-shaped fourth opening portion 212 makes it difficult for second electrodes 422 or 42 to break.

As shown in FIG. 1A, insulating substrate 2 is preferably formed from multilayer structure 53 constituted by core insulating layer 50, first insulating layer 51, and second insulating layer 52. When insulating substrate 2 is constituted by a plurality of layers, a thermal conductivity of each layer can be changed in accordance with a purpose of use of thermoelectric conversion substrate 1. Each layer is not specifically limited as long as it has an insulating property. For example, each layer is a layer obtained by curing a thermosetting resin composition impregnated in a reinforcing material. Impregnating the thermosetting resin composition with a filler in advance can change the thermal conductivity of each layer. Specific examples of a filler are alumina, silica, magnesium hydroxide, and aluminum hydroxide.

Core insulating layer 50 includes first thermoelectric member 31 and second thermoelectric member 32. A thickness of core insulating layer 50 is greater than a length of each of first thermoelectric member 31 and second thermoelectric member 32. Core insulating layer 50 is located between first insulating layer 51 and second insulating layer 52. Core insulating layer 50 has a thermal conductivity between 0.5 W/m·K and 0.8 W/m·K (inclusive). However, this is not limited.

First insulating layer 51 includes neither first thermoelectric member 31 nor second thermoelectric member 32. First insulating layer 51 has a thickness less than or equal to 200 μm. First insulating layer 51 is located facing first surface 21 of insulating substrate 2. First insulating layer 51 has a thermal conductivity between 1.1 W/m·K and 1.6 W/m·K (inclusive). However, this is not limited.

Second insulating layer 52 includes neither first thermoelectric member 31 nor second thermoelectric member 32. Second insulating layer 52 has a thickness less than or equal to 200 μm. Second insulating layer 52 is located facing second surface 22 of insulating substrate 2. Second insulating layer 52 has a thermal conductivity between, for example, 1.1 W/m·K and 1.6 W/m·K. However, this is not limited.

Core insulating layer 50 preferably has a higher thermal conductivity than first insulating layer 51 and second insulating layer 52. An object to be cooled (e.g., electronic component 7 to be described later) is located on insulating substrate 2 facing first surface 21 or facing second surface 22. Assume that the object to be cooled is disposed on insulating substrate 2 facing first surface 21, and a temperature of the object is not high. In this case, when a thermal conductivity of first insulating layer 51 is high, first insulating layer 51 can be naturally cooled by ensuring a heat dissipation path as a whole without energizing thermoelectric conversion unit 3 for forced cooling. Assume that the temperature of the object to be cooled is high. In this case, if the thermal conductivity of core insulating layer 50 is low, a temperature difference can be ensured between a portion facing first surface 21 and a portion facing second surface 22 in insulating substrate 2. Hence, forced cooling of the object can be performed by energizing thermoelectric conversion unit 3 to make thermoelectric conversion unit 3 exert its original function.

Core insulating layer 50 may have a lower thermal conductivity than thermoelectric conversion unit 3 (having a thermal conductivity of, for example, less than 1.0 W/m·K), and first insulating layer 51 and second insulating layer 52 each may have a lower thermal conductivity than core insulating layer 50. In this case, since heat of the object to be cooled concentrates on thermoelectric conversion unit 3, the cooling effect can be enhanced by energizing thermoelectric conversion unit 3 to perform forced cooling.

In this case, when first insulating layer 51 has a higher thermal conductivity than thermoelectric conversion unit 3 while the object to be cooled is disposed on insulating substrate 2 facing first surface 21, first insulating layer 51 diffuses the heat of the object. This may not sufficiently enhance the cooling effect.

Consequently, thermal conductivities of core insulating layer 50, first insulating layer 51, and second insulating layer 52 are preferably selected in consideration of the degree of possibility of forced cooling of the object to be cooled.

Figure 4A:
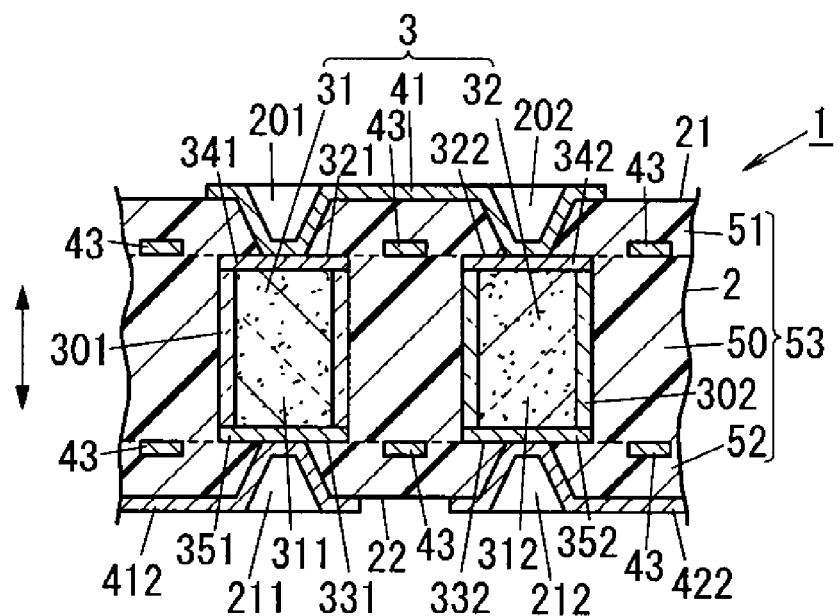
FIG. 4A is a schematic sectional view illustrating another example of the (first) thermoelectric conversion substrate.

As shown in FIG. 4A, wiring layer 43 is interposed at least between core insulating layer 50 and first insulating layer 51 or between core insulating layer 50 and second insulating layer 52. Wiring layer 43 can be used for a purpose other than the purpose of energizing thermoelectric conversion unit 3. For example, specific examples of wiring layer 43 include a signal layer, a power supply layer, and a ground layer. Incorporating wiring layer 43 inside insulating substrate 2 in this manner can implement multiple functions and high density of thermoelectric conversion substrate 1.

The above substrate is an example of thermoelectric conversion substrate 1 including one thermoelectric conversion unit 3. An example of thermoelectric conversion substrate 1 including a plurality of thermoelectric conversion units 3 will be described next.

Figure 1B:
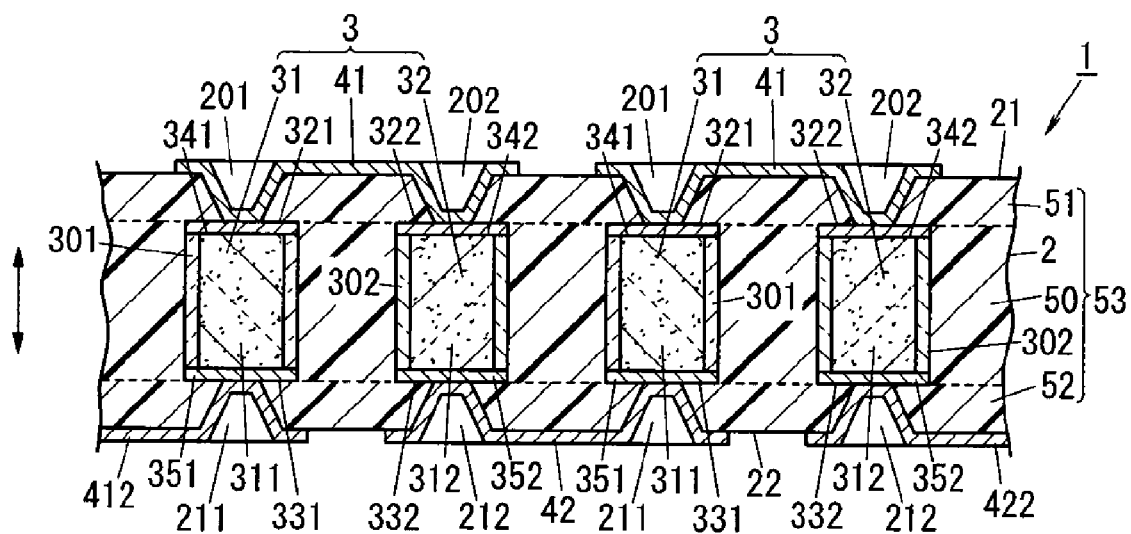
FIG. 1B is a schematic sectional view illustrating the example of the (first) thermoelectric conversion substrate according to the exemplary embodiment of the present disclosure.

FIG. 1B shows an example of thermoelectric conversion substrate 1 including a plurality of thermoelectric conversion units 3. Thermoelectric conversion substrate 1 includes a plurality of thermoelectric conversion units 3. Each of the plurality of thermoelectric conversion units 3 is the same as the thermoelectric conversion unit described above. Thermoelectric conversion substrate 1 further includes at least one second electrode 42.

Second electrode 42 is provided on second surface 22 of insulating substrate 2. It is not limited but a specific example of a material of second electrode 42 is copper. Second electrode 42 electrically connects first semiconductor 311 of first thermoelectric member 31 of one thermoelectric conversion unit 3 (thermoelectric conversion unit 3 on a right side in FIG. 1B) to second semiconductor 312 of second thermoelectric member 32 of another thermoelectric conversion unit 3 (thermoelectric conversion unit 3 on a left side in FIG. 1B). When distal end portion 351 is provided on first thermoelectric member 31, second electrode 42 is electrically connected to first semiconductor 311 via distal end portion 351. Likewise, when distal end portion 352 is provided on second thermoelectric member 32, second electrode 42 is electrically connected to second semiconductor 312 via distal end portion 352. In this manner, second electrode 42 electrically connects two different thermoelectric conversion units 3. The same applies to a thermoelectric conversion substrate including three or more thermoelectric conversion units 3. A plurality of thermoelectric conversion units 3 are electrically connected in series so as to alternately arrange first semiconductor 311 and second semiconductor 312. This indicates that a total number of second electrodes 42 is smaller by one than a total number of thermoelectric conversion units 3.

Second electrodes 412 and 422 for power supply connection are preferably provided on second surface 22 of insulating substrate 2. Second electrode 412 is electrically connected to first semiconductor 311 of first thermoelectric member 31 of one thermoelectric conversion unit 3 (thermoelectric conversion unit 3 on the left side in FIG. 1B), of the plurality of thermoelectric conversion units 3 connected in series, which is located on one end. If first thermoelectric member 31 is provided with distal end portion 351, second electrode 412 is electrically connected to first semiconductor 311 via distal end portion 351. Second electrode 422 is electrically connected to second semiconductor 312 of second thermoelectric member 32 of one thermoelectric conversion unit 3 (thermoelectric conversion unit 3 on the right side in FIG. 1B), of the plurality of thermoelectric conversion units 3 connected in series, which is located on the other end. If second thermoelectric member 32 is provided with distal end portion 352, second electrode 422 is electrically connected to second semiconductor 312 via distal end portion 352.

Connecting a DC power supply to second electrodes 412 and 422 and applying a voltage between the second electrodes 412 and 422 to make a current flow can transfer heat from one surface of insulating substrate 2 to the other surface due to the Peltier effect. If, for example, first semiconductor 311 is a p-type semiconductor and second semiconductor 312 is an n-type semiconductor, making a DC current flow from second semiconductor 312 to first semiconductor 311 can transfer heat from first surface 21 of insulating substrate 2 to second surface 22. When a polarity of the DC power supply is reversed to change the direction of a DC current, the transferring direction of heat is reversed. This makes it possible to freely switch between cooling and heating. Although not shown, a thermistor that is a sensor for measuring a temperature may be used such that when a temperature of the object to be cooled becomes more than or equal to a predetermined temperature, thermoelectric conversion unit 3 is energized, whereas when the temperature is less than the predetermined temperature, thermoelectric conversion unit 3 is not energized.

In thermoelectric conversion substrate 1 shown in FIG. 1B, since first semiconductor 311 and second semiconductor 312 are respectively protected by first tubular member 301 and second tubular member 302, damage to thermoelectric conversion unit 3 can be suppressed even upon loading on insulating substrate 2. For example, a direction of loading on insulating substrate 2 is the thickness direction. However, the direction of loading is not limited to this.

As described above, heat transfers inside insulating substrate 2, and insulating substrate 2 slightly thermally expands as the heat transfers. Even if the influence of this thermal expansion reaches first thermoelectric member 31 and second thermoelectric member 32 of thermoelectric conversion unit 3, damage to thermoelectric conversion unit 3 can be suppressed because first semiconductor 311 and second semiconductor 312 are respectively protected by first tubular member 301 and second tubular member 302. This configuration is especially effective when first tubular member 301 and second tubular member 302 each have a smaller thermal expansion coefficient than insulating substrate 2.

[(Second) Thermoelectric Conversion Substrate]

Figure 5A:
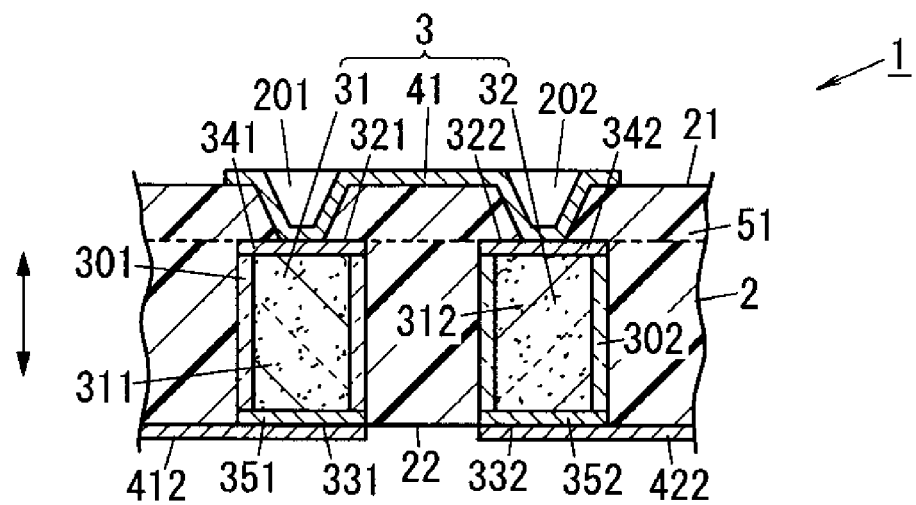
FIG. 5A is a schematic sectional view illustrating an example of a (second) thermoelectric conversion substrate according to the exemplary embodiment of the present disclosure.

FIG. 5A shows another example of thermoelectric conversion substrate 1. Thermoelectric conversion substrate 1 is the same as thermoelectric conversion substrate 1 shown in FIG. 1A in that it includes one thermoelectric conversion unit 3. Accordingly, a description of commonalities will be omitted, and only differences will be described.

Thermoelectric conversion substrate 1 shown in FIG. 5A has nothing corresponding to second insulating layer 52, and second surface 22 of insulating substrate 2 has nothing corresponding to third opening portion 211 and fourth opening portion 212.

Insulating substrate 2 is preferably formed from multi-layer structure 53 constituted by core insulating layer 50 and first insulating layer 51. When insulating substrate 2 is constituted by a plurality of layers, a thermal conductivity of each layer can be changed in accordance with a purpose of use of thermoelectric conversion substrate 1. Each layer is not specifically limited as long as it has an insulating property. For example, each layer is a layer obtained by curing a thermosetting resin composition impregnated in a reinforcing material. Impregnating the thermosetting resin composition with a filler in advance can change the thermal conductivity of each layer. Specific examples of a filler are alumina, silica, magnesium hydroxide, and aluminum hydroxide.

Core insulating layer 50 includes first thermoelectric member 31 and second thermoelectric member 32. A thickness of core insulating layer 50 is greater than a length of each of first thermoelectric member 31 and second thermoelectric member 32. Core insulating layer 50 is located on insulating substrate 2 facing second surface 22. Core insulating layer 50 has a thermal conductivity between 0.5 W/m·K and 0.8 W/m·K (inclusive). However, this is not limited.

First insulating layer 51 includes neither first thermoelectric member 31 nor second thermoelectric member 32. First insulating layer 51 has a thickness less than or equal to 200 μm. First insulating layer 51 is located facing first surface 21 of insulating substrate 2. First insulating layer 51 has a thermal conductivity between 1.1 W/m·K and 1.6 W/m·K (inclusive). However, this is not limited.

First insulating layer 51 preferably has a higher thermal conductivity than core insulating layer 50. An object to be cooled (e.g., electronic component 7 to be described later) is located on insulating substrate 2 facing first surface 21 or facing second surface 22. Assume that the object to be cooled is disposed on insulating substrate 2 facing first surface 21, and a temperature of the object is not high. In this case, when a thermal conductivity of first insulating layer 51 is high, first insulating layer 51 can be naturally cooled by ensuring a heat dissipation path as a whole without energizing thermoelectric conversion unit 3 for forced cooling. Assume that the temperature of the object to be cooled is high. In this case, if the thermal conductivity of core insulating layer 50 is low, a temperature difference can be ensured between a portion facing first surface 21 and a portion facing second surface 22 of insulating substrate 2. Hence, forced cooling of the object can be performed by energizing thermoelectric conversion unit 3 to make thermoelectric conversion unit 3 exert its original function.

Core insulating layer 50 may have a lower thermal conductivity (e.g., less than 1.0 W/m·K) than thermoelectric conversion unit 3, and first insulating layer 51 may have a lower thermal conductivity than core insulating layer 50. In this case, since heat of the object to be cooled concentrates on thermoelectric conversion unit 3, the cooling effect can be enhanced by energizing thermoelectric conversion unit 3 to perform forced cooling.

In this case, when first insulating layer 51 has a higher thermal conductivity than thermoelectric conversion unit 3 while the object to be cooled is disposed on insulating substrate 2 facing first surface 21, first insulating layer 51 diffuses the heat of the object. This may not sufficiently enhance the cooling effect.

Consequently, thermal conductivities of core insulating layer 50 and first insulating layer 51 are preferably selected in consideration of the degree of possibility of forced cooling of the object to be cooled.

Although not shown, a wiring layer may be interposed between core insulating layer 50 and first insulating layer 51. The wiring layer can be used for a purpose other than the purpose of energizing thermoelectric conversion unit 3. For example, specific examples of the wiring layer include a signal layer, a power supply layer, and a ground layer. Incorporating the wiring layer inside insulating substrate 2 in this manner can implement multiple functions and high density of thermoelectric conversion substrate 1.

Figure 5B:
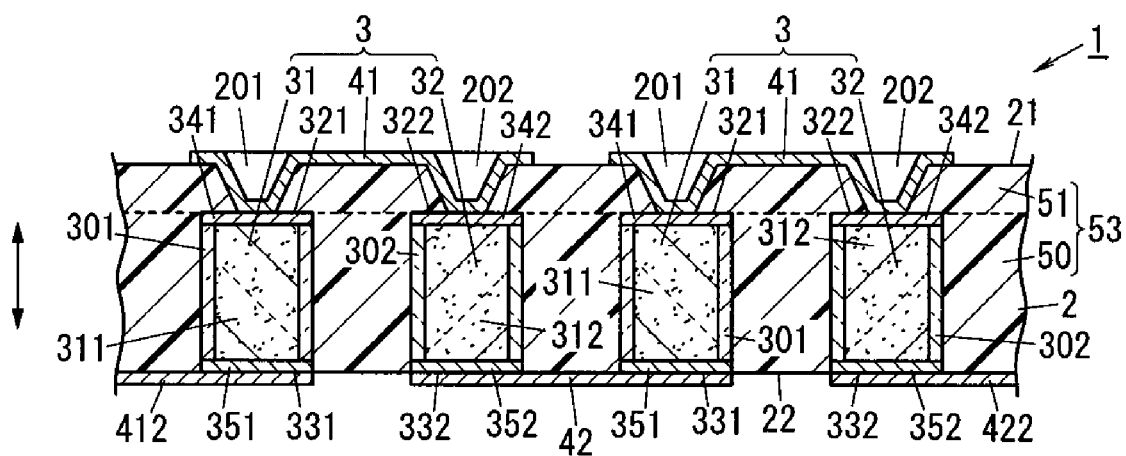
FIG. 5B is a schematic sectional view illustrating an example of the (second) thermoelectric conversion substrate according to the exemplary embodiment of the present disclosure.

The above substrate is another example of thermoelectric conversion substrate 1 including one thermoelectric conversion unit 3. FIG. 5B shows thermoelectric conversion substrate 1 including a plurality of thermoelectric conversion units 3. This thermoelectric conversion substrate 1 is common to thermoelectric conversion substrate 1 shown in FIG. 1B except for the above differences, and hence a description will be omitted.

[Thermoelectric Conversion Module]

Figure 6A:
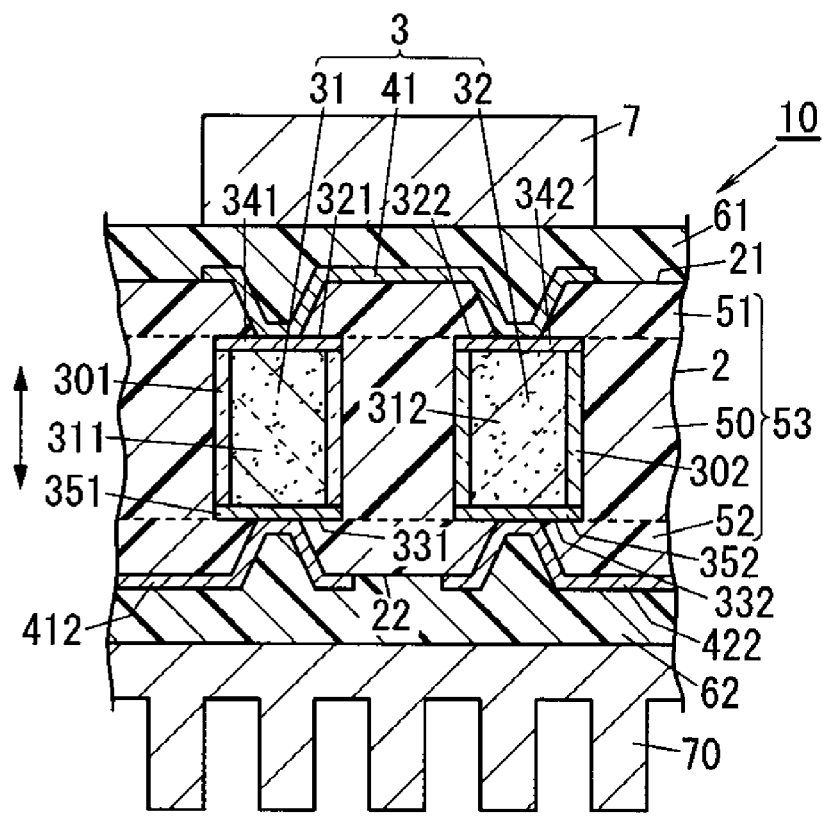
FIG. 6A is a schematic sectional view illustrating an example of a thermoelectric conversion module according to the exemplary embodiment of the present disclosure.

FIG. 6A shows an example of thermoelectric conversion module 10. Thermoelectric conversion module 10 includes thermoelectric conversion substrate 1, insulating film 61, and electronic component 7.

Figure 6B:
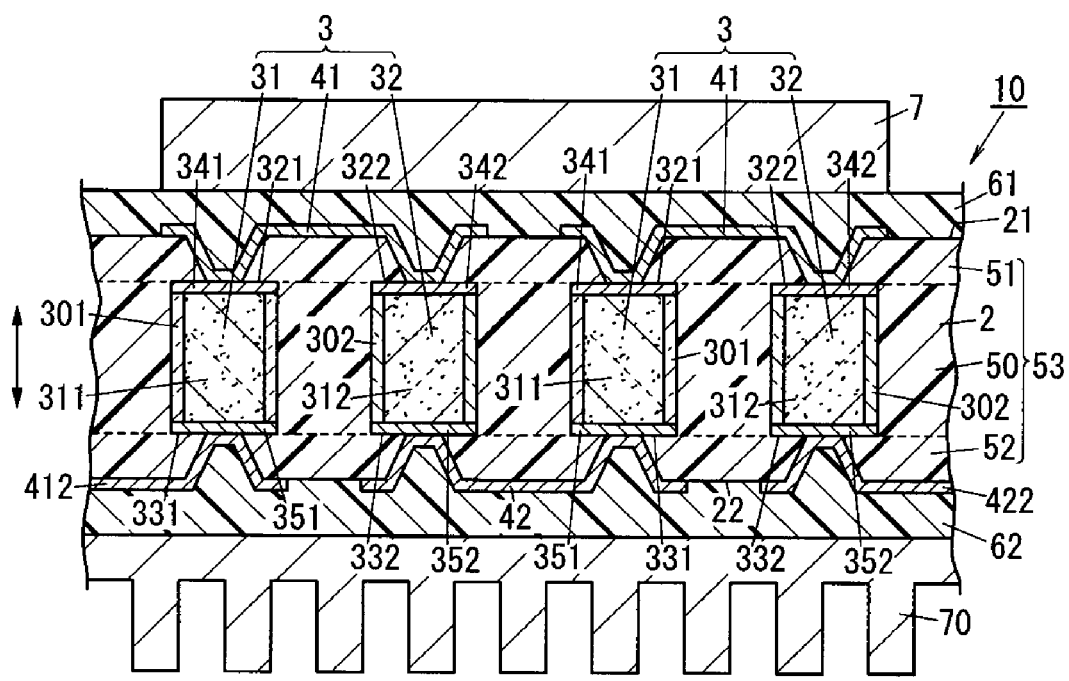
FIG. 6B is a schematic sectional view illustrating an example of the thermoelectric conversion module according to the exemplary embodiment of the present disclosure.
Figure 7A:
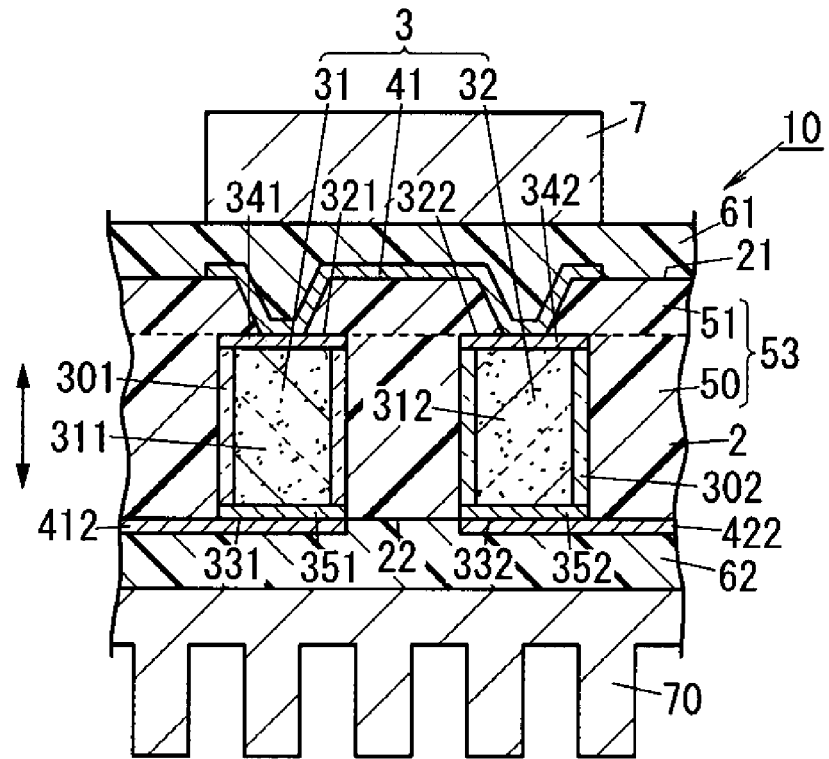
FIG. 7A is a schematic sectional view illustrating another example of the thermoelectric conversion module according to the exemplary embodiment of the present disclosure.
Figure 7B:
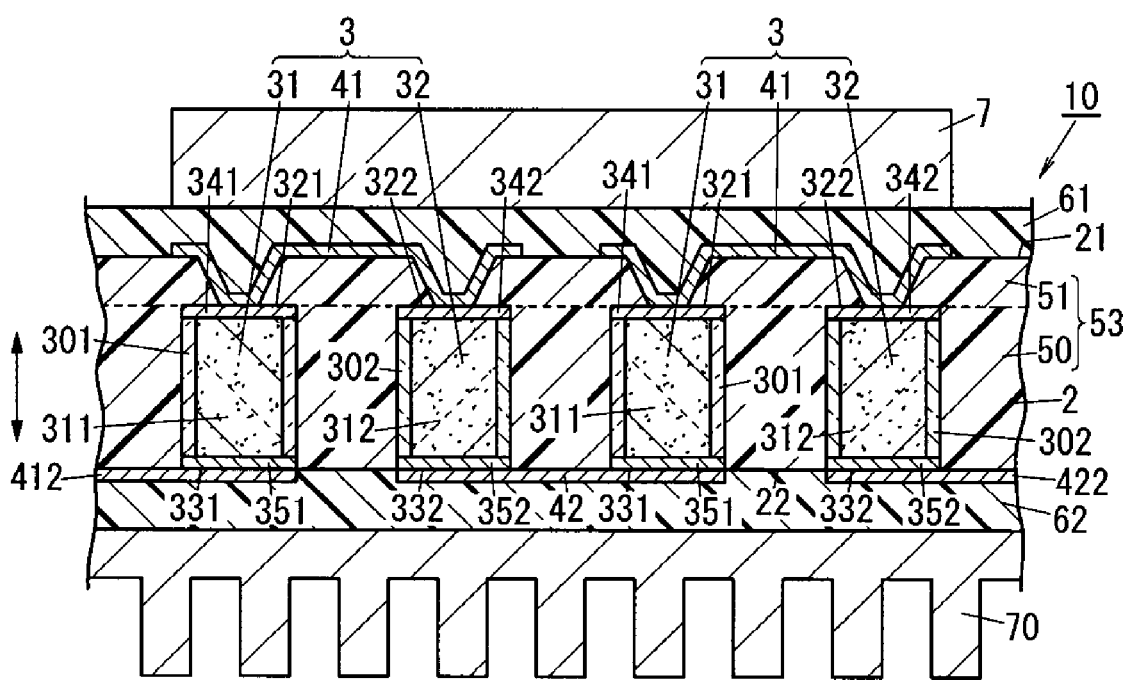
FIG. 7B is a schematic sectional view illustrating another example of the thermoelectric conversion module according to the exemplary embodiment of the present disclosure.

Thermoelectric conversion module 10 shown in FIG. 6A includes thermoelectric conversion substrate 1 shown in FIG. 1A. Thermoelectric conversion module 10 shown in FIG. 6B includes thermoelectric conversion substrate 1 shown in FIG. 1B. Thermoelectric conversion module 10 shown in FIG. 7A includes thermoelectric conversion substrate 1 shown in FIG. 5A. Thermoelectric conversion module 10 shown in FIG. 7B includes thermoelectric conversion substrate 1 shown in FIG. 5B. Thermoelectric conversion module 10 shown in FIG. 6A will be described below. Here, a description of other thermoelectric conversion modules 10 will be omitted. Insulating film 61 is provided on first surface 21 or second surface 22 of insulating substrate 2 of thermoelectric conversion substrate 1. Although insulating film 61 is provided on first surface 21 in FIG. 6A, insulating film 61 may be provided on second surface 22. Insulating film 61 is not specifically limited as long as it is a sheet having an insulation property. For example, insulating film 61 is a sheet obtained by curing a thermosetting resin composition impregnated in a reinforcing material. Insulating film 61 may be obtained by curing a thermosetting resin composition in the form of a sheet without using any reinforcing material. In addition, insulating film 61 may be a film obtained coating thermoelectric conversion substrate 1 with an uncured resin material and then curing the resin like a solder resist.

Electronic component 7 is mounted to thermoelectric conversion substrate 1 via insulating film 61. Specific examples of electronic component 7 are a large scale integration (LSI) circuit and a power semiconductor device (power device). Although not shown, when electronic component 7 is mounted to thermoelectric conversion substrate 1 via insulating film 61, wirings, lands, through holes, and the like are formed on insulating film 61, as needed.

It is preferable that thermally conductive layer 62 be provided on second surface 22 of insulating substrate 2, and heat sink 70 be attached to thermally conductive layer 62. A thermal interface material (TIM) such as grease is formed on thermally conductive layer 62. Heat sink 70 is provided with, for example, creases to have a larger surface area. Specific examples of a material of heat sink 70 are aluminum and copper.

Connecting a DC power supply to second electrodes 412 and 422 and applying a voltage between the second electrodes 412 and 422 to make a current flow can transfer heat from one surface of insulating substrate 2 to the other surface due to the Peltier effect. Assume that first semiconductor 311 is a p-type semiconductor, and second semiconductor 312 is an n-type semiconductor. In this case, when a DC current flows from second semiconductor 312 to first semiconductor 311, heat generated from electronic component 7 and transferred to insulating film 61 can be dissipated from the heat sink via thermally conductive layer 62 by forcibly transferring the heat from first surface 21 of insulating substrate 2 to second surface 22.

In thermoelectric conversion module 10 shown in FIG. 6A, since first semiconductor 311 and second semiconductor 312 are respectively protected by first tubular member 301 and second tubular member 302, damage to thermoelectric conversion unit 3 can be suppressed even upon loading on insulating substrate 2. For example, a direction of loading on insulating substrate 2 is the thickness direction. However, the direction of loading is not limited to this.

As described above, heat transfers inside insulating substrate 2, and insulating substrate 2 slightly thermally expands as the heat transfers. Even if the influence of this thermal expansion reaches first thermoelectric member 31 and second thermoelectric member 32 of thermoelectric conversion unit 3, damage to thermoelectric conversion unit 3 can be suppressed because first semiconductor 311 and second semiconductor 312 are respectively protected by first tubular member 301 and second tubular member 302. This configuration is especially effective when first tubular member 301 and second tubular member 302 each have a smaller thermal expansion coefficient than insulating substrate 2.

[(First) Method for Producing Thermoelectric Conversion Substrate]

A method for producing thermoelectric conversion substrate 1 includes the following steps shown in FIGS. 8A to 8E and FIGS. 9A to 9C. This thermoelectric conversion substrate 1 is an example including one thermoelectric conversion unit 3. FIGS. 10A to 10E and FIGS. 11A to 11C show an example including a plurality of thermoelectric conversion units 3. FIGS. 10A to 10E and FIGS. 11A to 11C respectively correspond to FIGS. 8A to 8E and FIGS. 9A to 9C, and hence the respective steps will be sequentially described mainly with reference to FIGS. 8A to 8E and FIGS. 9A to 9C.

(Step A1)

Figure 8A:
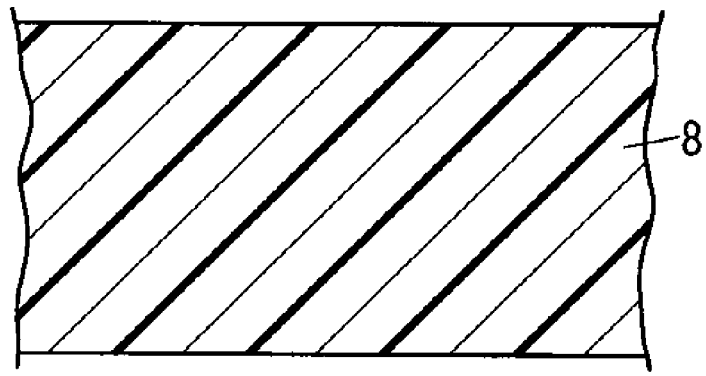
FIGS. 8A to 8E are schematic sectional views illustrating an example of a (first) method for producing the thermoelectric conversion substrate according to the exemplary embodiment of the present disclosure.

In step A1, as shown in FIG. 8A, semi-cured core substrate 8 is prepared. A specific example of core substrate 8 is a prepreg. The prepreg is a semi-cured adhesive sheet obtained by impregnating a thermosetting resin composition in a reinforcing material. A specific example of the reinforcing material is glass cloth. A specific example of the thermosetting resin composition is a thermosetting resin composition impregnated with epoxy resin. A semi-cured state (stage B) means a state corresponding to an intermediate stage of a curing reaction between a varnished state (stage A) and a cured state (stage C). A thickness of core substrate 8 is greater than a length of each of first thermoelectric member 31 and second thermoelectric member 32.

(Step B1)

Figure 8B:
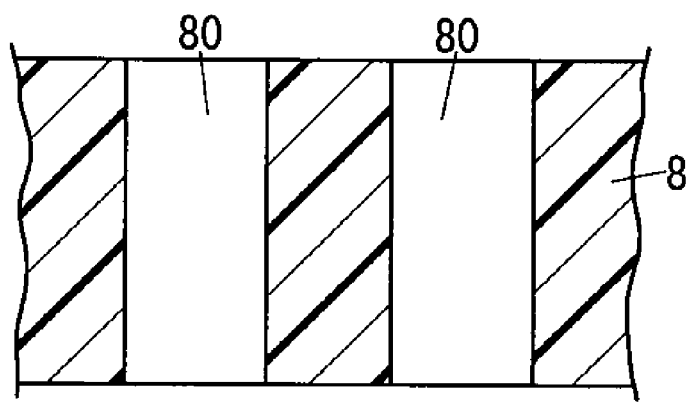
Figure 12:
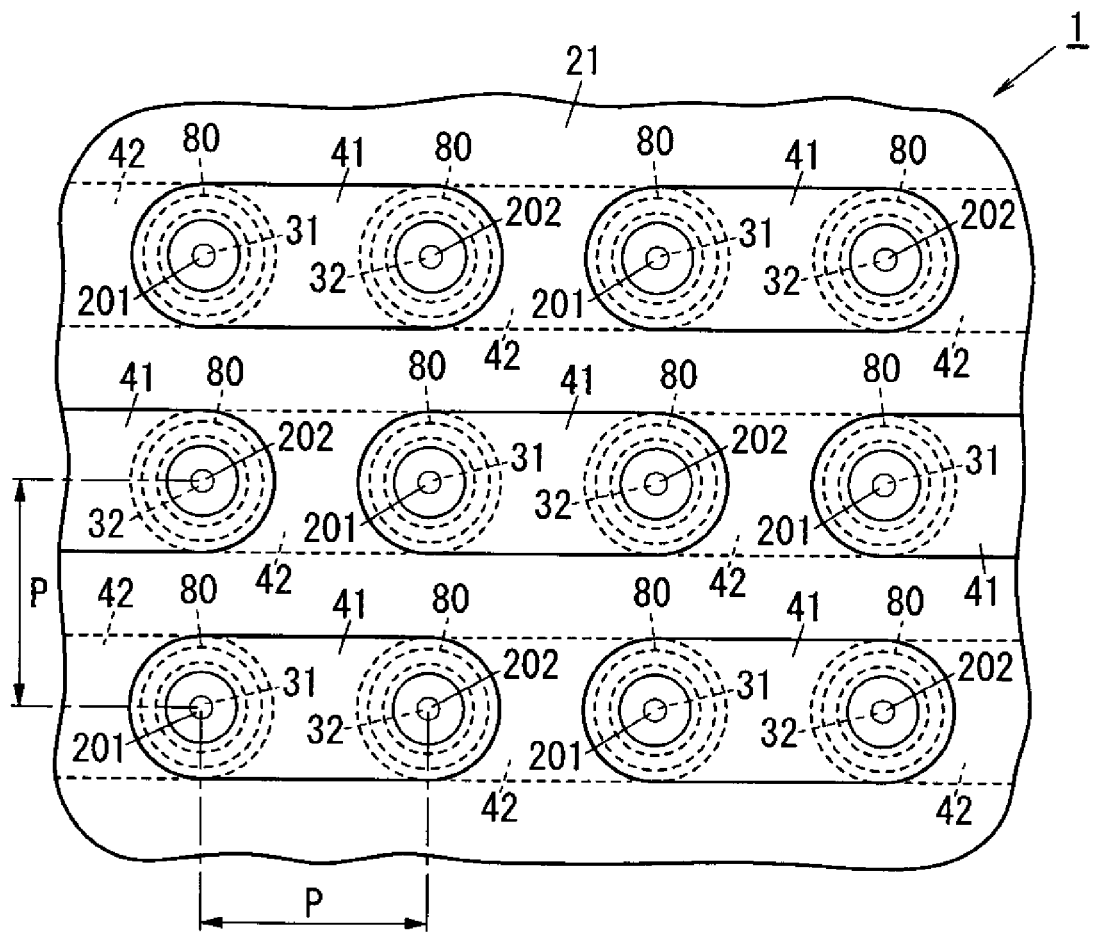
FIG. 12 is a schematic plan view illustrating an example of the same thermoelectric conversion substrate as that shown above.

In step B1, as shown in FIG. 8B, a plurality of through holes 80 are formed in core substrate 8. Through holes 80 can be formed by drilling. An inner diameter of through hole 80 is almost equal to an outer diameter of each of first thermoelectric member 31 and second thermoelectric member 32. One thermoelectric conversion unit 3 has one first thermoelectric member 31 and one second thermoelectric member 32. Accordingly, when thermoelectric conversion substrate 1 including one thermoelectric conversion unit 3 is produced, two through holes 80 are formed in core substrate 8. When thermoelectric conversion substrate 1 including a plurality of thermoelectric conversion units 3 is produced, through holes 80 double in number than thermoelectric conversion units 3 are formed in core substrate 8 (see FIG. 10B). Specific examples of an arrangement pattern of through holes 80 when viewed from the thickness direction are a lattice pattern (see FIG. 12) and a staggered state. However, this is not limited. Pitch P (center-to-center distance) of two adjacent through holes 80 is between 0.5 mm and 2.1 mm (inclusive).

(Step C1)

In step C1, first of all, first thermoelectric member 31 and second thermoelectric member 32 are prepared.

Figure 13:
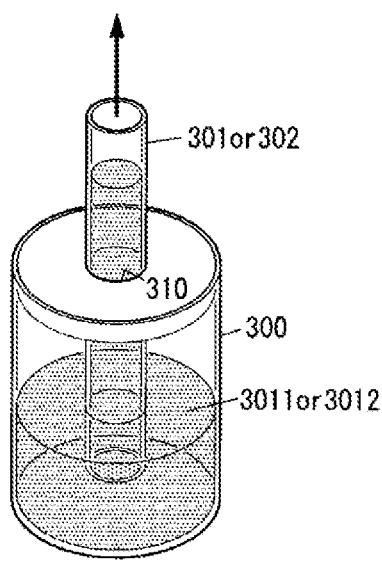
FIG. 13 is a schematic perspective view illustrating one step in a method for producing a first thermoelectric member and a second thermoelectric member.
Figure 14:
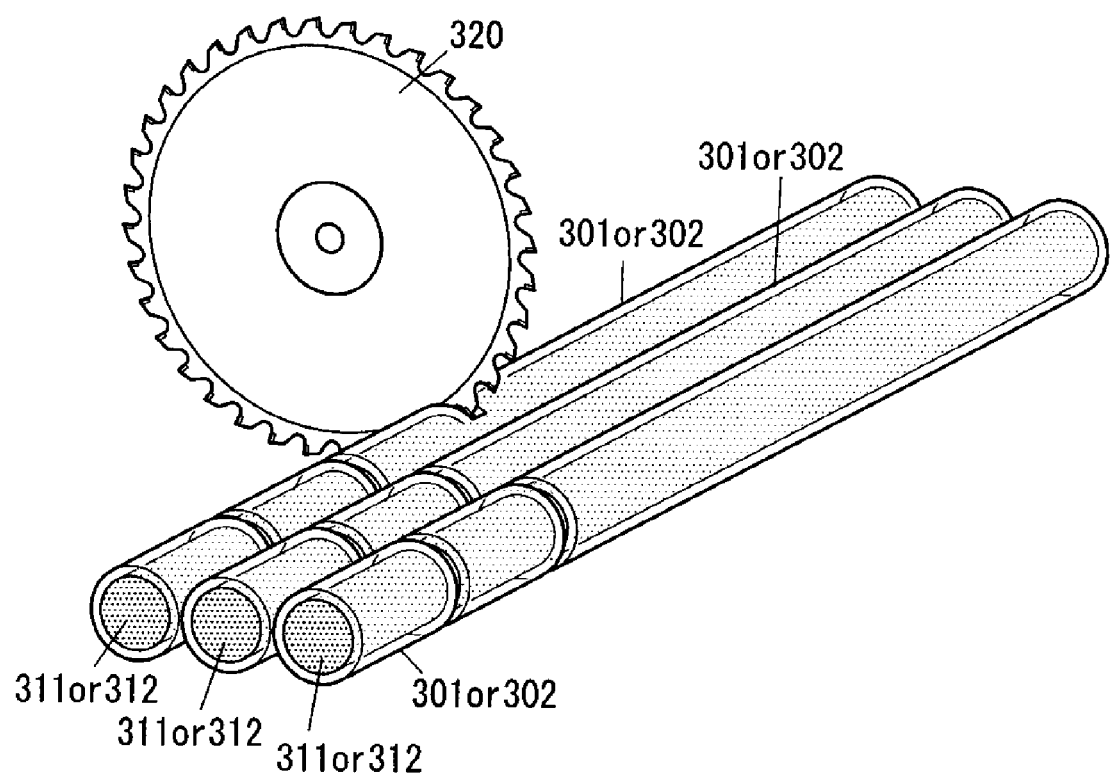
FIG. 14 is a schematic perspective view illustrating another step in the method for producing the first thermoelectric member and the second thermoelectric member.

A method for producing first thermoelectric member 31 and second thermoelectric member 32 will be described below. First, as shown in FIG. 13, material 3011 (solid powder) for first semiconductor 311 is placed in container 300. Container 300 may be vacuum or filled with a gas unreactive to material 3011. First tubular member 301 is inserted into insertion opening 310 provided in container 300. Material 3011 is sucked by first tubular member 301 while being heated at a temperature lower than a melting point. Material 3011 is then solid-phase sintered in first tubular member 301 to form first semiconductor 311. Thereafter, as shown in FIG. 14, first thermoelectric member 31 shown in FIG. 2A is obtained by slicing first tubular member 301 filled with first semiconductor 311 into discrete rings with cutter 320. As described above, first thermoelectric member 31 is produced by filling first tubular member 301 with first semiconductor 311. Subsequently, distal end portions 341 and 351 are preferably formed by respectively providing a Ti layer, an Ni layer, and a joining layer on both ends of first thermoelectric member 31. The Ti layer can be formed by a sputtering method. The Ni layer and the joining layer can be formed by an electroless plating method. Second thermoelectric member 32 can be produced by using material 3012 of second semiconductor 312 and second tubular member 302 in the same manner as first thermoelectric member 31. Second semiconductor 312 has carriers different from carriers of first semiconductor 311. In this manner, second thermoelectric member 32 is produced by filling second tubular member 302 with second semiconductor 312. First thermoelectric member 31 and second thermoelectric member 32 may be prepared in a step before step C1.

Functions of first thermoelectric member 31 and second thermoelectric member 32 can be directly inspected. In order to suppress variations in inspection, barrier films are preferably formed on both ends of first thermoelectric member 31 and second thermoelectric member 32, respectively. Performing function inspection can sort first thermoelectric members 31 and second thermoelectric members 32 into non-defective products and defective products. Only first thermoelectric member 31 and second thermoelectric member 32 determined as non-defective products are selected and used for production of thermoelectric conversion substrate 1. Since first thermoelectric member 31 and second thermoelectric member 32 can be used after inspection of each function, quality stability of thermoelectric conversion substrate 1 can be improved. This can reduce the possibility that a malfunction is found after production of thermoelectric conversion substrate 1.

Figure 8C:
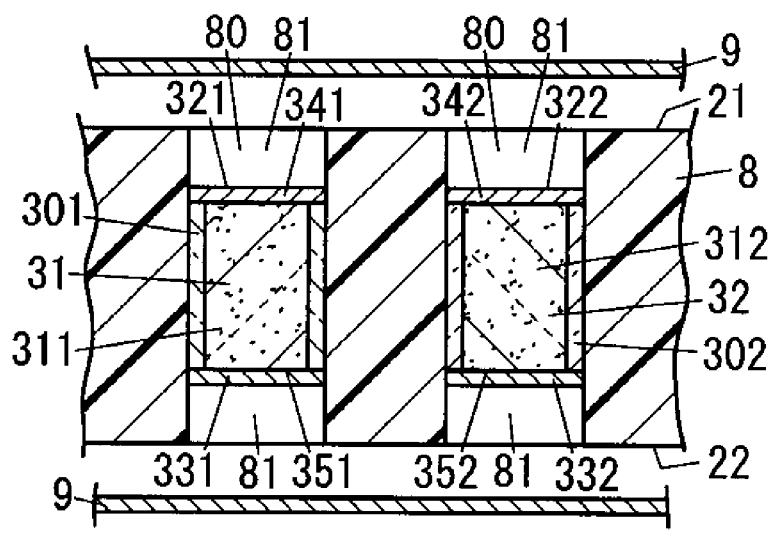

In step C1, as shown in FIG. 8C, at least one first thermoelectric member 31 and at least one second thermoelectric member 32 are inserted into the plurality of through holes 80 of core substrate 8. This temporarily fix first thermoelectric member 31 and second thermoelectric member 32 and can improve positional accuracy. First thermoelectric member 31 and second thermoelectric member 32 each are located in the middle of through hole 80 in the depth direction. Since a thickness of core substrate 8 is greater than a length of each of first thermoelectric member 31 and second thermoelectric member 32, recesses 81 are formed in both sides of each of first thermoelectric member 31 and second thermoelectric member 32 when first thermoelectric member 31 and second thermoelectric member 32 each are located in the middle of through hole 80. When the arrangement pattern of through holes 80 when viewed from the thickness direction is a lattice pattern like that shown in FIG. 12, first thermoelectric members 31 and second thermoelectric members 32 are preferably alternately inserted in through holes 80.

(Step D1)

Figure 8D:
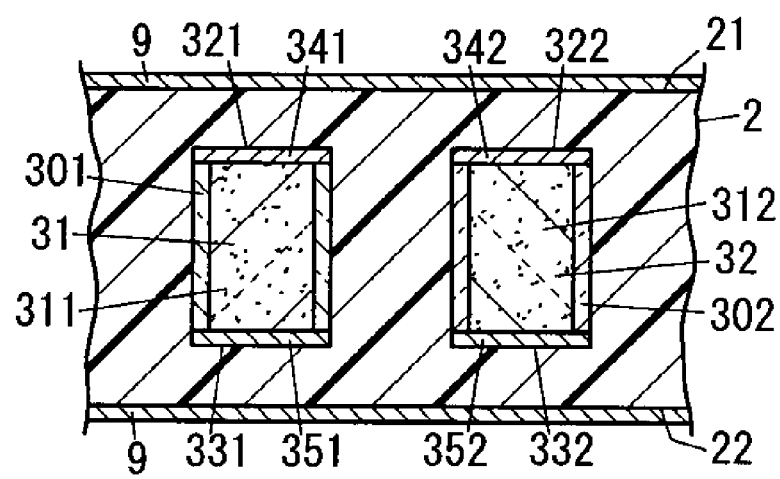

In step D1, as shown in FIG. 8C, metal foils 9 are stacked on both surfaces of core substrate 8 and then hot-pressed core substrate 8 with metal foils 9 to form insulating substrate 2 like that shown in FIG. 8D. Metal foils 9 are stacked on core substrate 8 so as to cover all through holes 80. A specific example of metal foil 9 is a copper foil. Semi-cured core substrate 8 is hot-pressed to be cured to form insulating substrate 2. At the time of hot pressing, a resin forming core substrate 8 partially flows into recesses 81 to fill recesses 81, thereby forming flat first surface 21 and second surface 22 of insulating substrate 2. Conditions for hot pressing are not specifically limited.

(Step E1)

Figure 8E:
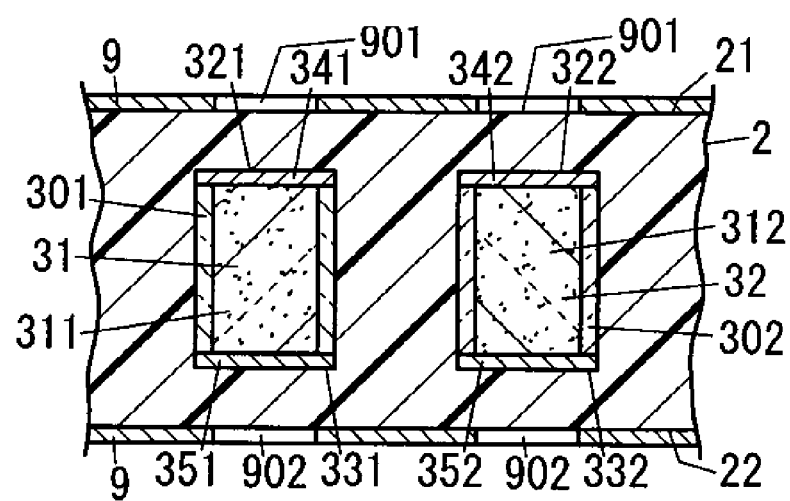

In step E1, as shown in FIG. 8E, a portion of metal foils 9 at a position corresponding to each of locations of first thermoelectric member 31 and second thermoelectric member 32 is removed. That is, the portion of metal foils 9 to be removed is a portion at which first thermoelectric member 31 or second thermoelectric member 32 exists immediately below when metal foils 9 are viewed from the thickness direction. From this, recess portion 901 having first surface 21 as a bottom surface and recess portion 902 having second surface 22 as a bottom surface are formed. Each of removal areas of metal foils 9 is preferably smaller than an area of a corresponding one of distal end faces 321 and 331 of first thermoelectric member 31 and distal end faces 322 and 332 of second thermoelectric member 32. That is, an area of recess portion 901 of first surface 21 is preferably smaller than an area of each of distal end faces 321 and 322 of first thermoelectric member 31 and second thermoelectric member 32. And an area of recess portion 902 of second surface 22 is preferably smaller than an area of each of distal end faces 331 and 332 of first thermoelectric member 31 and second thermoelectric member 32. Metal foil 9 can be removed by, for example, etching.

(Step F1)

Figure 9A:
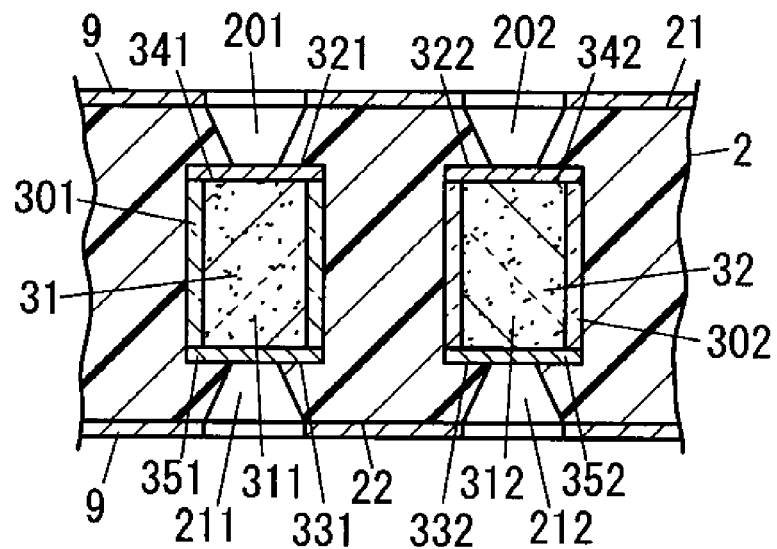
FIGS. 9A to 9C are schematic sectional views illustrating an example of the (first) method for producing the thermoelectric conversion substrate, which follow FIG. 8E.

In step F1, as shown in FIG. 9A, portions of insulating substrate 2 at which metal foil 9 has been removed are removed to expose distal end faces 321 and 331 of first thermoelectric member 31 and distal end faces 322 and 332 of second thermoelectric member 32. Removing the above portions of insulating substrate 2 can form first opening portion 201 and second opening portion 202 in first surface 21 of insulating substrate 2 and third opening portion 211 and fourth opening portion 212 in second surface 22 of insulating substrate 2. Insulating substrate 2 can be removed by, for example, irradiation with a $CO_2$ laser (carbon dioxide laser).

(Step G1)

Figure 9B:
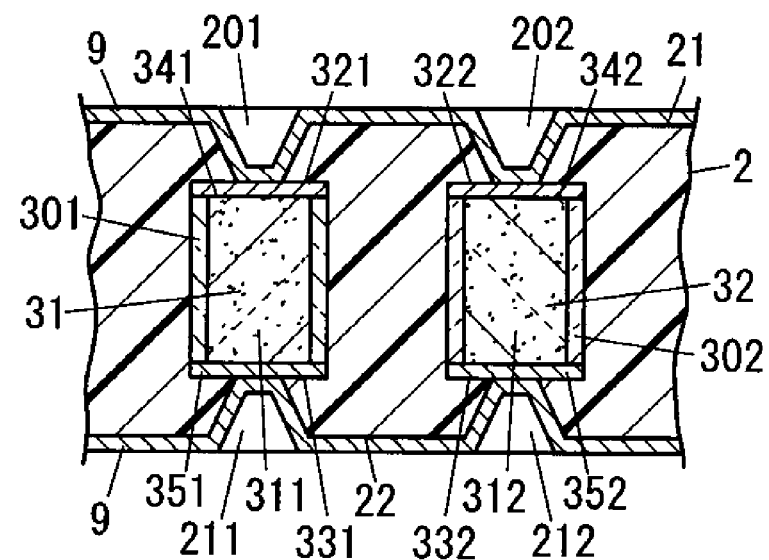

In step G1, as shown in FIG. 9B, plating is provided, ranging from distal end faces 321 and 331 of first thermoelectric member 31 and distal end faces 322 and 332 of second thermoelectric member 32 to metal foils 9. In this case, first opening portion 201, second opening portion 202, third opening portion 211, and fourth opening portion 212 may be filled with plating to form filled vias.

(Step H1)

Figure 9C:
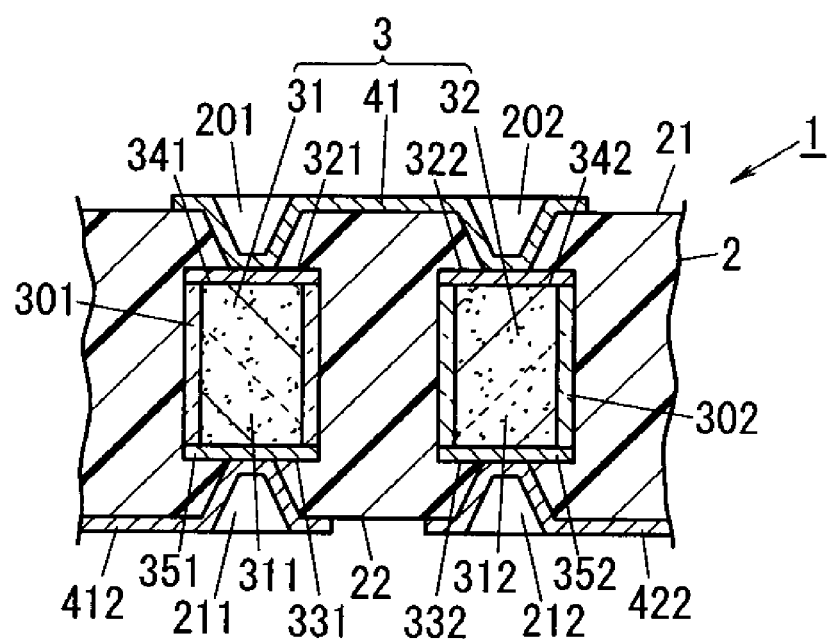
Figure 10A:
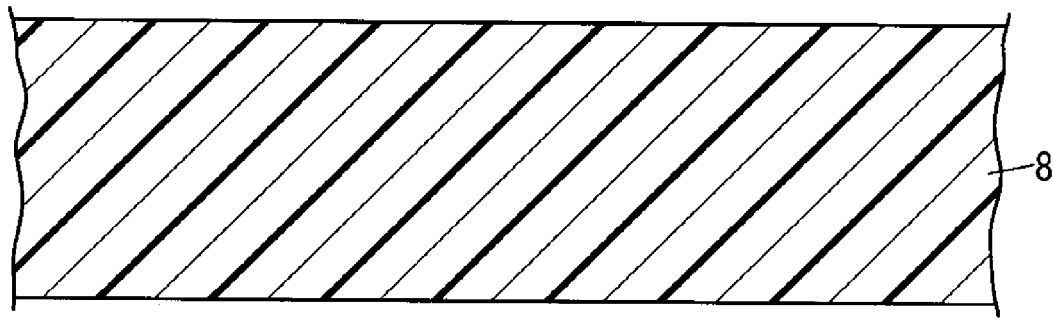
FIGS. 10A to 10E are schematic sectional views illustrating another example of the (first) method for producing the thermoelectric conversion substrate according to the exemplary embodiment of the present disclosure.
Figure 10B:
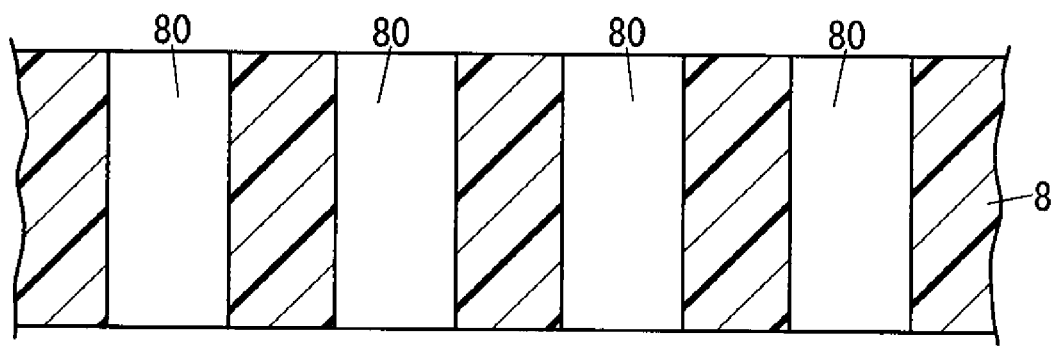
Figure 10C:
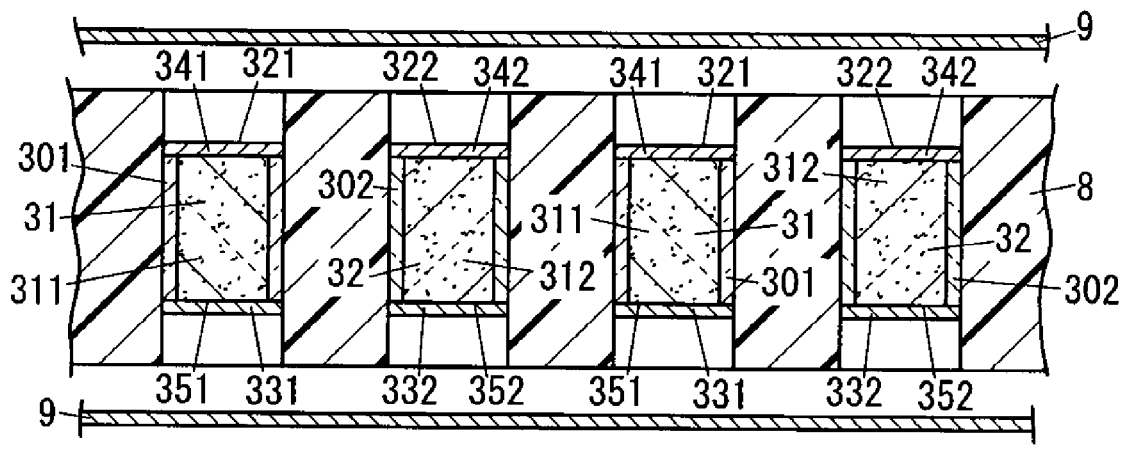
Figure 10D:
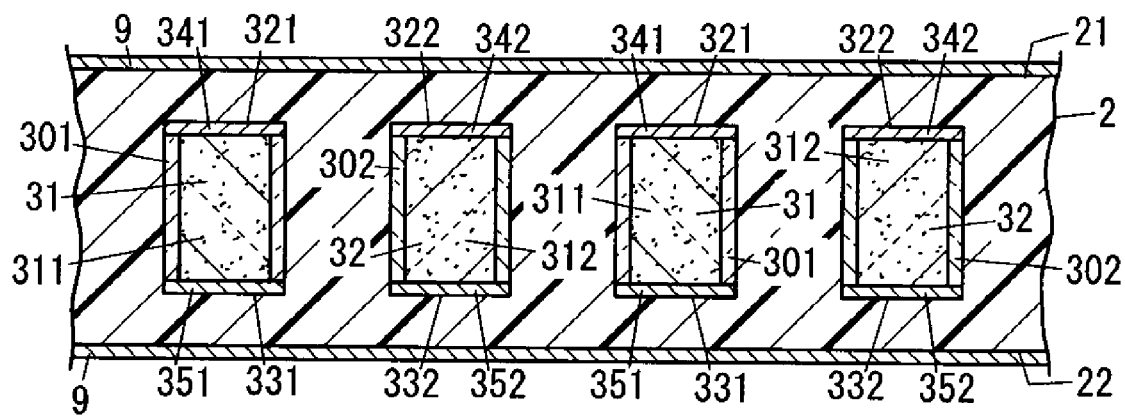
Figure 10E:
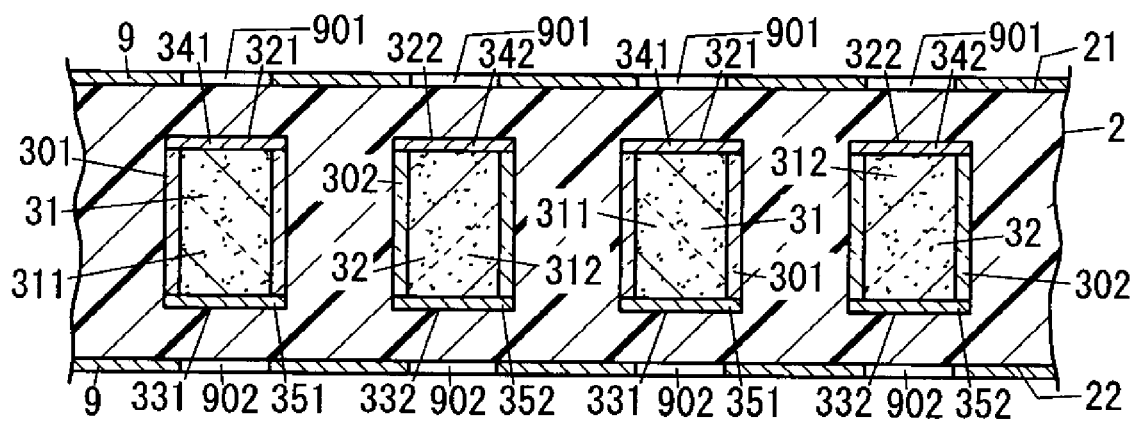

In step H1, as shown in FIG. 9C, metal foil 9 on first surface 21 of insulating substrate 2 is partially removed to form first electrode 41 that electrically connects first thermoelectric member 31 to second thermoelectric member 32. In this case, metal foil 9 on second surface 22 of insulating substrate 2 may be partially removed to form second electrodes 412 and 422 for power supply connection. In this manner, thermoelectric conversion substrate 1 shown in FIG. 1A can be produced.

The method for producing thermoelectric conversion substrate 1 including a plurality of thermoelectric conversion units 3 further includes following steps.

(Step I1)

Figure 11A:
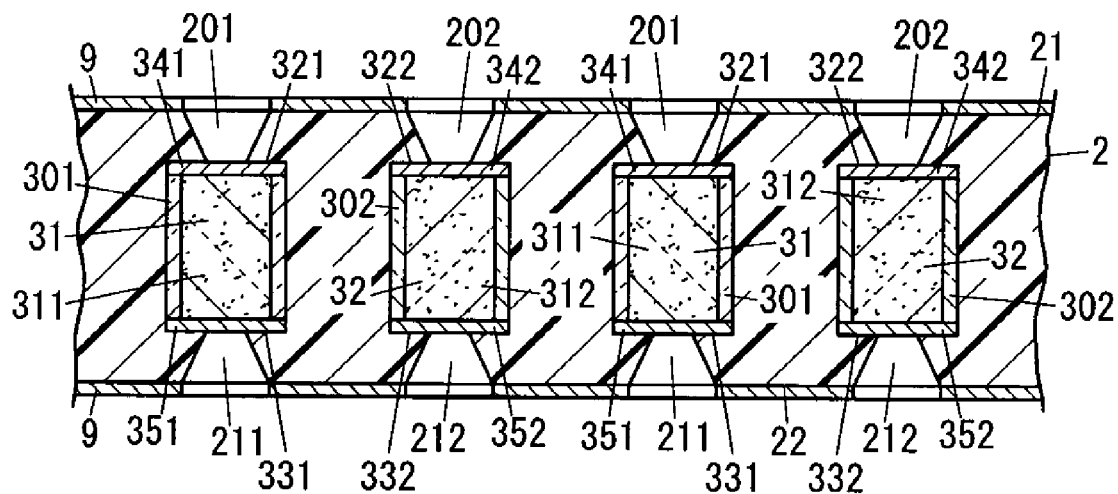
FIGS. 11A to 11C are schematic sectional views illustrating another example of the (first) method for producing the thermoelectric conversion substrate according to the exemplary embodiment of the present disclosure, which follow FIG. 10E.
Figure 11B:
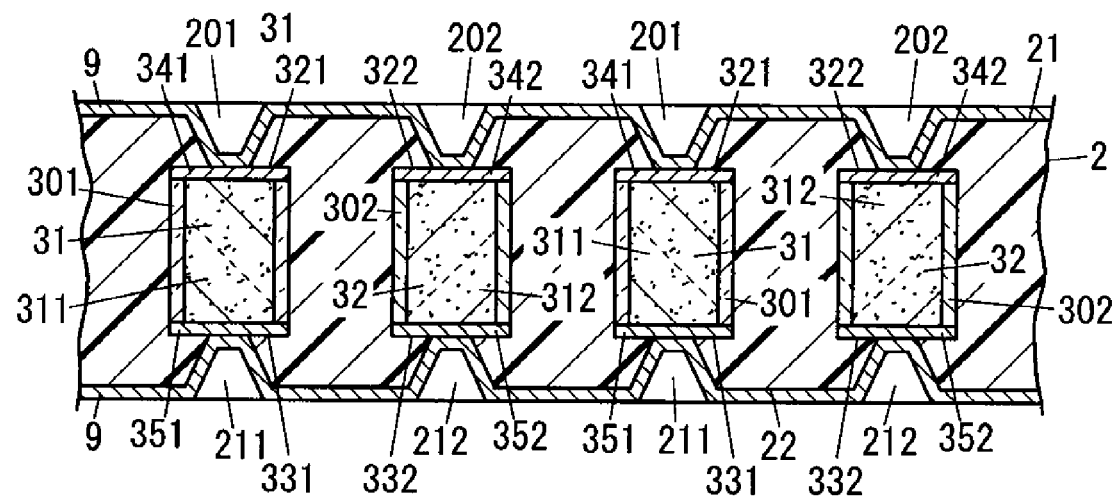
Figure 11C:
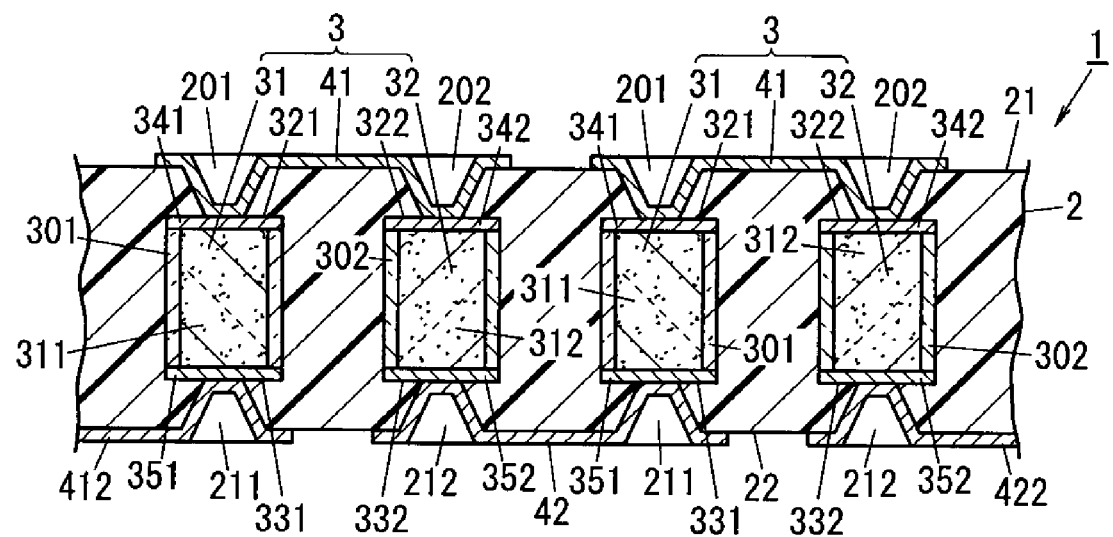

In step I1 as shown in FIG. 11C, metal foil 9 on second surface 22 of insulating substrate 2 is partially removed to form second electrode 42. Second electrode 42 electrically connects first thermoelectric member 31 to second thermoelectric member 32, which differ from first thermoelectric member 31 and second thermoelectric member 32 which are electrically connected to each other by first electrode 41. That is, second electrode 42 electrically connects first semiconductor 311 of first thermoelectric member 31 of one thermoelectric conversion unit 3 (thermoelectric conversion unit 3 on the right side in FIG. 11C) to second semiconductor 312 of second thermoelectric member 32 of another thermoelectric conversion unit 3 (thermoelectric conversion unit 3 on the left side in FIG. 11C). In this manner, thermoelectric conversion substrate 1 shown in FIG. 1B can be produced.

[(Second) Method for Producing Thermoelectric Conversion Substrate]

A method for producing thermoelectric conversion substrate 1 includes following steps shown in FIGS. 15A to 15E and FIGS. 16A to 16C. Thermoelectric conversion substrate 1 is an example including one thermoelectric conversion unit 3. FIGS. 17A to 17E and FIG. 18A to 18C show an example including a plurality of thermoelectric conversion units 3. FIGS. 17A to 17E and FIGS. 18A to 18C respectively correspond to FIGS. 15A to 15E and FIGS. 16A to 16C, and hence the respective steps will be sequentially described mainly with reference to FIGS. 15A to 15E and FIGS. 16A to 16C.

(Step A1-2)

Figure 15A:
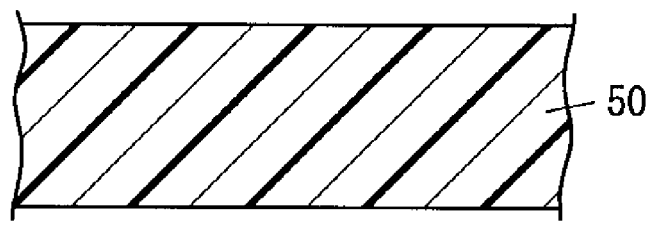
FIGS. 15A to 15E are schematic sectional views illustrating an example of a (second) method for producing the thermoelectric conversion substrate according to the exemplary embodiment of the present disclosure.

In step A1-2, as shown in FIG. 15A, cured core insulating layer 50 is prepared. A specific example of core insulating layer 50 is a cured prepreg. A thickness of core insulating layer 50 is almost equal to a length of each of first thermoelectric member 31 and second thermoelectric member 32.

(Step B1-2)

Figure 15B:
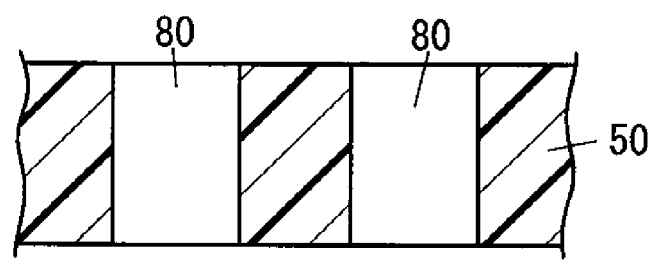

In step B1-2, as shown in FIG. 15B, a plurality of through holes 80 are formed in core insulating layer 50. Details of this step are almost the same as details of step B1.

(Step C1-2)

In step C1-2, as in step C1, first of all, first thermoelectric member 31 and second thermoelectric member 32 are prepared.

Functions of first thermoelectric member 31 and second thermoelectric member 32 can be directly inspected. In order to suppress variations in inspection, barrier films are preferably formed on both ends of first thermoelectric member 31 and second thermoelectric member 32, respectively. Performing function inspection can sort first thermoelectric members 31 and second thermoelectric members 32 into non-defective products and defective products. Only first thermoelectric member 31 and second thermoelectric member 32 determined as non-defective products are selected and used for production of thermoelectric conversion substrate 1. Since first thermoelectric member 31 and second thermoelectric member 32 can be used after inspection of each function, quality stability of thermoelectric conversion substrate 1 can be improved. This can reduce the possibility that a malfunction is found after production of thermoelectric conversion substrate 1.

Figure 15C:
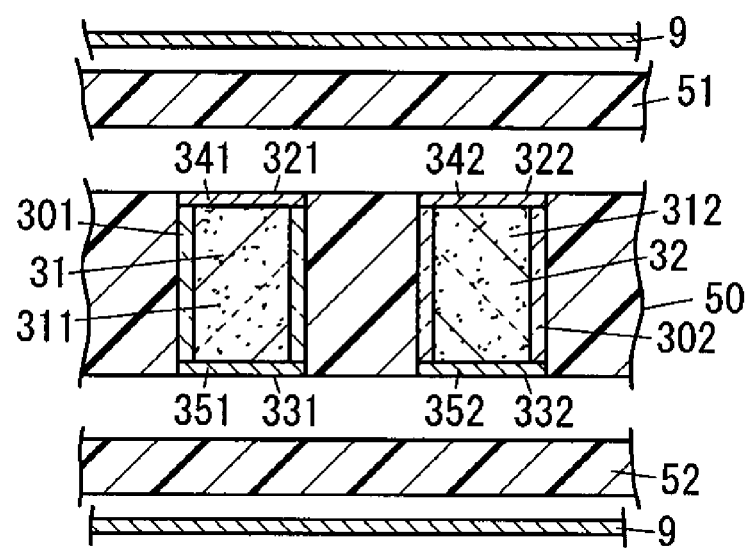
Figure 15D:
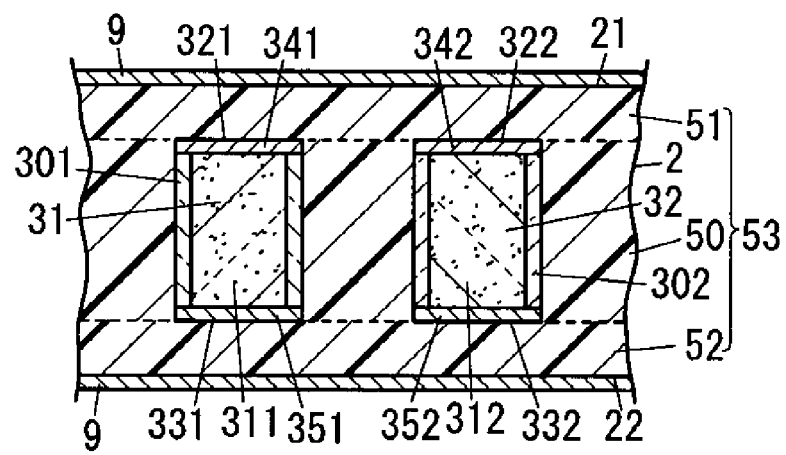

In step C1-2, as shown in FIG. 15C, at least one first thermoelectric member 31 and at least one second thermoelectric member 32 are inserted into the plurality of through holes 80 of core insulating layer 50. Since a thickness of core insulating layer 50 is almost equal to a length of each of first thermoelectric member 31 and second thermoelectric member 32, a surface of core insulating layer 50 is almost flush with distal end faces 321 and 331 of first thermoelectric member 31 and distal end faces 322 and 332 of second thermoelectric member 32. When the arrangement pattern of through holes 80 when viewed from the thickness direction is a lattice pattern like that shown in FIG. 12, first thermoelectric members 31 and second thermoelectric members 32 are preferably alternately inserted in through holes 80.

(Step D1-2)

In step D1-2, as shown in FIG. 15C, metal foil 9 is stacked on one surface of core insulating layer 50 via semi-cured first insulating layer 51, and metal foil 9 is stacked on the other surface of core insulating layer 50 via semi-cured second insulating layer 52. And then core insulating layer 50, semi-cured first insulating layer 51, semi-cured second insulating layer 52, and metal foils 9 are hot-pressed to form insulating substrate 2 like that shown in FIG. 15D. A specific example of each of semi-cured first insulating layer 51 and semi-cured second insulating layer 52 is a prepreg. Insulating substrate 2 includes multilayer structure 53 constituted by core insulating layer 50, cured first insulating layer 51, and cured second insulating layer 52. As has been described already, a thermal conductivity of each of first insulating layer 51 and second insulating layer 52 may be set to be higher than a thermal conductivity of core insulating layer 50. Metal foils 9 are stacked on core insulating layer 50 so as to cover all through holes 80. A specific example of metal foil 9 is a copper foil. Conditions for hot pressing are not specifically limited.

(Step E1-2)

Figure 15E:
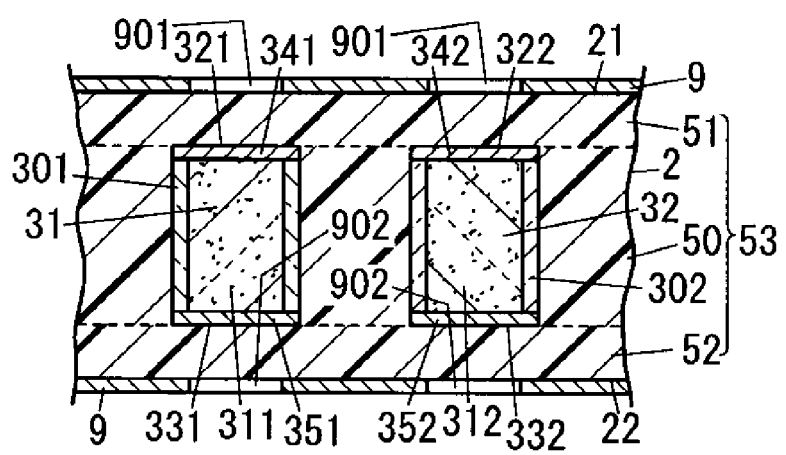

In step E1-2, as shown in FIG. 15E, portions of metal foils 9 at a position corresponding to each of locations of first thermoelectric member 31 and second thermoelectric member 32 are removed. Details of this step are almost the same as details of step E1.

(Step F1-2)

Figure 16A:
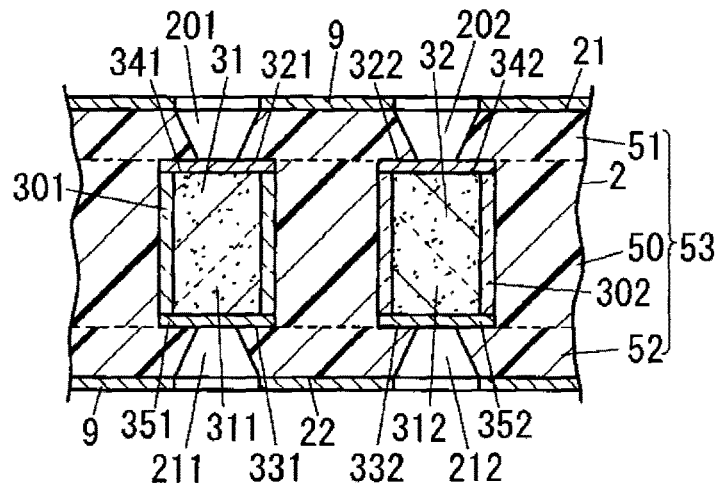
FIGS. 16A to 16C are schematic sectional views illustrating an example of the (second) method for producing the thermoelectric conversion substrate, which follow FIG. 15E.

In step F1-2, as shown in FIG. 16A, portions of insulating substrate 2 at which metal foil 9 has been removed are removed to expose distal end faces 321 and 331 of first thermoelectric member 31 and distal end faces 322 and 332 of second thermoelectric member 32. Details of this step are almost the same as details of step F1.

(Step G1-2)

Figure 16B:
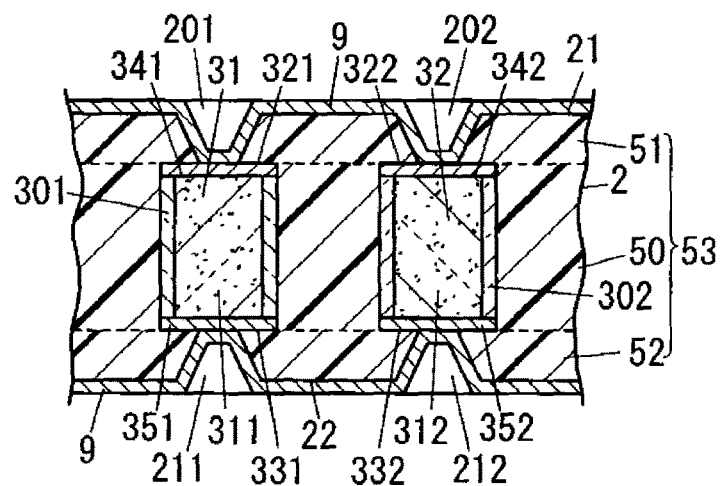

In step G1-2, as shown in FIG. 16B, plating is provided, ranging from distal end faces 321 and 331 of first thermoelectric member 31 and distal end faces 322 and 332 of second thermoelectric member 32 to metal foils 9. Details of this step are almost the same as details of step G1.

(Step H1-2)

Figure 16C:
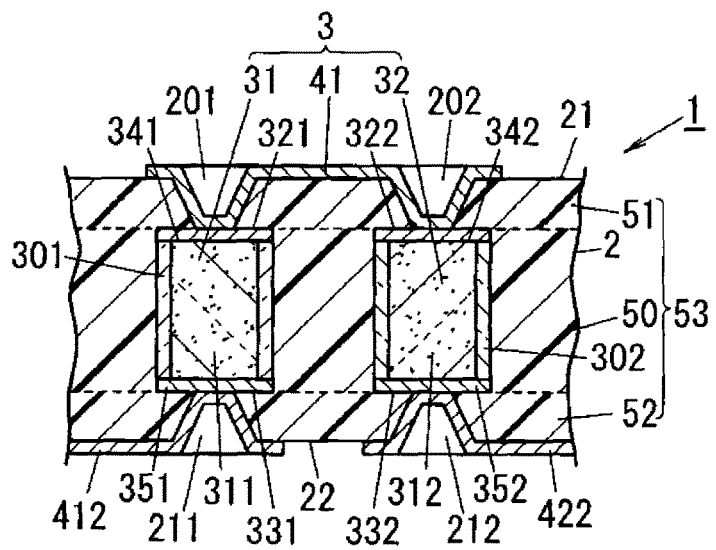

In step H1-2, as shown in FIG. 16C, metal foil 9 on first surface 21 of insulating substrate 2 is partially removed to form first electrode 41 that electrically connects first thermoelectric member 31 to second thermoelectric member 32. Details of this step are almost the same as details of step H1.

The method for producing thermoelectric conversion substrate 1 including a plurality of thermoelectric conversion units 3 further includes following steps.

(Step I1-2)

Figure 18A:
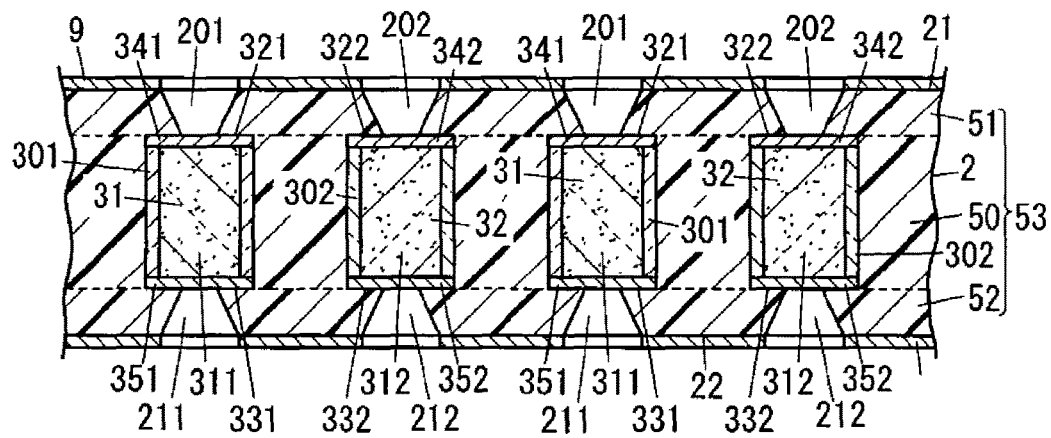
FIGS. 18A to 18C are schematic sectional views illustrating another example of the (second) method for producing the thermoelectric conversion substrate, which follow FIG. 17E.
Figure 18B:
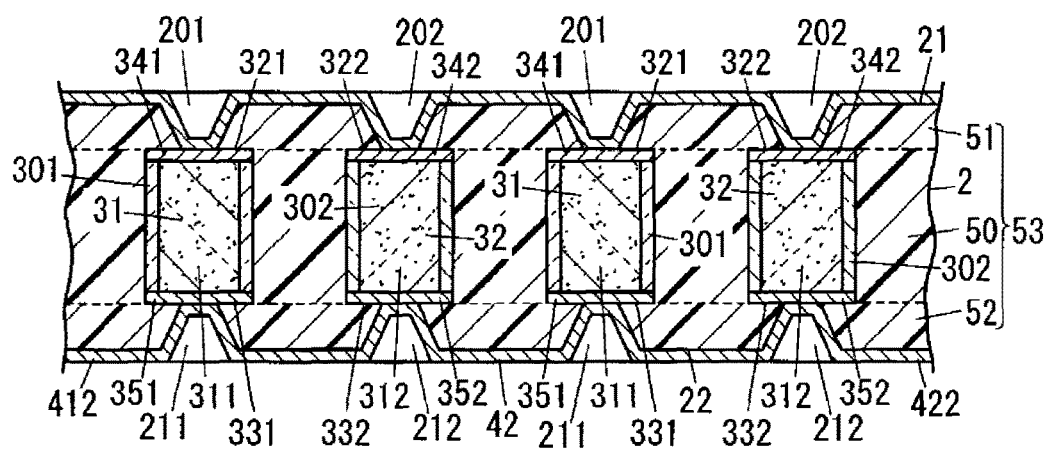
Figure 18C:
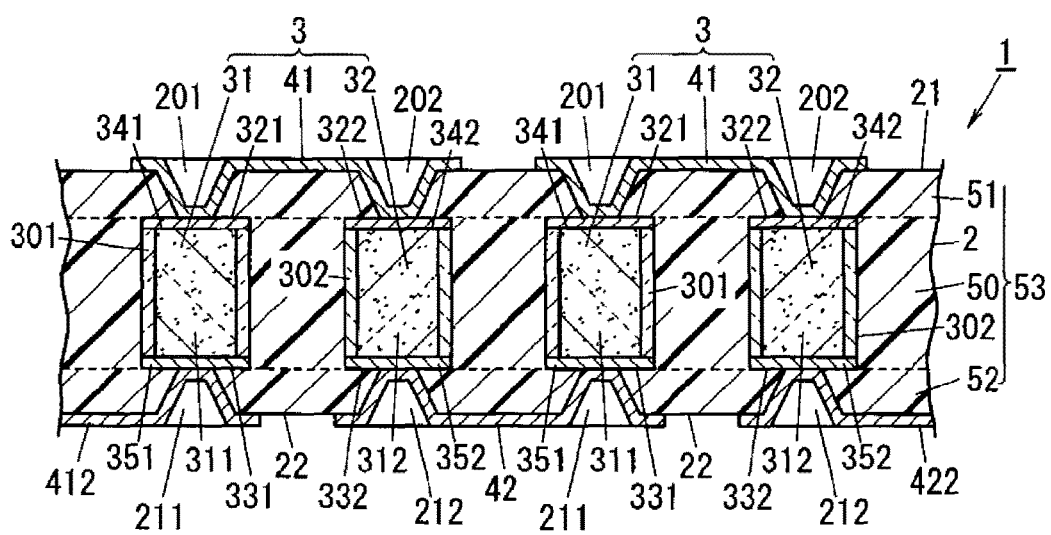
Figure 19A:
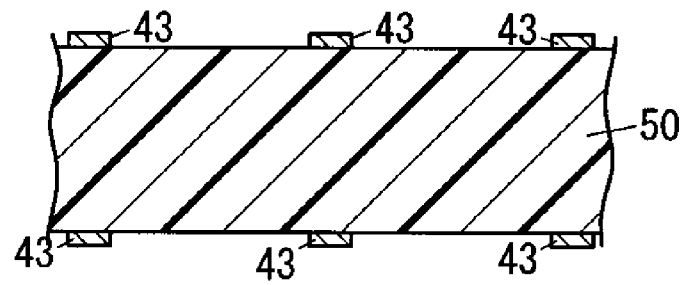
FIGS. 19A to 19E are schematic sectional views illustrating an example of a (third) method for producing the thermoelectric conversion substrate according to the exemplary embodiment of the present disclosure.
Figure 19B:
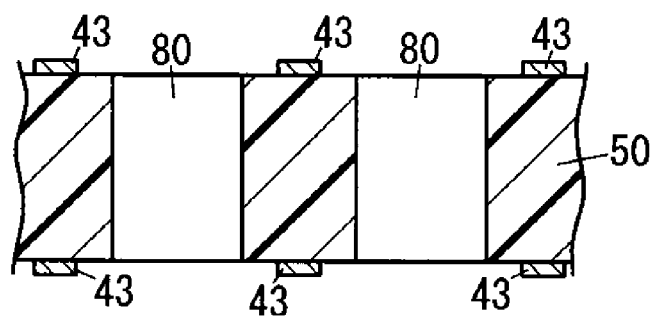
Figure 19C:
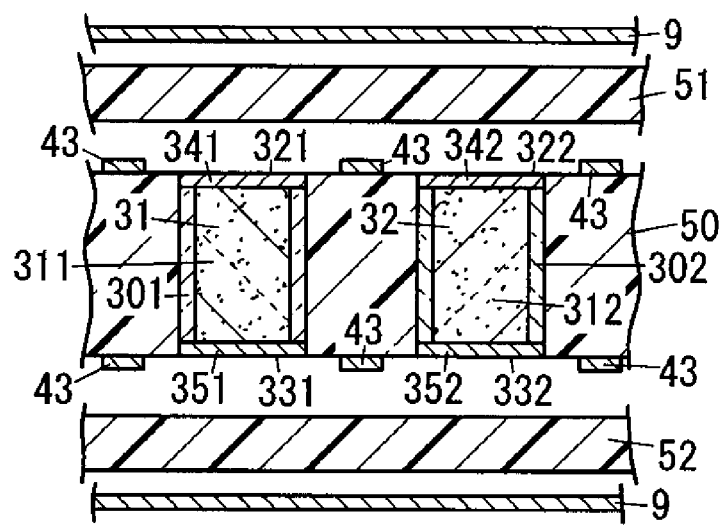
Figure 19D:
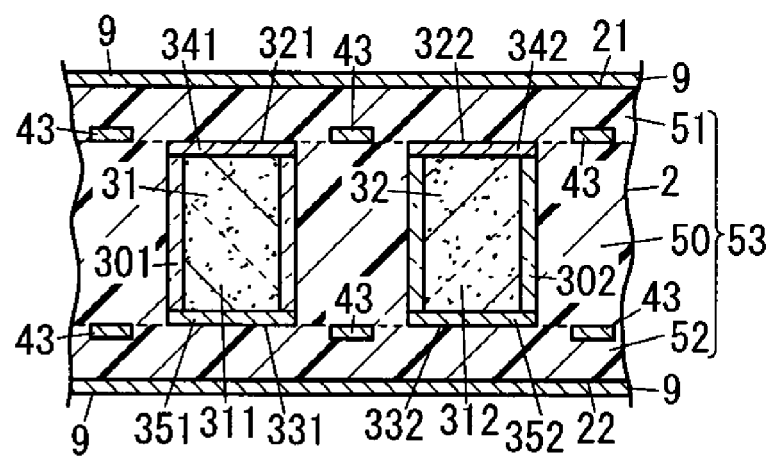
Figure 19E:
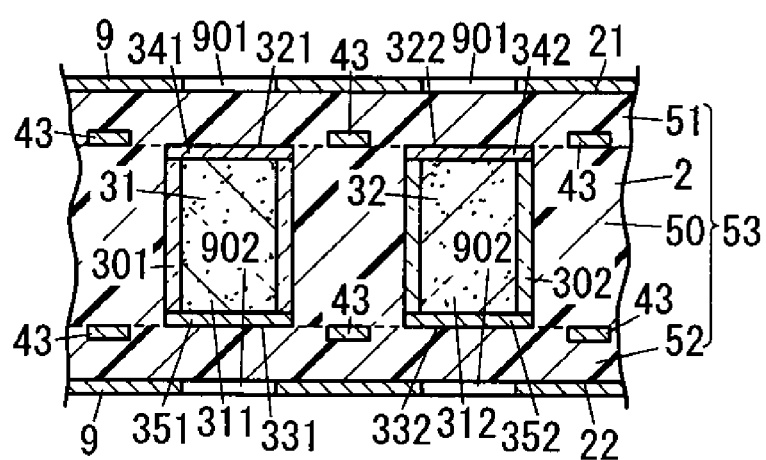
Figure 20A:
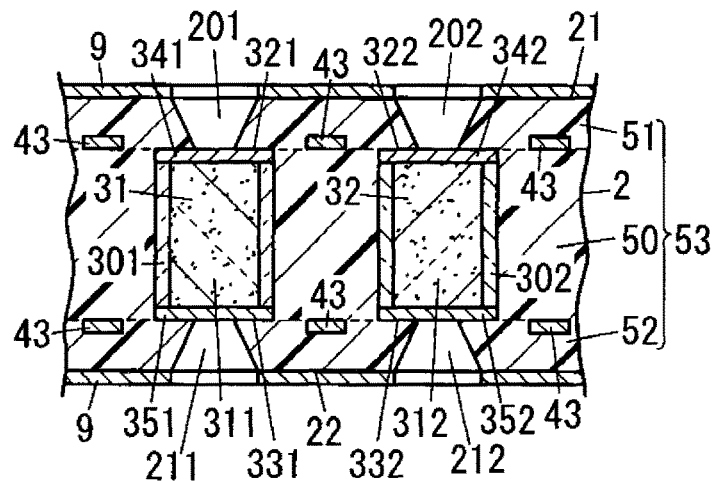
FIGS. 20A to 20C are schematic sectional views illustrating an example of the (third) method for producing the thermoelectric conversion substrate, which follow FIG. 19E.
Figure 20B:
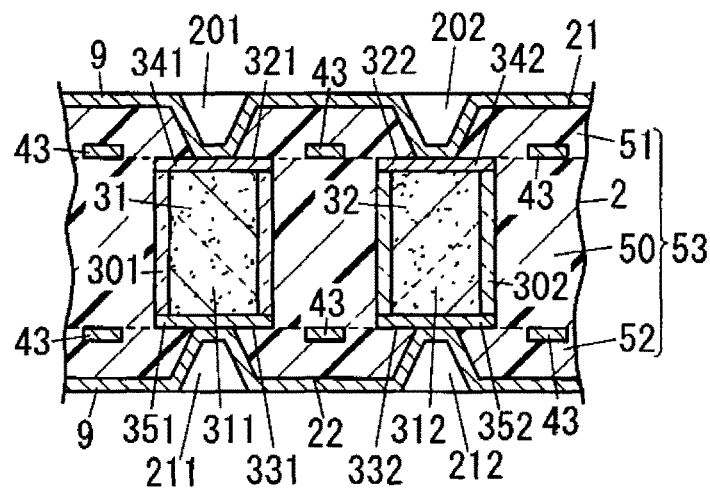
Figure 20C:
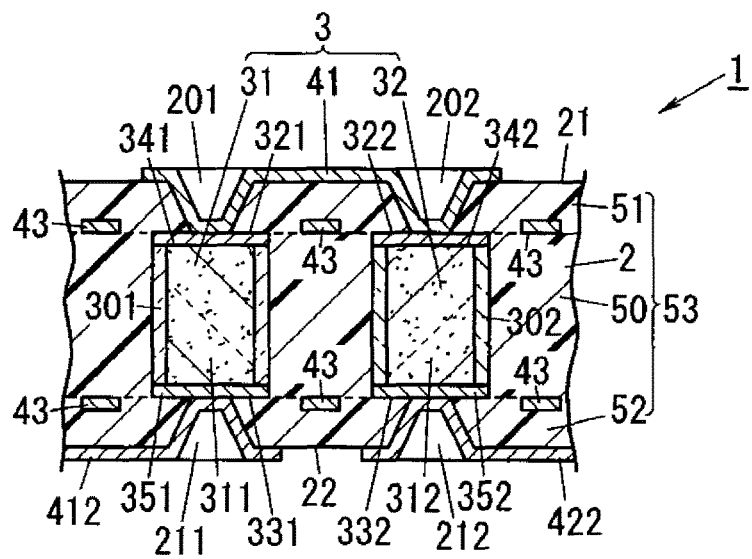
Figure 21A:
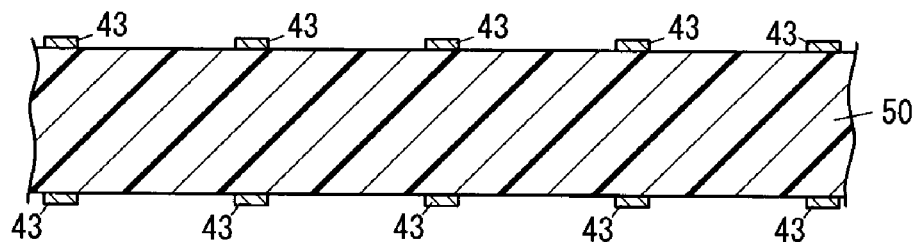
FIGS. 21A to 21E are schematic sectional views illustrating another example of the (third) method for producing the thermoelectric conversion substrate according to the exemplary embodiment of the present disclosure.
Figure 21B:
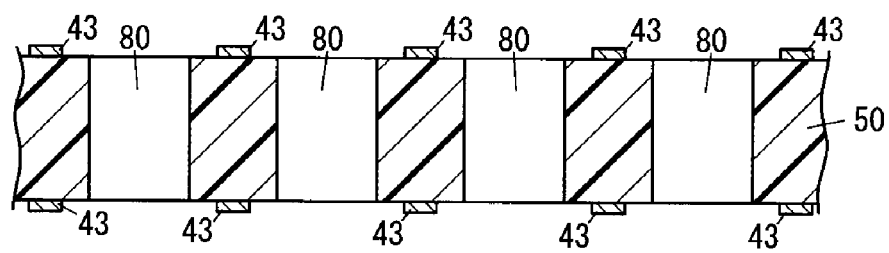
Figure 21C:
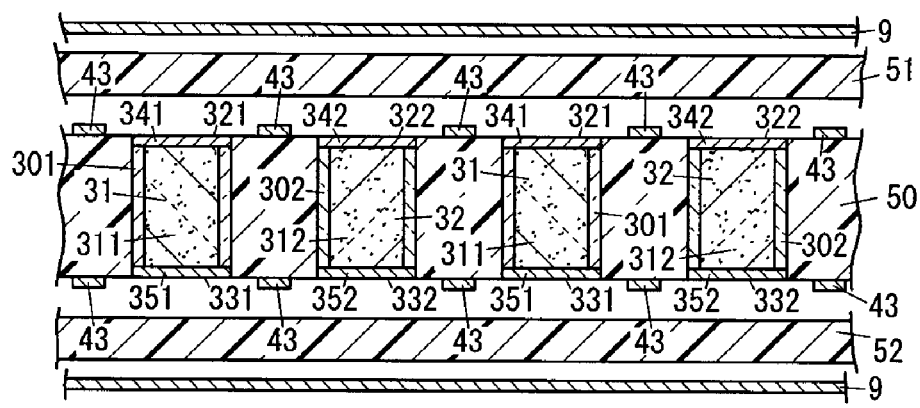
Figure 21D:
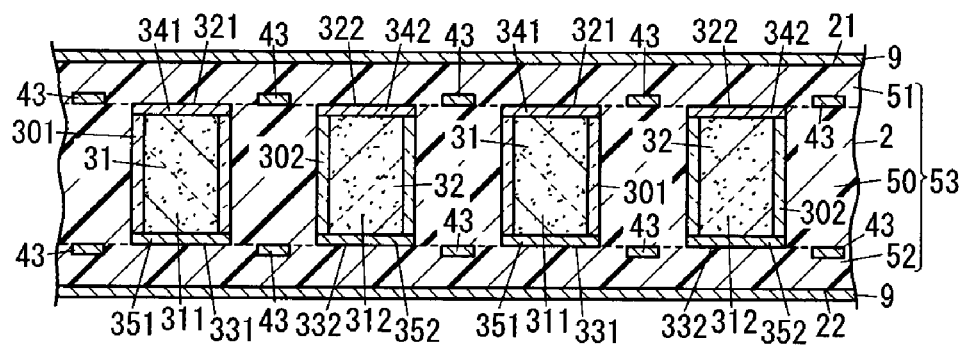
Figure 21E:
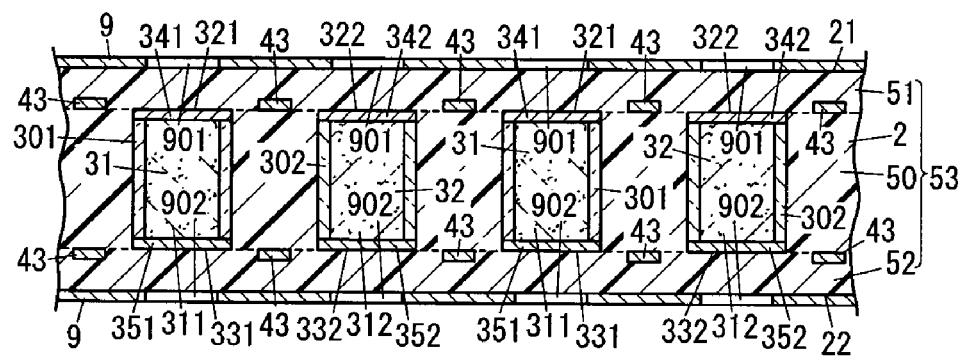
Figure 22A:
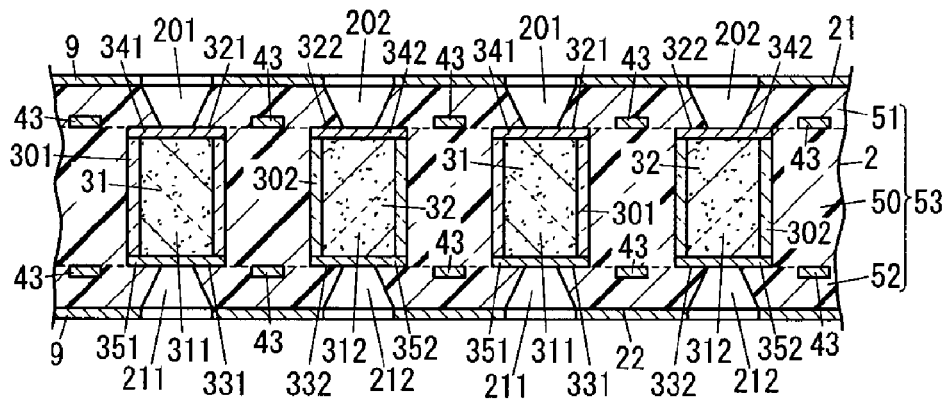
FIGS. 22A to 22C are schematic sectional views illustrating another example of the (third) method for producing the thermoelectric conversion substrate, which follow FIG. 21E.
Figure 22B:
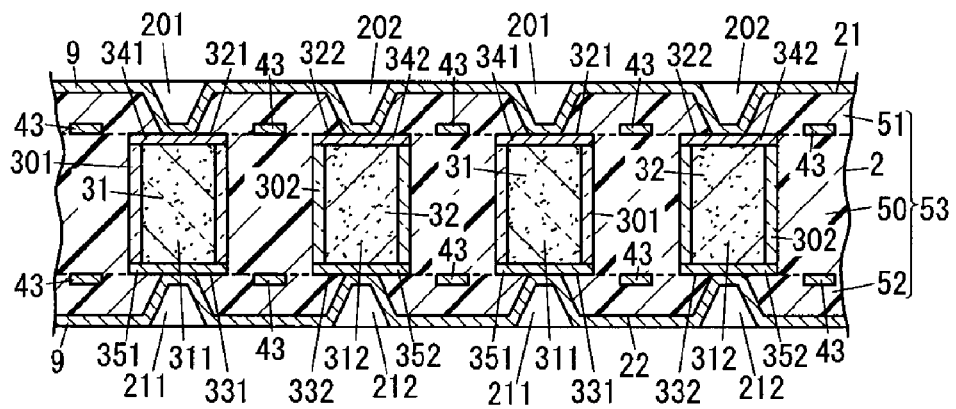
Figure 22C:
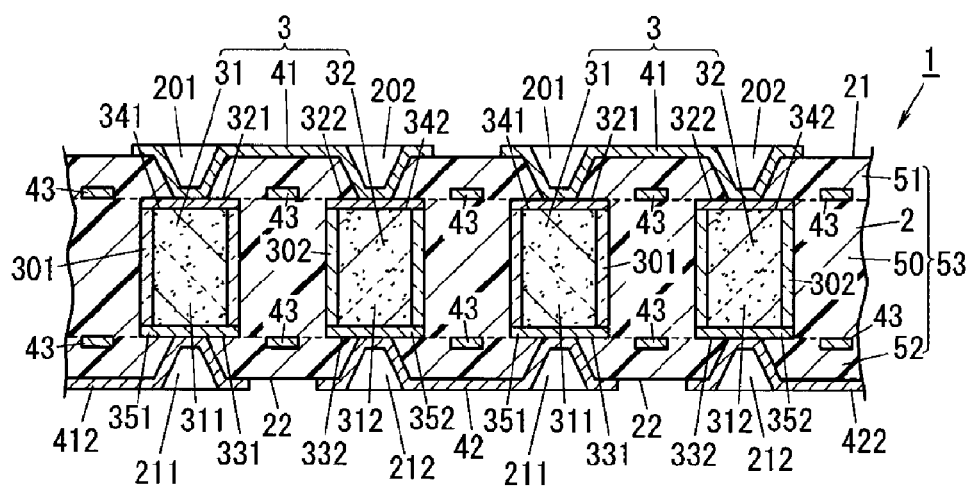

In step I1-2, as shown in FIG. 18C, metal foil 9 on second surface 22 of insulating substrate 2 is partially removed to form second electrode 42. Second electrode 42 electrically connects first thermoelectric member 31 to second thermoelectric member 32, which differ from first thermoelectric member 31 and second thermoelectric member 32 which are electrically connected to each other by first electrode 41. Details of this step are almost the same as details of step I1.

[(Third) Method for Producing Thermoelectric Conversion Substrate]

FIGS. 19A to 19E and FIGS. 20A to 20C show an example of the method for producing thermoelectric conversion substrate 1 incorporating wiring layers 43 shown in FIG. 4A. The step shown in FIG. 15A is the same as the steps shown in FIGS. 15A to 15E and FIGS. 16A to 16C except that cured core insulating layer 50 having surfaces provided with wiring layers 43 is used in place of cured core insulating layer 50.

Figure 4B:
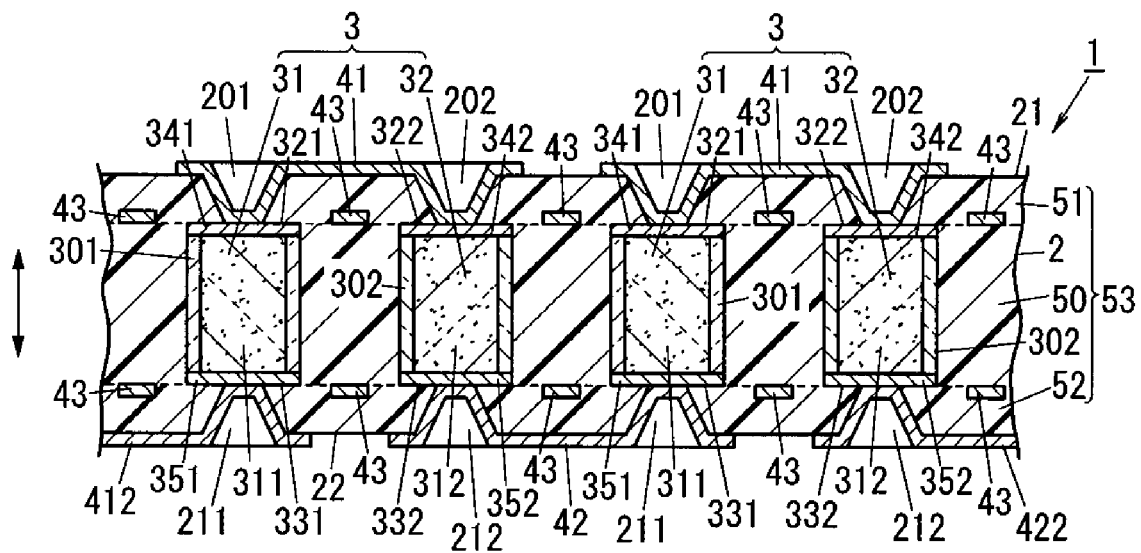
FIG. 4B is a schematic sectional view illustrating another example of the (first) thermoelectric conversion substrate.
Figure 17A:
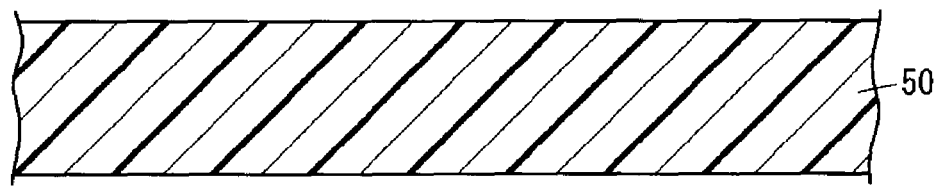
FIGS. 17A to 17E are schematic sectional views illustrating another example of the (second) method for producing the thermoelectric conversion substrate according to the exemplary embodiment of the present disclosure.
Figure 17B:
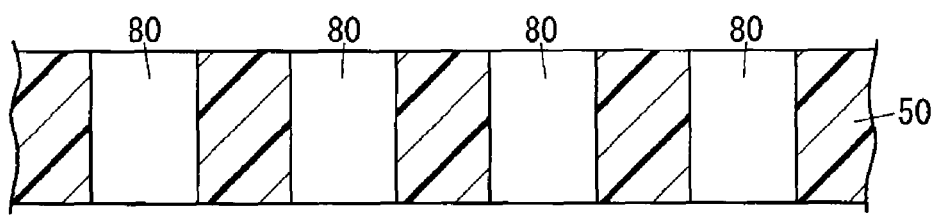
Figure 17C:
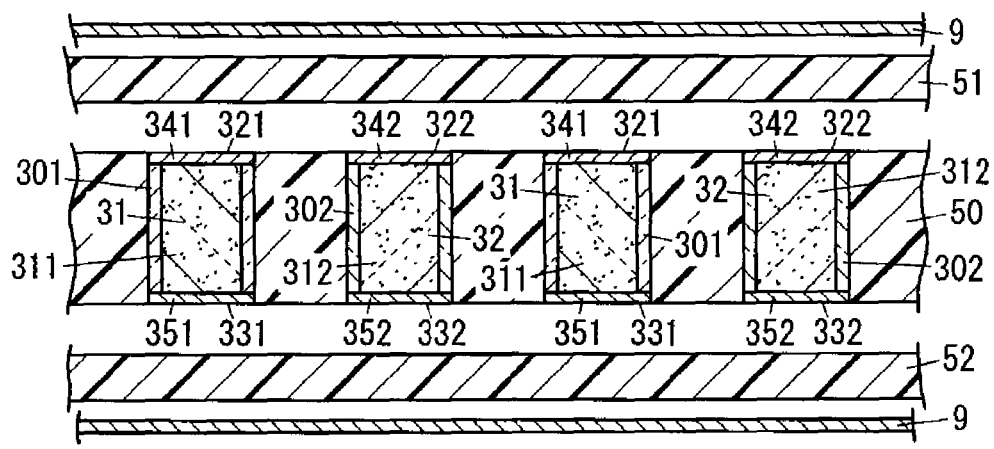
Figure 17D:
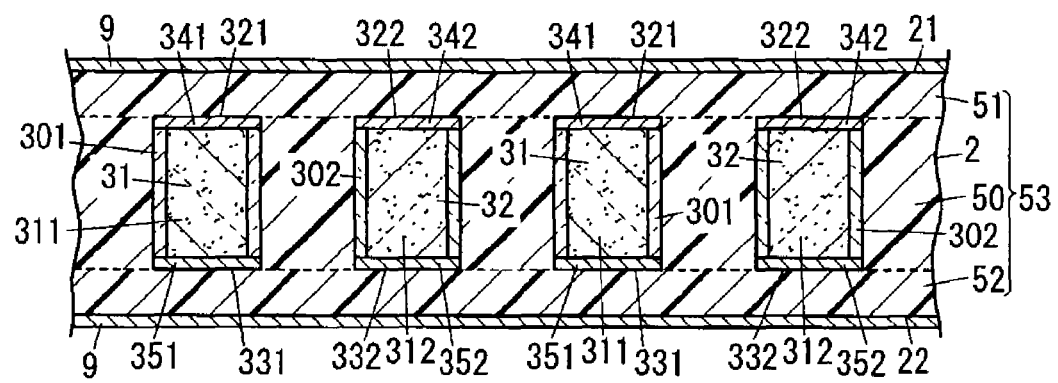
Figure 17E:
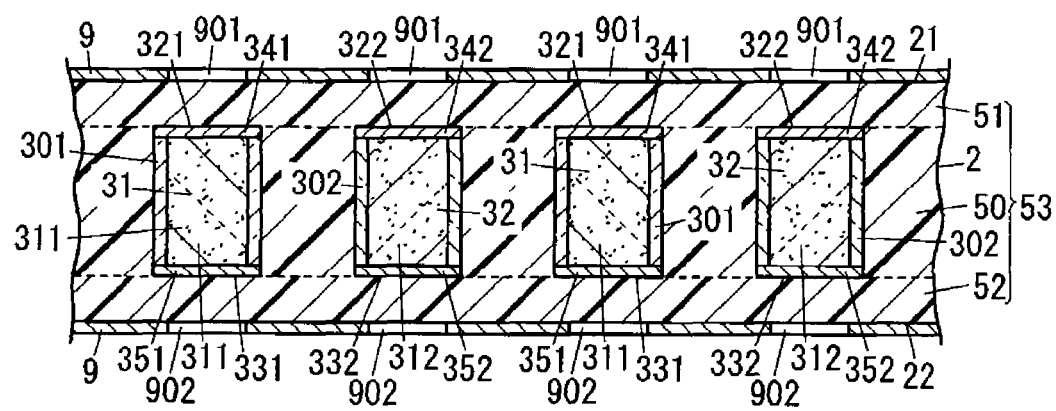

FIGS. 21A to 21E and FIGS. 22A to 22C show an example of the method for producing thermoelectric conversion substrate 1 incorporating wiring layers 43 shown in FIG. 4B. The step shown in FIG. 17A is the same as the steps shown in FIGS. 17A to 17E and FIGS. 18A to 18C except that cured core insulating layer 50 having surfaces provided with wiring layers 43 is used in place of cured core insulating layer 50. Cured core insulating layer 50 having surfaces provided with wiring layers 43 can be obtained by, for example, patterning a multilayer metal-clad plate using a subtractive method or patterning an unclad plate using an additive method.

In the above production method as well, a thermal conductivity of each of first insulating layer 51 and second insulating layer 52 may be set to be higher than a thermal conductivity of core insulating layer 50.

[(Fourth) Method For Producing Thermoelectric Conversion Substrate]

The method for producing thermoelectric conversion substrate 1 includes following steps shown in FIGS. 23A to 23E and FIGS. 24A to 24C. This thermoelectric conversion substrate 1 is an example including one thermoelectric conversion unit 3. FIGS. 25A to 25E and FIGS. 26A to 26C show an example including a plurality of thermoelectric conversion units 3. FIGS. 25A to 25E and FIGS. 26A to 26C respectively correspond to FIGS. 23A to 23E and FIGS. 24A to 24C, and hence the respective steps will be sequentially described mainly with reference to FIGS. 23A to 23E and FIGS. 24A to 24C.

(Step A2)

Figure 23A:
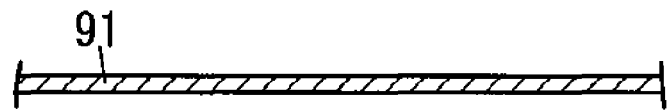
FIGS. 23A to 23E are schematic sectional views illustrating an example of a (fourth) method for producing the thermoelectric conversion substrate according to the exemplary embodiment of the present disclosure.

In step A2, as shown in FIG. 23A, first metal foil 91 is prepared. A specific example of first metal foil 91 is a copper foil.

(Step B2)

In step B2, first of all, as in step C1, first thermoelectric member 31 and second thermoelectric member 32 are prepared.

Functions of first thermoelectric member 31 and second thermoelectric member 32 can be directly inspected. In order to suppress variations in inspection, barrier films are preferably formed on both ends of first thermoelectric member 31 and second thermoelectric member 32, respectively. Performing function inspection can sort first thermoelectric members 31 and second thermoelectric members 32 into non-defective products and defective products. Only first thermoelectric member 31 and second thermoelectric member 32 determined as non-defective products are selected and used for production of thermoelectric conversion substrate 1. Since first thermoelectric member 31 and second thermoelectric member 32 can be used after inspection of each function, quality stability of thermoelectric conversion substrate 1 can be improved. This can reduce the possibility that a malfunction is found after production of thermoelectric conversion substrate 1.

Figure 23B:
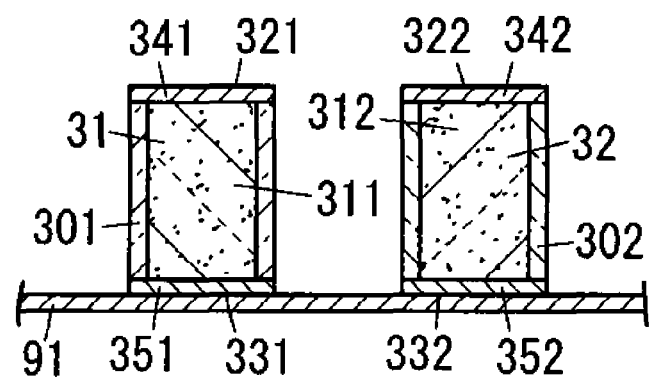

In step B2, as shown in FIG. 23B, at least one first thermoelectric member 31 and at least one second thermoelectric member 32 are soldered to first metal foil 91. Distal end face 331 of first thermoelectric member 31 and distal end face 332 of second thermoelectric member 32 are brought into contact with and soldered to one surface of first metal foil 91.

(Step C2)

In step C2, semi-cured core substrate 8 is prepared. A specific example of semi-cured core substrate 8 is a prepreg. Core substrate 8 has opening portion 800. When core substrate 8 is viewed from the thickness direction, opening portion 800 is formed to have a size large enough to accommodate all first thermoelectric members 31 and second thermoelectric members 32. A thickness of core substrate 8 is preferably greater than a length of each of first thermoelectric member 31 and second thermoelectric member 32.

Figure 23C:
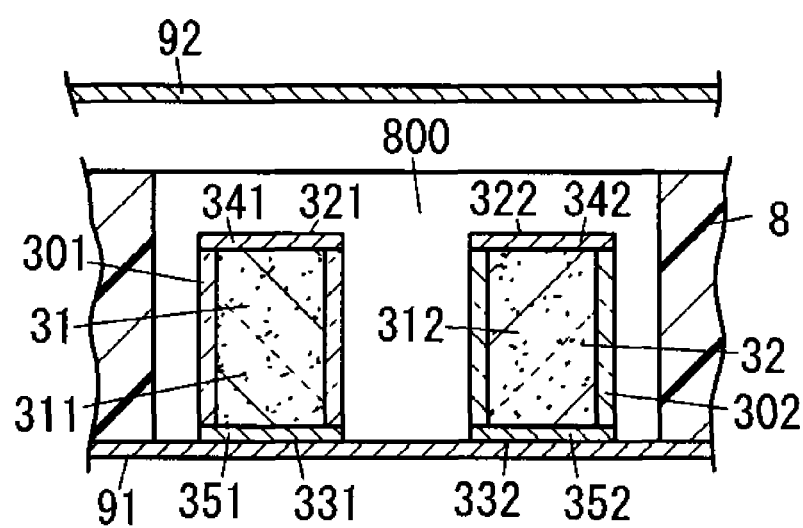

In step C2, as shown in FIG. 23C, core substrate 8 is stacked on first metal foil 91 so as to accommodate first thermoelectric member 31 and second thermoelectric member 32 in opening portion 800. If the thickness of core substrate 8 is greater than the length of each of first thermoelectric member 31 and second thermoelectric member 32, the surface of core substrate 8 is located at a position higher than distal end face 321 of first thermoelectric member 31 and distal end face 322 of second thermoelectric member 32.

(Step D2)

Figure 23D:
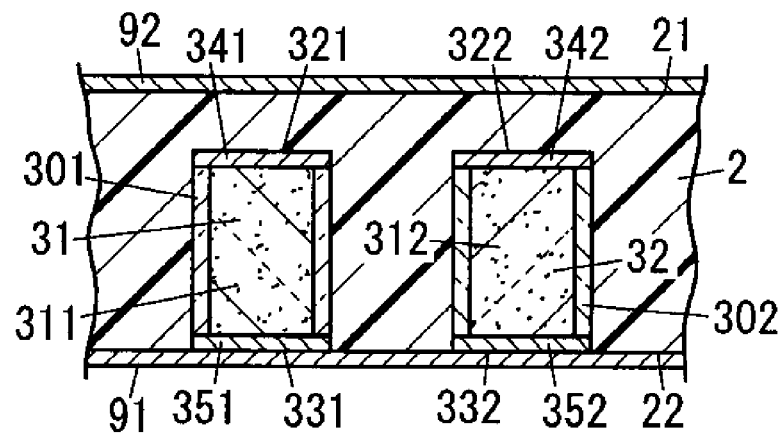

In step D2, as shown in FIG. 23D, second metal foil 92 is stacked on core substrate 8 and then hot-pressed so as to close opening portion 800, thereby forming insulating substrate 2 from cured product of core substrate 8. A specific example of second metal foil 92 is a copper foil. At the time of hot pressing, a resin forming core substrate 8 partially flows into opening portion 800 to fill opening portion 800, thereby forming flat first surface 21 and second surface 22 of insulating substrate 2. Conditions for hot pressing are not specifically limited.

(Step E2)

Figure 23E:
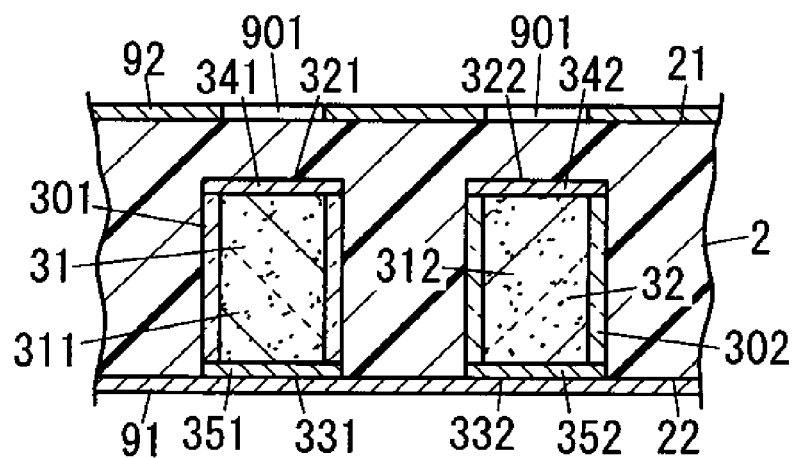

In step E2, as shown in FIG. 23E, portions of second metal foil 92 at a position corresponding to each of locations of first thermoelectric member 31 and second thermoelectric member 32 are removed. That is, the portion of second metal foil 92 to be removed is a portion at which first thermoelectric member 31 or second thermoelectric member 32 exists immediately below when second metal foil 92 is viewed from the thickness direction. From this, recess portion 901 having first surface 21 as a bottom surface is formed. Each of removal areas of second metal foil 92 is preferably smaller than an area of a corresponding one of distal end faces 321 and 322 of first thermoelectric member 31 and second thermoelectric member 32. That is, an area of recess portion 901 of first surface 21 is preferably smaller than an area of each of distal end faces 321 and 322 of first thermoelectric member 31 and second thermoelectric member 32. Second metal foil 92 can be removed by, for example, etching.

(Step F2)

Figure 24A:
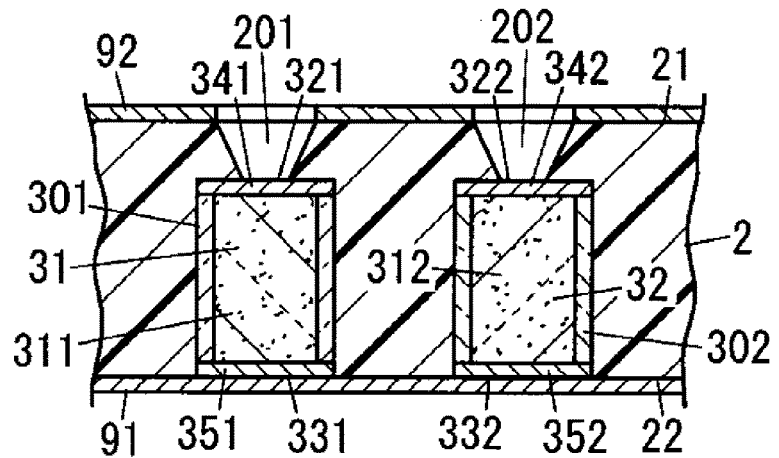
FIGS. 24A to 24C are schematic sectional views illustrating an example of the (fourth) method for producing the thermoelectric conversion substrate, which follow FIG. 23E.

In step F2, as shown in FIG. 24A, portions of insulating substrate 2 at which second metal foil 92 has been removed are removed to expose distal end face 321 of first thermoelectric member 31 and distal end face 322 of second thermoelectric member 32. Removing the above portions of insulating substrate 2 can form first opening portion 201 and second opening portion 202 in first surface 21 of insulating substrate 2. Insulating substrate 2 can be removed by, for example, irradiation with a $CO_2$ laser (carbon dioxide laser).

(Step G2)

Figure 24B:
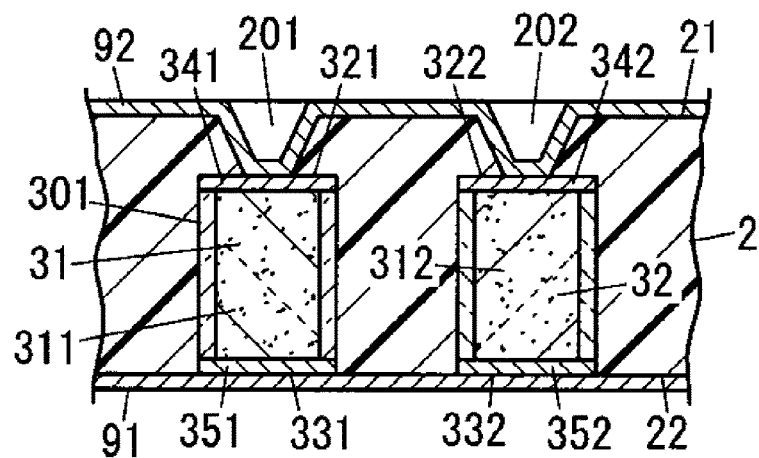

In step G2, as shown in FIG. 24B, plating is provided, ranging from distal end face 321 of first thermoelectric member 31 and distal end face 322 of second thermoelectric member 32 to second metal foil 92. In this case, first opening portion 201 and second opening portion 202 may be filled with plating to form filled vias.

(Step H2)

Figure 24C:
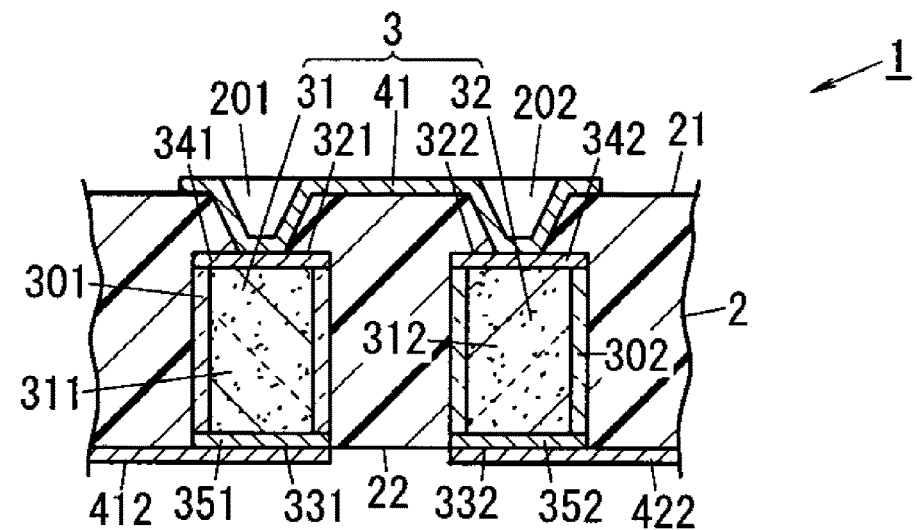
Figure 25A:
FIGS. 25A to 25E are schematic sectional views illustrating another example of the (fourth) method for producing the thermoelectric conversion substrate according to the exemplary embodiment of the present disclosure.
Figure 25B:
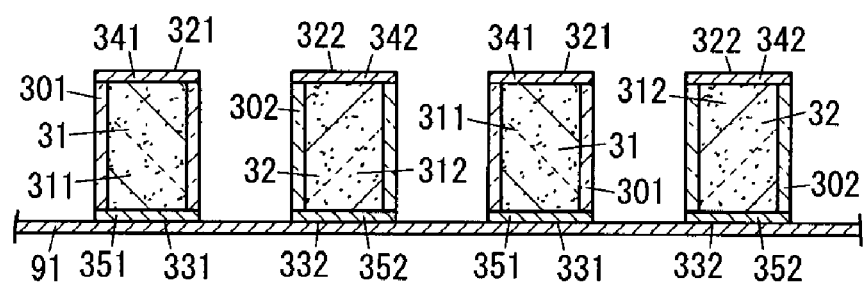
Figure 25C:
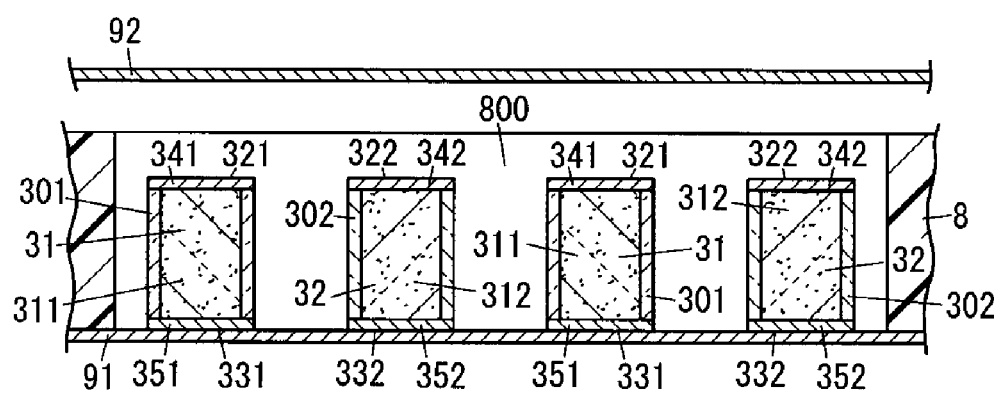
Figure 25D:
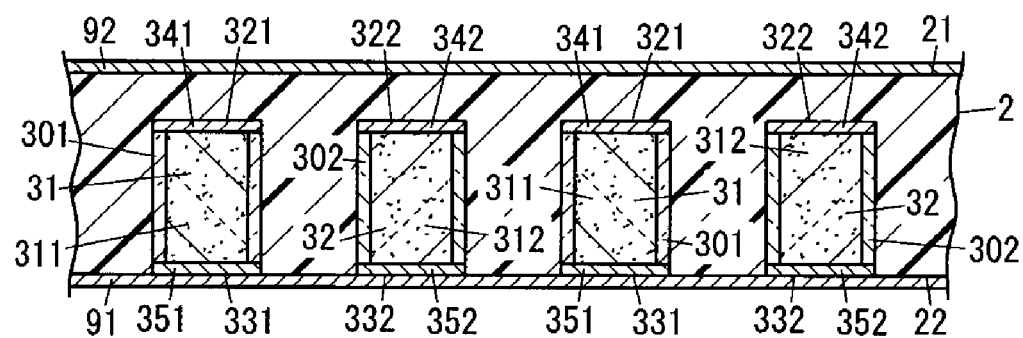
Figure 25E:
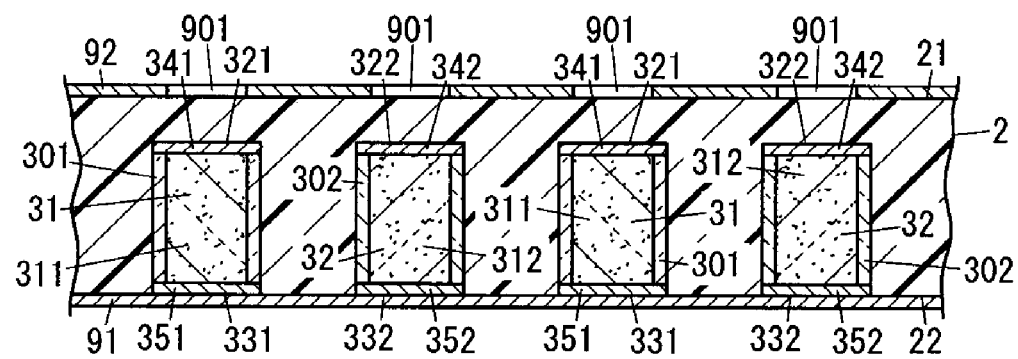

In step H2, as shown in FIG. 24C, second metal foil 92 on first surface 21 of insulating substrate 2 is partially removed to form first electrode 41 that electrically connects first thermoelectric member 31 to second thermoelectric member 32. In this case, first metal foil 91 on second surface 22 of insulating substrate 2 may be partially removed to form second electrodes 412 and 422 for power supply connection. In this manner, thermoelectric conversion substrate 1 shown in FIG. 5A can be produced.

The method for producing thermoelectric conversion substrate 1 including a plurality of thermoelectric conversion units 3 further includes following steps.

(Step I2)

Figure 26A:
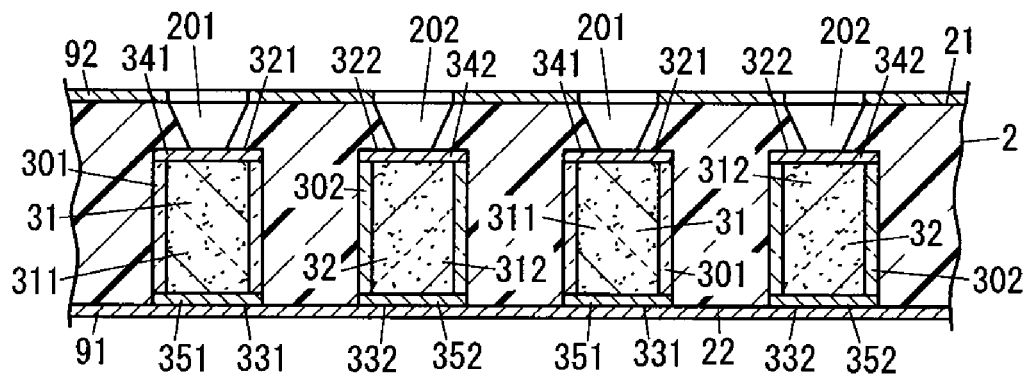
FIGS. 26A to 26C are schematic sectional views illustrating another example of the (fourth) method for producing the thermoelectric conversion substrate, which follow FIG. 25E.
Figure 26B:
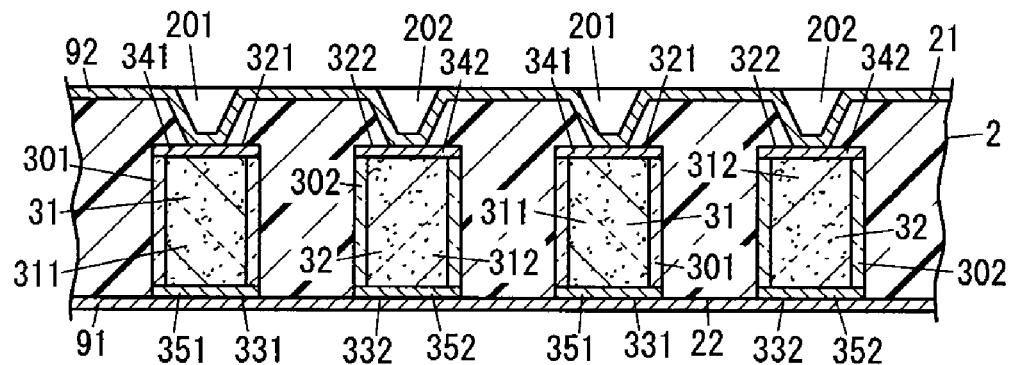
Figure 26C:
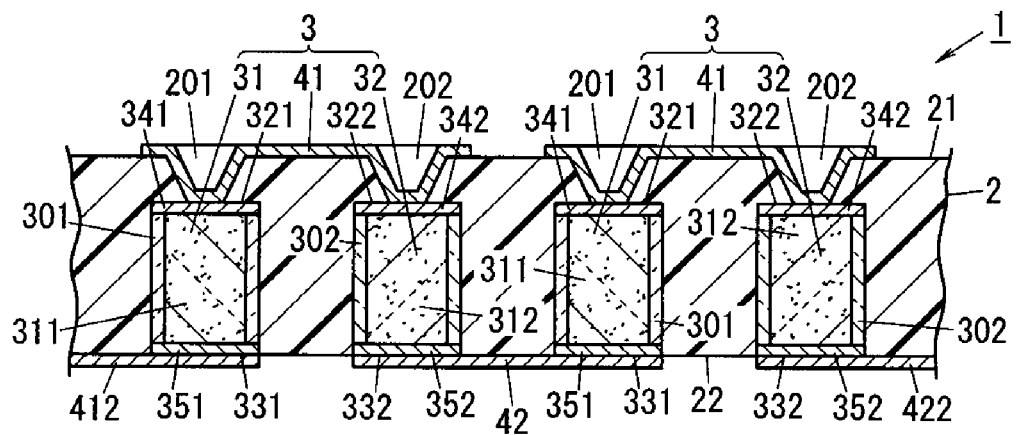

In step I2, as shown in FIG. 26C, first metal foil 91 on second surface 22 of insulating substrate 2 is partially removed to form second electrode 42 that electrically connects first thermoelectric member 31 to second thermoelectric member 32, which differ from first thermoelectric member 31 and second thermoelectric member 32 which are electrically connected by first electrode 41. That is, second electrode 42 electrically connects first semiconductor 311 of first thermoelectric member 31 of one thermoelectric conversion unit 3 (thermoelectric conversion unit 3 on the right side in FIG. 26C) to second semiconductor 312 of second thermoelectric member 32 of another thermoelectric conversion unit 3 (thermoelectric conversion unit 3 on the left side in FIG. 26C). In this manner, thermoelectric conversion substrate 1 shown in FIG. 5B can be produced.

[(Fifth) Method for Producing Thermoelectric Conversion Substrate]

A method for producing thermoelectric conversion substrate 1 includes following steps shown in FIGS. 27A to 27E and FIGS. 28A to 28C. Thermoelectric conversion substrate 1 is an example including one thermoelectric conversion unit 3. FIGS. 29A to 29E and FIG. 30A to 30C show an example including a plurality of thermoelectric conversion units 3. FIGS. 29A to 29E and FIGS. 30A to 30C respectively correspond to FIGS. 27A to 27E and FIGS. 28A to 28C, and hence the respective steps will be sequentially described mainly with reference to FIGS. 27A to 27E and FIGS. 28A to 28C.

(Step A2-2)

Figure 27A:
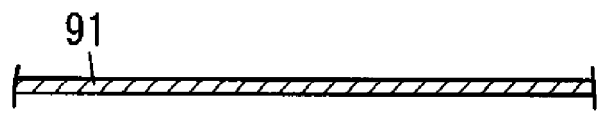
FIGS. 27A to 27E are schematic sectional views illustrating an example of a (fifth) method for producing the thermoelectric conversion substrate according to the exemplary embodiment of the present disclosure.

In step A2-2, as shown in FIG. 27A, first metal foil 91 is prepared. A specific example of first metal foil 91 is a copper foil.

(Step B2-2)

In step B2-2, first of all, as in step C1, first thermoelectric member 31 and second thermoelectric member 32 are prepared.

Functions of first thermoelectric member 31 and second thermoelectric member 32 can be directly inspected. In order to suppress variations in inspection, barrier films are preferably formed on both ends of first thermoelectric member 31 and second thermoelectric member 32, respectively. Performing function inspection can sort first thermoelectric members 31 and second thermoelectric members 32 into non-defective products and defective products. Only first thermoelectric member 31 and second thermoelectric member 32 determined as non-defective products are selected and used for production of thermoelectric conversion substrate 1. Since first thermoelectric member 31 and second thermoelectric member 32 can be used after inspection of each function, quality stability of thermoelectric conversion substrate 1 can be improved. This can reduce the possibility that a malfunction is found after production of thermoelectric conversion substrate 1.

Figure 27B:
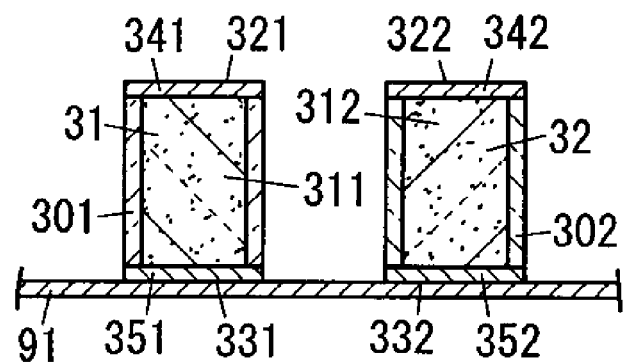

In step B2-2, as shown in FIG. 27B, at least one first thermoelectric member 31 and at least one second thermoelectric member 32 are soldered to first metal foil 91. Distal end face 331 of first thermoelectric member 31 and distal end face 332 of second thermoelectric member 32 are brought into contact with and soldered to one surface of first metal foil 91.

(Step C2-2)

In step C2-2, cured core insulating layer 50 is prepared. A specific example of core insulating layer 50 is a cured prepreg. Core insulating layer 50 has opening portion 800. When core insulating layer 50 is viewed from the thickness direction, opening portion 800 is formed to have a size large enough to accommodate all first thermoelectric members 31 and second thermoelectric members 32.

Figure 27C:
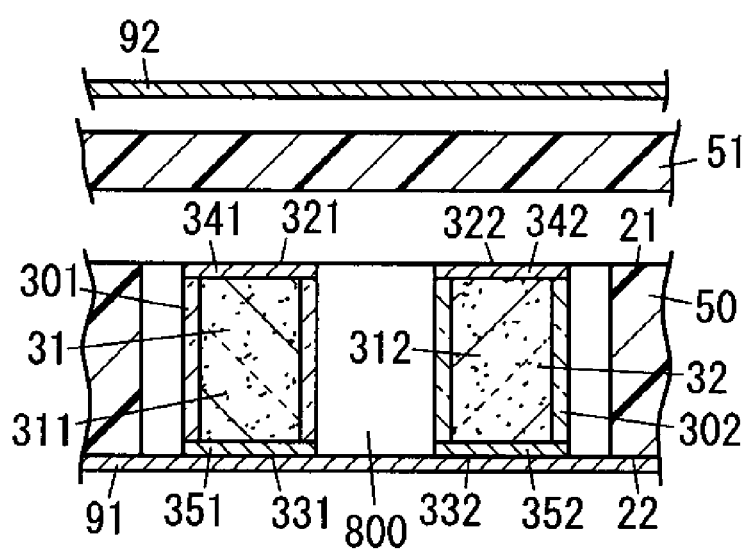

In step C2-2, as shown in FIG. 27C, core insulating layer 50 is stacked on first metal foil 91 so as to accommodate first thermoelectric member 31 and second thermoelectric member 32 in opening portion 800.

(Step D2-2)

Figure 27D:
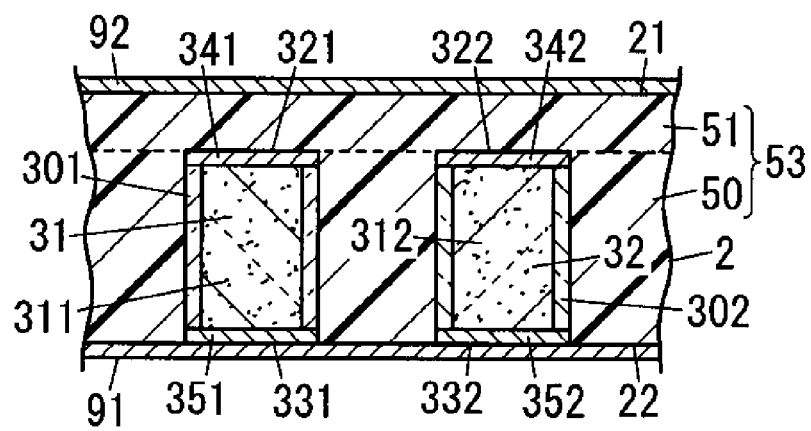

In step D2-2, as shown in FIG. 27C, second metal foil 92 is stacked on core insulating layer 50 via semi-cured first insulating layer 51 and then hot-pressed so as to close opening portion 800, thereby forming insulating substrate 2 like that shown in FIG. 27D. A specific example of semi-cured first insulating layer 51 is a prepreg. Insulating substrate 2 is formed from multilayer structure 53 constituted by core insulating layer 50 and cured first insulating layer 51. At the time of hot pressing, a resin forming first insulating layer 51 partially flows into opening portion 800 to fill opening portion 800, thereby forming flat first surface 21 and second surface 22 of insulating substrate 2. Conditions for hot pressing are not specifically limited.

(Step E2-2)

Figure 27E:
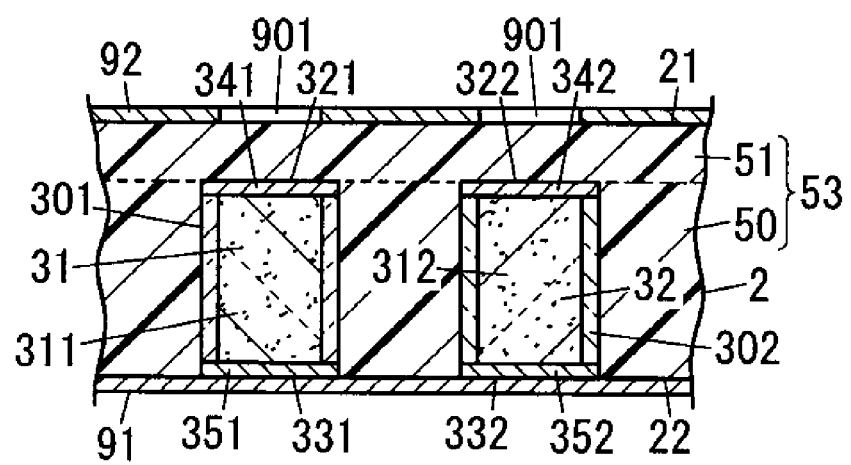

In step E2-2, as shown in FIG. 27E, portions of second metal foil 92 at a position corresponding to each of locations of first thermoelectric member 31 and second thermoelectric member 32 are removed. Details of this step are almost the same as details of step E2.

(Step F2-2)

Figure 28A:
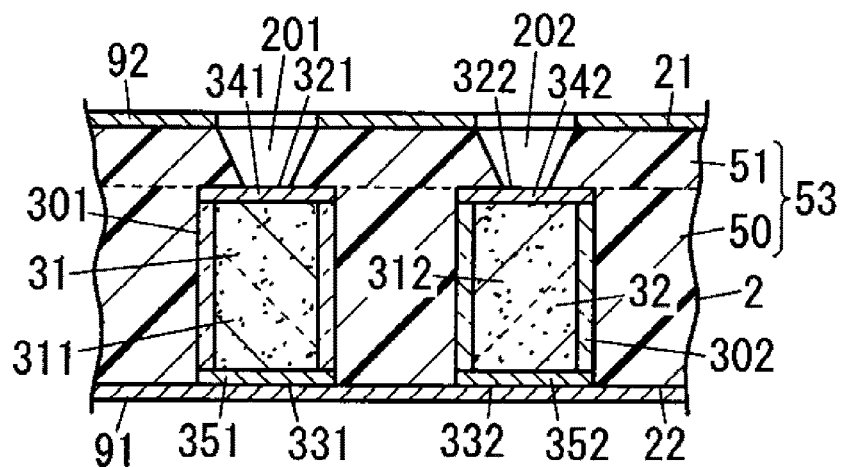
FIGS. 28A to 28C are schematic sectional views illustrating an example of the (fifth) method for producing the thermoelectric conversion substrate, which follow FIG. 27E.

In step F2-2, as shown in FIG. 28A, portions of insulating substrate 2 at which second metal foil 92 has been removed are removed to expose distal end face 321 of first thermoelectric member 31 and distal end face 322 of second thermoelectric member 32. Details of this step are almost the same as details of step F2.

(Step G2-2)

Figure 28B:
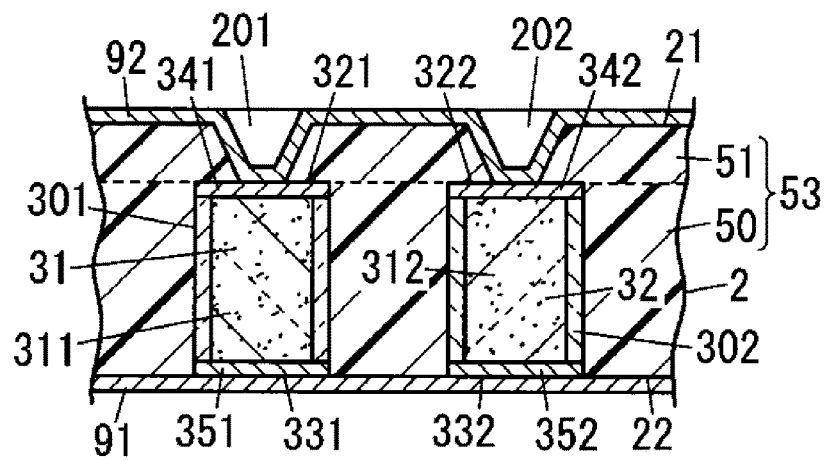

In step G2-2, as shown in FIG. 28B, plating is provided, ranging from distal end face 321 of first thermoelectric member 31 and distal end face 322 of second thermoelectric member 32 to second metal foil 92. Details of this step are almost the same as details of step G1.

(Step H2-2)

Figure 28C:
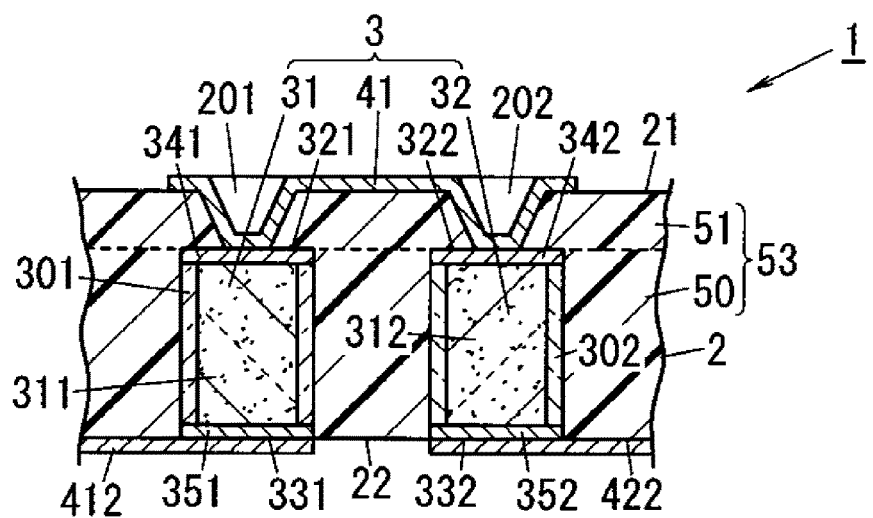
Figure 29A:
FIGS. 29A to 29E are schematic sectional views illustrating an example of the (fifth) method for producing the thermoelectric conversion substrate according to the exemplary embodiment of the present disclosure.
Figure 29B:
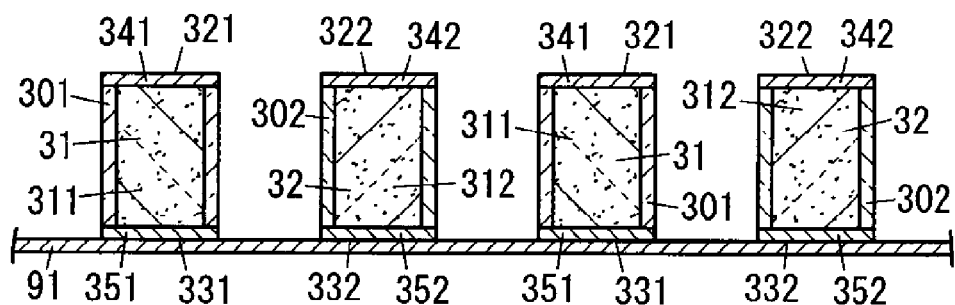
Figure 29C:
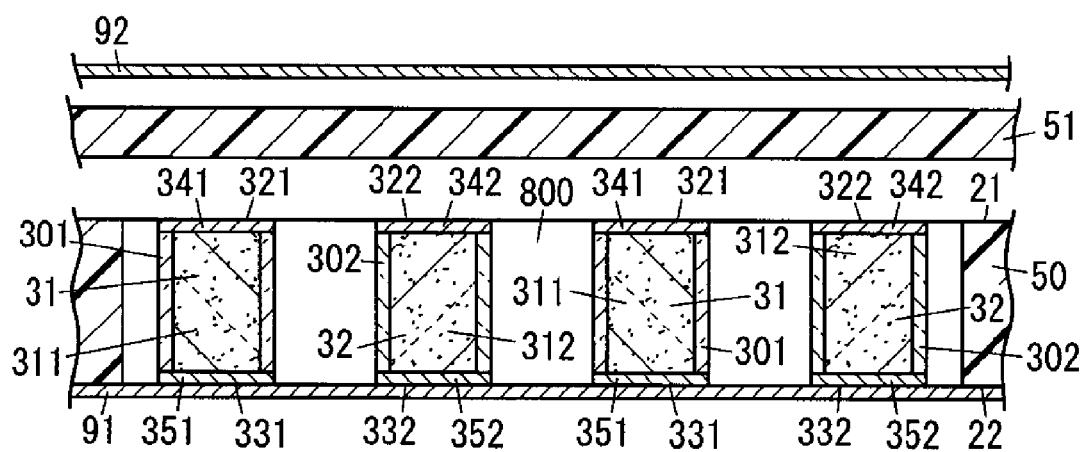
Figure 29D:
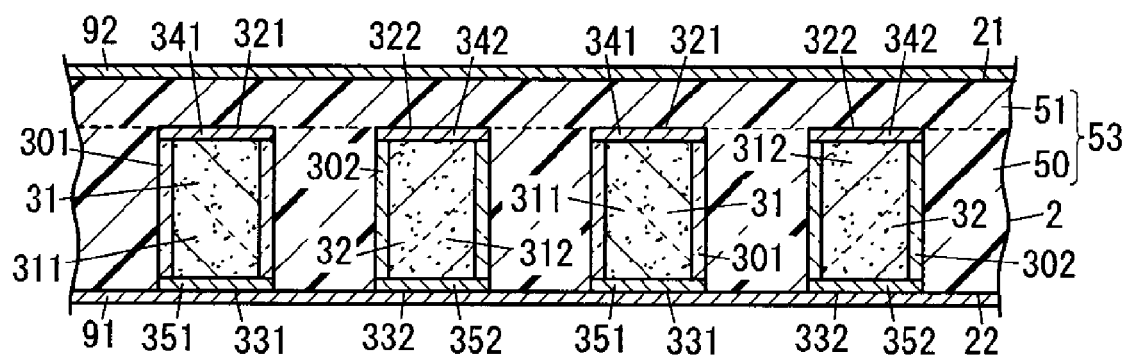
Figure 29E:
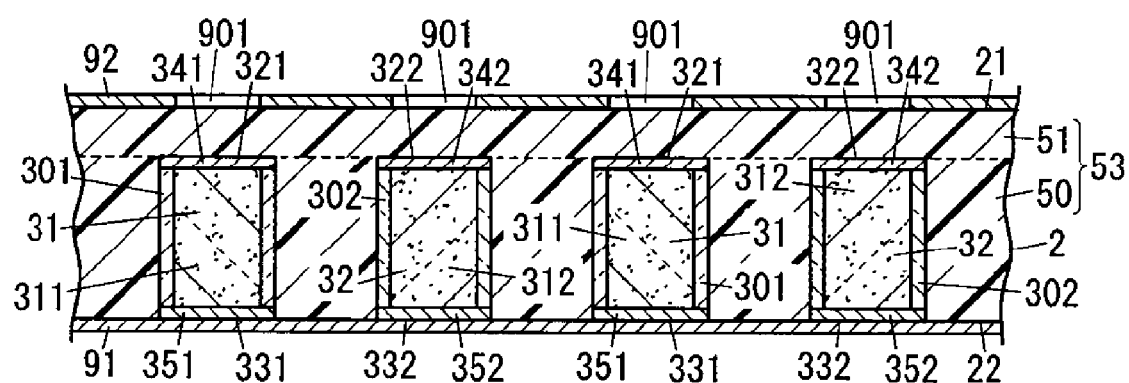

In step H2-2, as shown in FIG. 28C, second metal foil 92 on first surface 21 of insulating substrate 2 is partially removed to form first electrode 41 that electrically connects first thermoelectric member 31 to second thermoelectric member 32. Details of this step are almost the same as details of step H1.

The method for producing thermoelectric conversion substrate 1 including a plurality of thermoelectric conversion units 3 further includes following steps.

(Step I2-2)

Figure 30A:
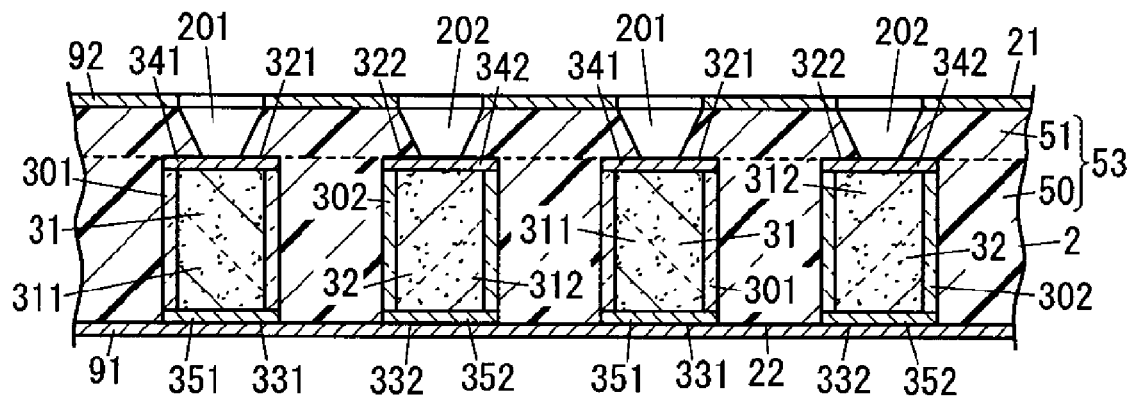
FIGS. 30A to 30C are schematic sectional views illustrating another example of the (fifth) method for producing the thermoelectric conversion substrate, which follow FIG. 29E.
Figure 30B:
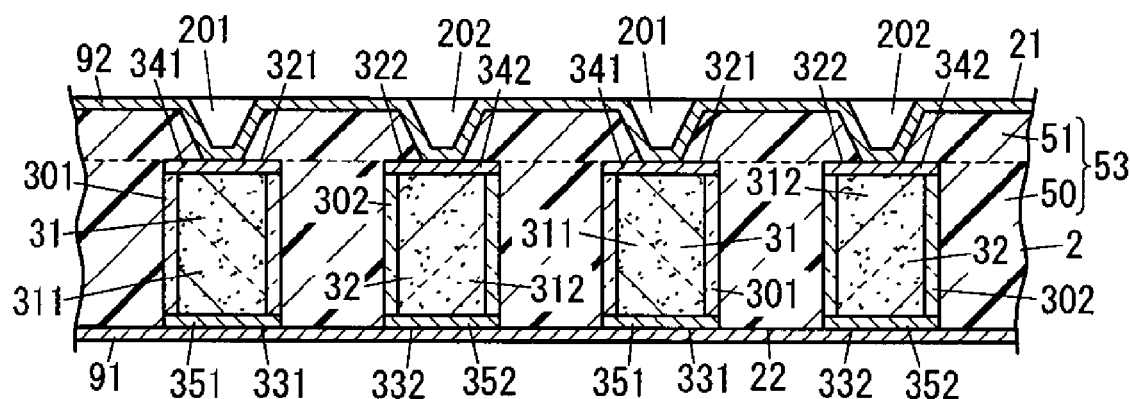
Figure 30C:
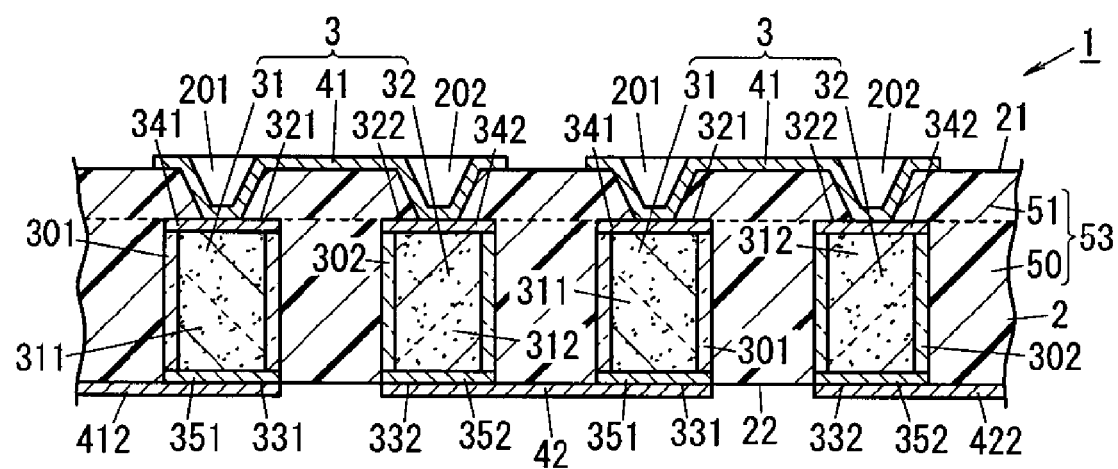

In step I2-2, as shown in FIG. 30C, first metal foil 91 on second surface 22 of insulating substrate 2 is partially removed to form second electrode 42 that electrically connects first thermoelectric member 31 to second thermoelectric member 32, which differ from first thermoelectric member 31 and second thermoelectric member 32 which are electrically connected by first electrode 41. Details of this step are almost the same as details of step I2.

[(Sixth) Method For Producing Thermoelectric Conversion Substrate]

The method for producing thermoelectric conversion substrate 1 includes following steps shown in FIGS. 31A to 31E and FIGS. 32A to 32C. The respective steps will be sequentially described below.

(Step A3)

Figure 31A:
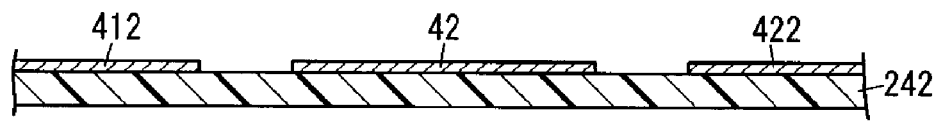
FIGS. 31A to 31E are schematic sectional views illustrating another example of a (sixth) method for producing the thermoelectric conversion substrate according to the exemplary embodiment of the present disclosure.

In step A3, as shown in FIG. 31A, base substrate 242 including at least one second electrode 42 is prepared. Base substrate 242 is a cured substrate. Second electrodes 412 and 422 for power supply connection are preferably provided on the same surface on which second electrode 42 of base substrate 242 is provided. Base substrate 242 can be obtained by, for example, patterning a multilayer metal-clad plate using a subtractive method or patterning an unclad plate using an additive method.

(Step B3)

In step B3, first of all, as in step C1, first thermoelectric member 31 and second thermoelectric member 32 are prepared.

Functions of first thermoelectric member 31 and second thermoelectric member 32 can be directly inspected. In order to suppress variations in inspection, barrier films are preferably formed on both ends of first thermoelectric member 31 and second thermoelectric member 32, respectively. Performing function inspection can sort first thermoelectric members 31 and second thermoelectric members 32 into non-defective products and defective products. Only first thermoelectric member 31 and second thermoelectric member 32 determined as non-defective products are selected and used for production of thermoelectric conversion substrate 1. Since first thermoelectric member 31 and second thermoelectric member 32 can be used after inspection of each function, quality stability of thermoelectric conversion substrate 1 can be improved. This can reduce the possibility that a malfunction is found after production of thermoelectric conversion substrate 1.

Figure 31B:
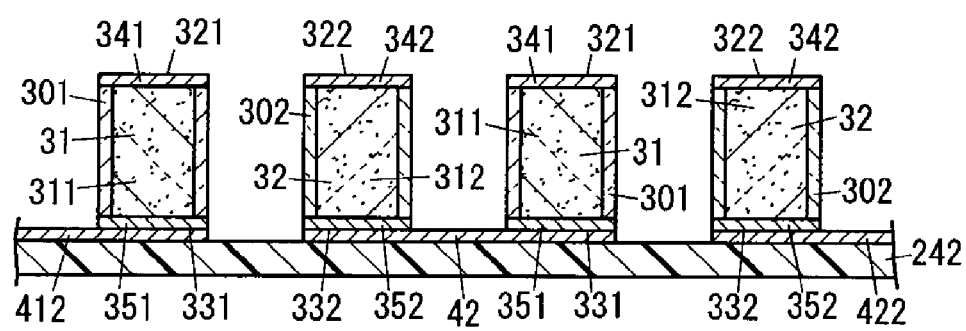

In step B3, as shown in FIG. 31B, one first thermoelectric member 31 and one second thermoelectric member 32 are soldered to second electrode 42. When second electrodes 412 and 422 are provided on base substrate 242, first thermoelectric member 31 is soldered to second electrode 412, and second thermoelectric member 32 is soldered to second electrode 422.

(Step C3)

Figure 31C:
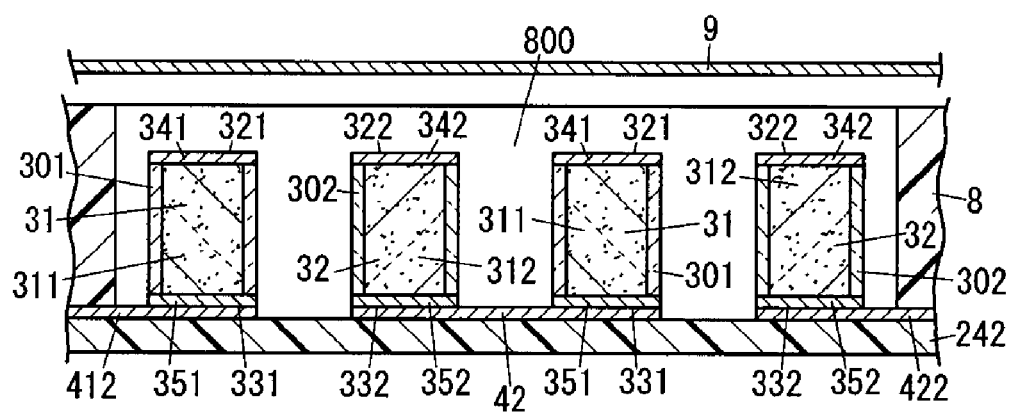

In step C3, as shown in FIG. 31C, semi-secured core substrate 8 having opening portion 800 is prepared, and core substrate 8 is stacked on base substrate 242 so as to accommodate first thermoelectric member 31 and second thermoelectric member 32 in opening portion 800. Details of this step are almost the same as details of step C2.

(Step D3)

Figure 31D:
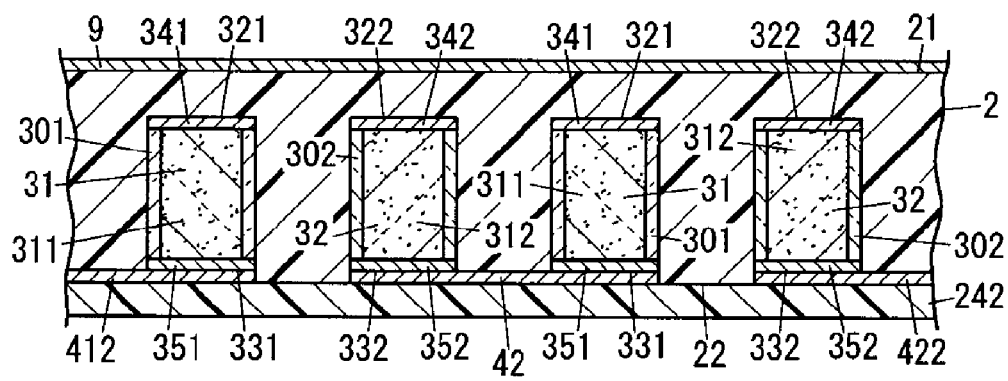

In step D3, as shown in FIG. 31D, metal foil 9 is stacked on core substrate 8 and then hot-pressed so as to close opening portion 800, thereby forming insulating substrate 2 from cured product of core substrate 8. At the time of hot pressing, a resin forming core substrate 8 partially flows into opening portion 800 so as to fill opening portion 800, thereby forming flat first surface 21 of insulating substrate 2. Second surface 22 is formed on the interface between insulating substrate 2 and base substrate 242. Conditions for hot pressing are not specifically limited.

(Step E3)

Figure 31E:
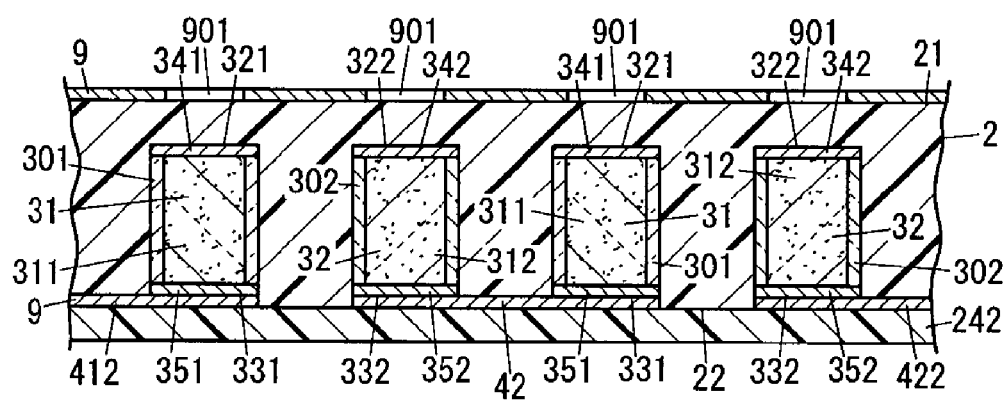

In step E3, as shown in FIG. 31E, portions of metal foil 9 at a position corresponding to each of locations of first thermoelectric member 31 and second thermoelectric member 32 are removed. Details of this step are almost the same as details of step E2.

(Step F3)

Figure 32A:
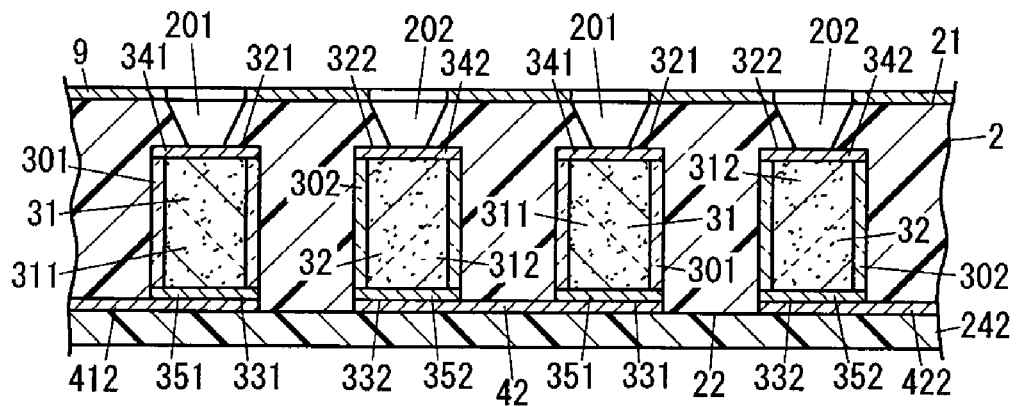
FIGS. 32A to 32C are schematic sectional views illustrating an example of the (sixth) method for producing the thermoelectric conversion substrate, which follow FIG. 31E.

In step F3, as shown in FIG. 32A, portions of insulating substrate 2 at which metal foil 9 has been removed are removed to expose distal end face 321 of first thermoelectric member 31 and distal end face 322 of second thermoelectric member 32. Details of this step are almost the same as details of step F2.

(Step G3)

Figure 32B:
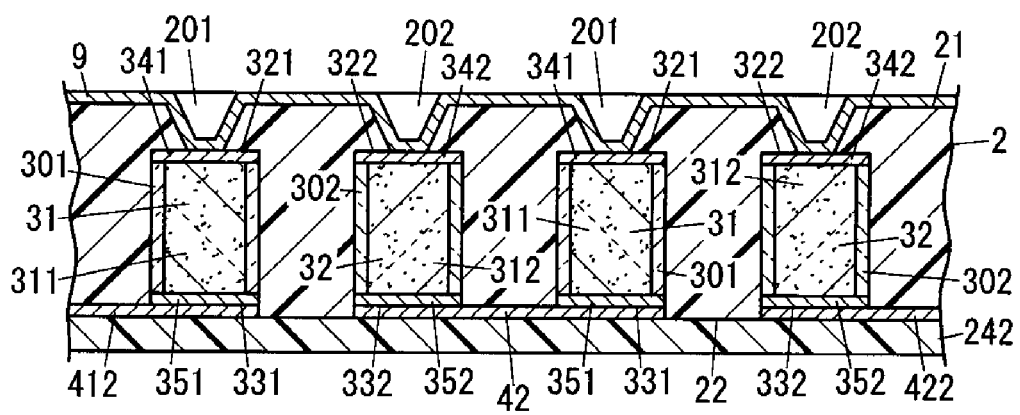

In step G3, as shown in FIG. 32B, plating is provided, ranging from distal end face 321 of first thermoelectric member 31 and distal end face 322 of second thermoelectric member 32 to metal foil 9. In this case, first opening portion 201 and second opening portion 202 may be filled with plating to form filled vias.

(Step H3)

Figure 32C:
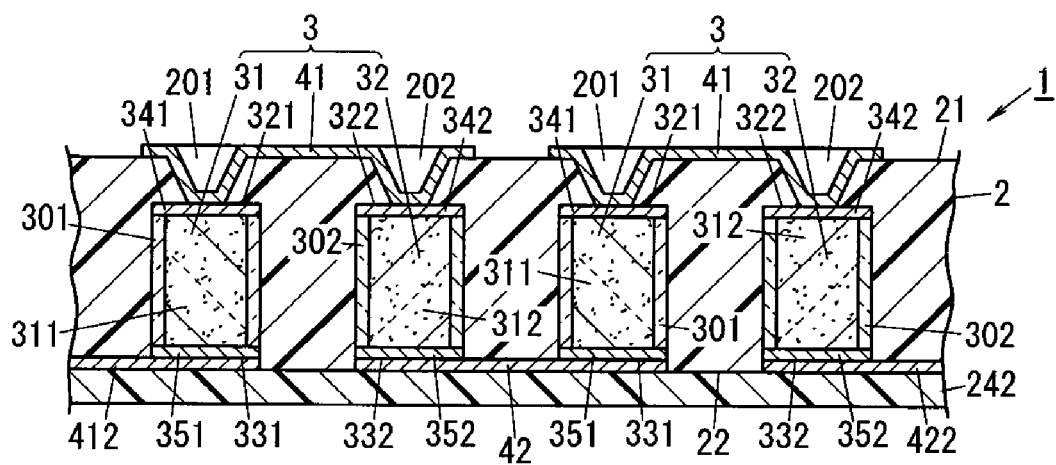

In step H3, as shown in FIG. 32C, metal foil 9 on first surface 21 of insulating substrate 2 is partially removed to form first electrode 41 that electrically connects first thermoelectric member 31 to second thermoelectric member 32.

[(Seventh) Method for Producing Thermoelectric Conversion Substrate]

A method for producing thermoelectric conversion substrate 1 includes following steps shown in FIGS. 33A to 33E and FIGS. 34A to 34C. Thermoelectric conversion substrate 1 is an example including one thermoelectric conversion unit 3. FIGS. 35A to 35E and FIG. 36A to 36C show an example including a plurality of thermoelectric conversion units 3. FIGS. 35A to 35E and FIGS. 36A to 36C respectively correspond to FIGS. 33A to 33E and FIGS. 34A to 34C, and hence the respective steps will be sequentially described mainly with reference to FIGS. 33A to 33E and FIGS. 34A to 34C.

(Step A4)

Figure 33A:
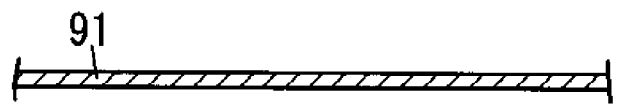
FIGS. 33A to 33E are schematic sectional views illustrating another example of a (seventh) method for producing the thermoelectric conversion substrate according to the exemplary embodiment of the present disclosure.

In step A4, as shown in FIG. 33A, first metal foil 91 is prepared. A specific example of first metal foil 91 is a copper foil.

(Step B4)

In step B4, as in step C1, first thermoelectric member 31 and second thermoelectric member 32 are prepared.

Functions of first thermoelectric member 31 and second thermoelectric member 32 can be directly inspected. In order to suppress variations in inspection, barrier films are preferably formed on both ends of first thermoelectric member 31 and second thermoelectric member 32, respectively. Performing function inspection can sort first thermoelectric members 31 and second thermoelectric members 32 into non-defective products and defective products. Only first thermoelectric member 31 and second thermoelectric member 32 determined as non-defective products are selected and used for production of thermoelectric conversion substrate 1. Since first thermoelectric member 31 and second thermoelectric member 32 can be used after inspection of each function, quality stability of thermoelectric conversion substrate 1 can be improved. This can reduce the possibility that a malfunction is found after production of thermoelectric conversion substrate 1.

Figure 33B:
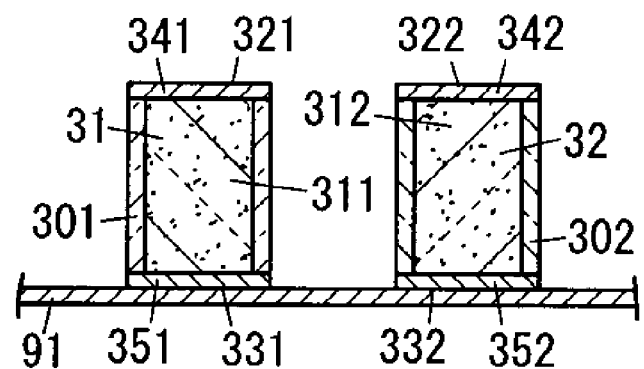

In step B4, as shown in FIG. 33B, at least one first thermoelectric member 31 and at least one second thermoelectric member 32 are soldered to first metal foil 91. Distal end face 331 of first thermoelectric member 31 and distal end face 332 of second thermoelectric member 32 are brought into contact with and soldered to one surface of first metal foil 91.

(Step C4)

In step C4, cured or semi-cured core substrate 8 is prepared. As described above, core substrate 8 may be cured or semi-cured. A specific example of cured core substrate 8 is a cured prepreg. A specific example of semi-cured core substrate 8 is a prepreg. Core substrate 8 has opening portion 800. When core substrate 8 is viewed from the thickness direction, opening portion 800 is formed to have a size large enough to accommodate all first thermoelectric members 31 and second thermoelectric members 32. A thickness of core substrate 8 is preferably greater than a length of each of first thermoelectric member 31 and second thermoelectric member 32.

Figure 33C:
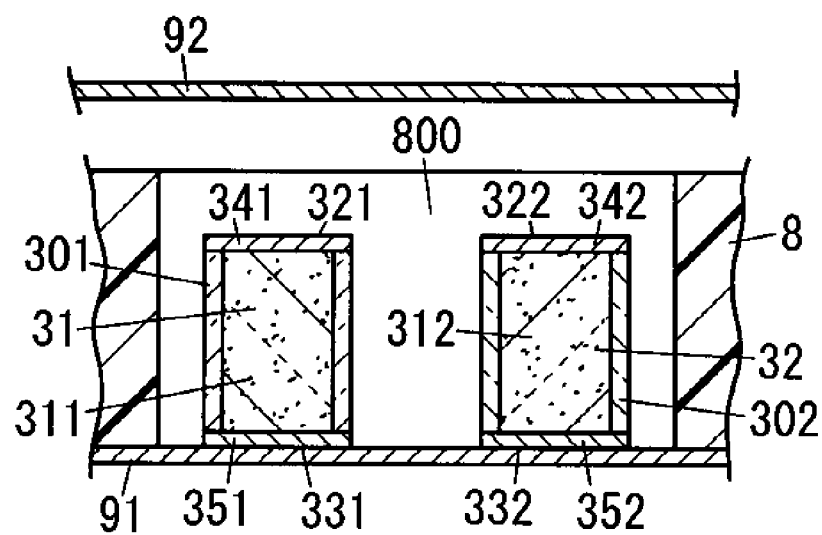

In step C4, as shown in FIG. 33C, core substrate 8 is stacked on first metal foil 91 so as to accommodate first thermoelectric member 31 and second thermoelectric member 32 in opening portion 800. If the thickness of core substrate 8 is greater than the length of each of first thermoelectric member 31 and second thermoelectric member 32, the surface of core substrate 8 is located at a position higher than distal end face 321 of first thermoelectric member 31 and distal end face 322 of second thermoelectric member 32.

In this case, in place of core substrate 8 having opening portion 800 described above, although not shown, a mold having an opening portion having the same shape may be used.

(Step D4)

Figure 33D:
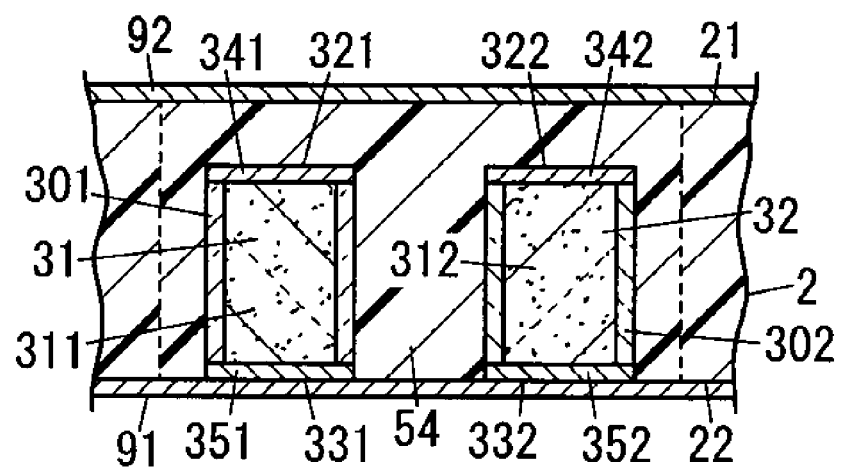

In step D4, as shown in FIG. 33D, resin 54 is poured into opening portion 800 to fill opening portion 800. Resin 54 is preferably a liquid thermosetting resin.

In step D4, as shown in FIG. 33D, second metal foil 92 is stacked on core substrate 8 and then hot-pressed so as to close opening portion 800 filled with resin 54, thereby forming insulating substrate 2 from cured product of core substrate 8 and cured resin 54. A specific example of second metal foil 92 is a copper foil. In the case of the above production method, as compared with a thermal conductivity of cured resin 54, a thermal conductivity of surrounding core substrate 8 may be set to be high. Conditions for hot pressing are not specifically limited.

In this case, in step C4, when the above mold is used, resin 54 may be injected and filled in the opening portion of the mold by transfer molding and heated and cured. Subsequently, cured resin 54 may be removed from the mold. Subsequently, processing follows following steps.

(Step E4)

Figure 33E:
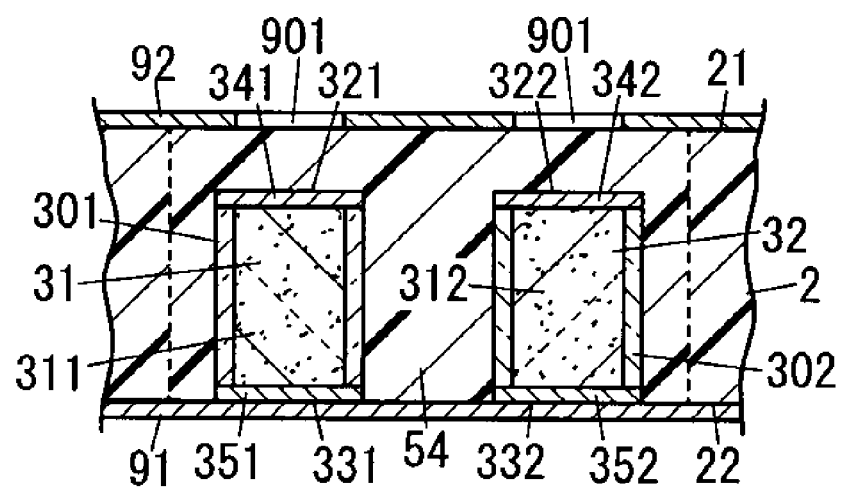

In step E4, as shown in FIG. 33E, portions of second metal foil 92 at a position corresponding to each of locations of first thermoelectric member 31 and second thermoelectric member 32 are removed. Details of this step are almost the same as details of step E2.

(Step F4)

Figure 34A:
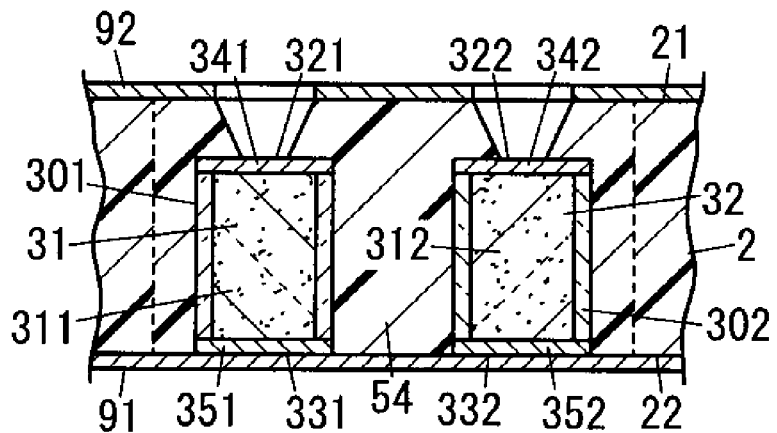
FIGS. 34A to 34C are schematic sectional views illustrating an example of the (seventh) method for producing the thermoelectric conversion substrate, which follow FIG. 33E.

In step F4, as shown in FIG. 34A, portions of insulating substrate 2 at which second metal foil 92 has been removed are removed to expose distal end face 321 of first thermoelectric member 31 and distal end face 322 of second thermoelectric member 32. Details of this step are almost the same as details of step F2.

(Step G4)

Figure 34B:
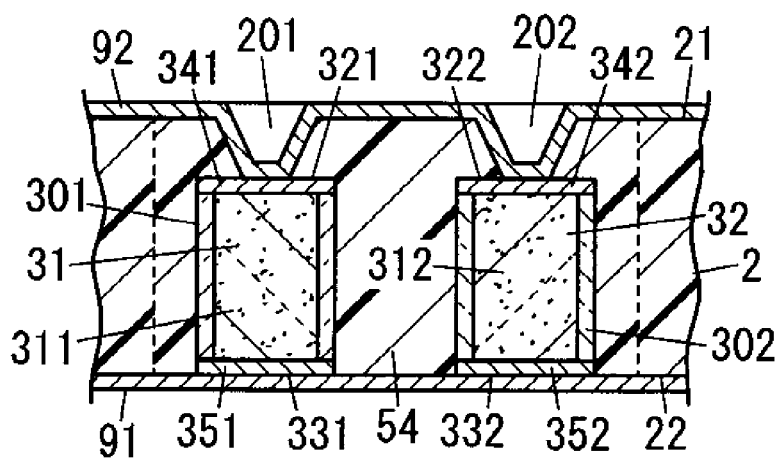

In step G4, as shown in FIG. 34B, plating is provided, ranging from distal end face 321 of first thermoelectric member 31 and distal end face 322 of second thermoelectric member 32 to second metal foil 92. Details of this step are almost the same as details of step G2.

(Step H4)

Figure 34C:
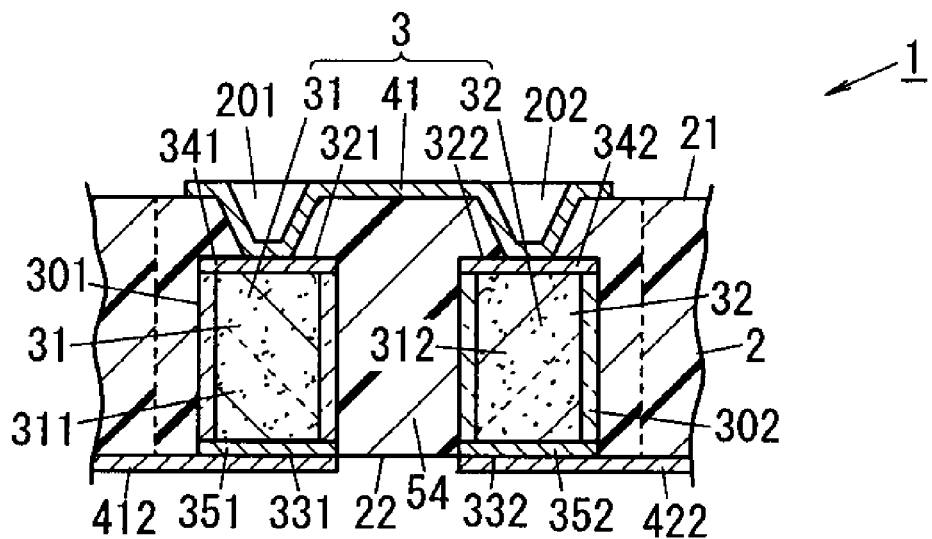
Figure 35A:
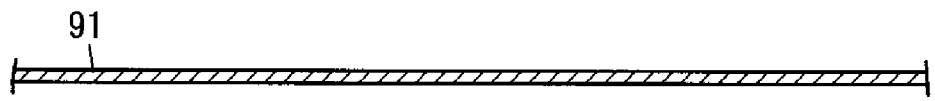
FIGS. 35A to 35E are schematic sectional views illustrating another example of the (seventh) method for producing the thermoelectric conversion substrate according to the exemplary embodiment of the present disclosure.
Figure 35B:
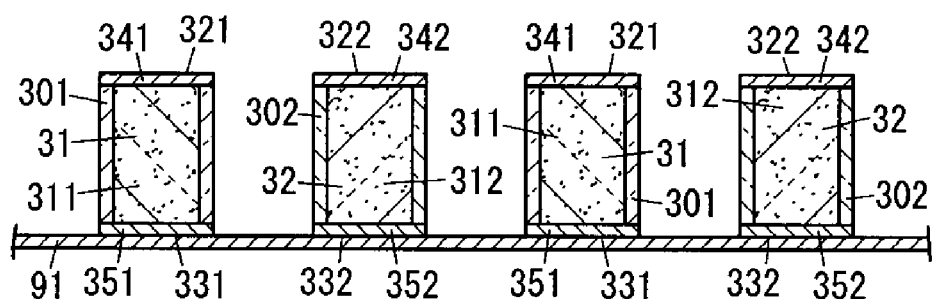
Figure 35C:
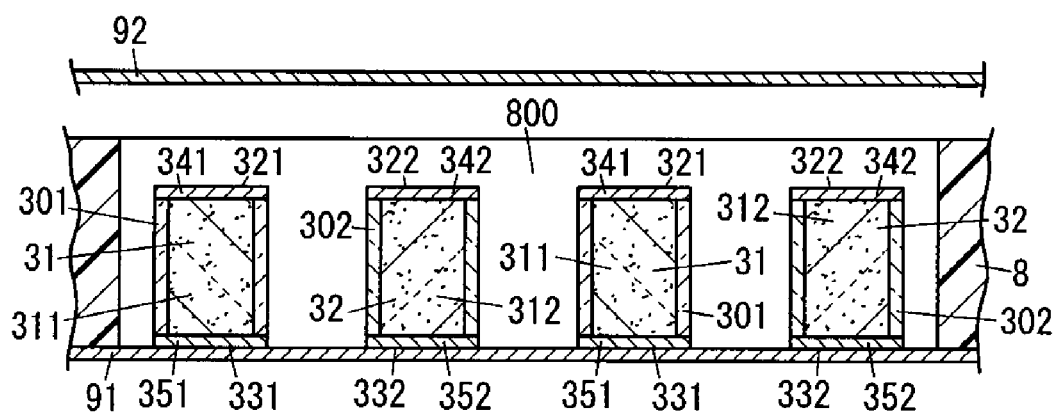
Figure 35D:
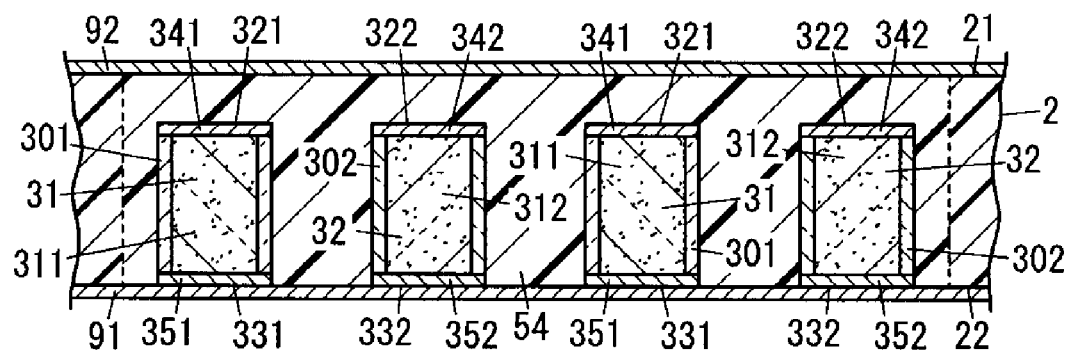
Figure 35E:
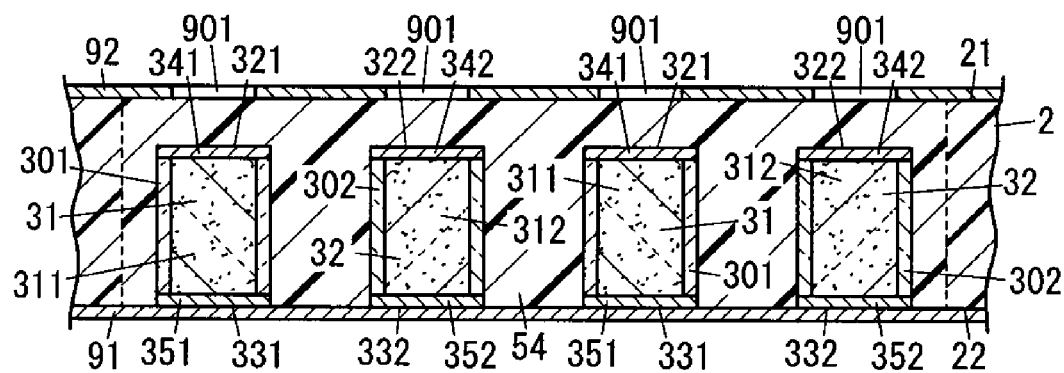
Figure 36A:
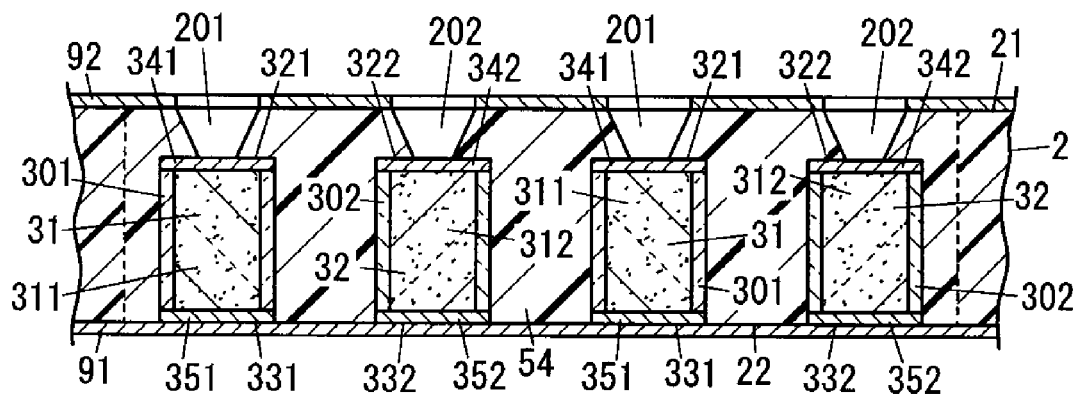
FIGS. 36A to 36C are schematic sectional views illustrating another example of the (seventh) method for producing the thermoelectric conversion substrate, which follow FIG. 35E.
Figure 36B:
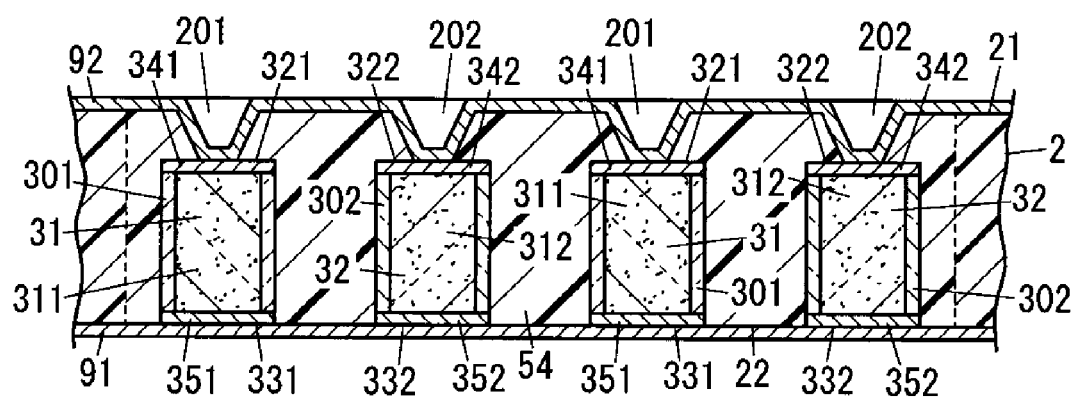
Figure 36C:
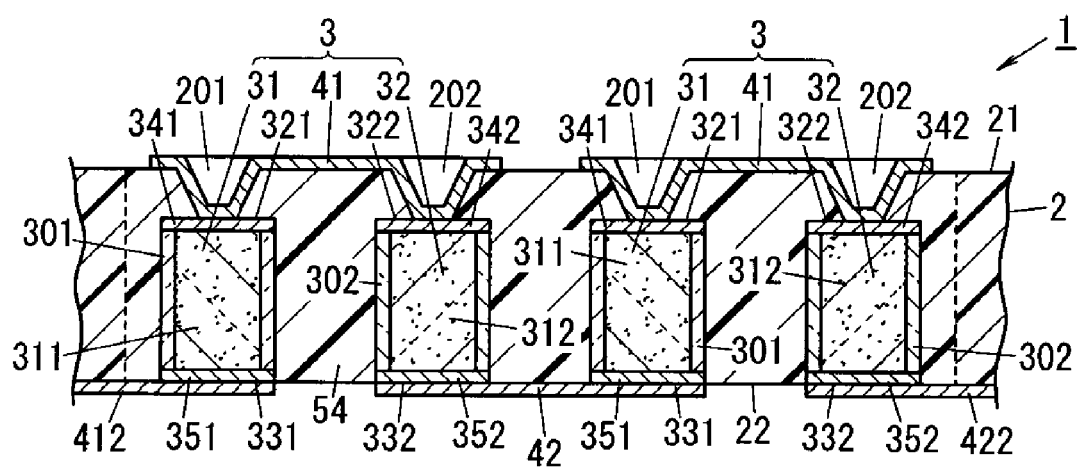

In step H4, as shown in FIG. 34C, second metal foil 92 on first surface 21 of insulating substrate 2 is partially removed to form first electrode 41 that electrically connects first thermoelectric member 31 to second thermoelectric member 32. In this case, first metal foil 91 on second surface 22 of insulating substrate 2 may be partially removed to form second electrodes 412 and 422 for power supply connection. Details of this step are almost the same as details of step H2.

Electronic components including the thermoelectric conversion module and the thermoelectric conversion substrate according to the present disclosure can be installed, for example, on partition walls that partition the insides and outsides of houses or electronic devices and widely used for various purposes, e.g., cooling and heating inside temperatures and generating power using temperature differences between the insides and the ousides.

What is claimed is:

1. A thermoelectric conversion substrate comprising:
   an insulating substrate having a first surface and a second surface at both sides of the insulating substrate in a thickness direction; and
   at least one thermoelectric conversion unit incorporated in the insulating substrate, wherein:
   the at least one thermoelectric conversion unit includes a first thermoelectric member, a second thermoelectric member, and a first electrode disposed on the first surface of the insulating substrate,
   the first thermoelectric member includes a first tubular member having insulation property and a first semiconductor filled in the first tubular member,
   the second thermoelectric member includes a second tubular member having insulation property and a second semiconductor filled in the second tubular member, the second semiconductor having carriers different from carriers of the first semiconductor,
   the first electrode electrically connects the first semiconductor of the first thermoelectric member to the second semiconductor of the second thermoelectric member,
   the first surface of the insulating substrate is spaced apart from each of a first distal end face of the first thermoelectric member and a second distal end face of the second thermoelectric member, the first distal end face and the second distal end face facing the first surface,
   the insulating substrate has, at the first surface, a first opening portion reaching the first distal end face of the first thermoelectric member,
   the insulating substrate has, at the first surface, a second opening portion reaching the second distal end face of the second thermoelectric member,
   an area of the first distal end face of the first thermoelectric member is larger than an area of a bottom surface of the first opening portion,
   an area of the second distal end face of the second thermoelectric member is larger than an area of a bottom surface of the second opening portion, and
   an area of the first opening portion gradually increases from the bottom surface of the first opening portion to the first surface of the insulating substrate.

2. The thermoelectric conversion substrate according to claim 1, further comprising a second electrode disposed on the second surface of the insulating substrate, wherein:
   the at least one thermoelectric conversion unit includes a plurality of thermoelectric conversion units,
   the second electrode electrically connects the first semiconductor of the first thermoelectric member in one of the plurality of thermoelectric conversion units to the second semiconductor of the second thermoelectric member in another of the plurality of thermoelectric conversion units, and
   the plurality of thermoelectric conversion units are electrically connected in series so as to alternately arrange the first semiconductor and the second semiconductor.

3. The thermoelectric conversion substrate according to claim 1, wherein the second surface of the insulating substrate is spaced apart from each of a third distal end face of the first thermoelectric member and a fourth distal end face of the second thermoelectric member, the third distal end face and the fourth distal end face facing the second surface.

4. The thermoelectric conversion substrate according to claim 3, wherein:
   the insulating substrate has, at the second surface, a third opening portion reaching the third distal end face of the first thermoelectric member,
   the insulating substrate has, at the second surface, a fourth opening portion reaching the fourth distal end face of the second thermoelectric member,
   an area of the third distal end face of the first thermoelectric member is larger than an area of a bottom surface of the third opening portion, and
   an area of the fourth distal end face of the second thermoelectric member is larger than an area of a bottom surface of the fourth opening portion.

5. The thermoelectric conversion substrate according to claim 1, wherein:
   the insulating substrate includes a multilayer structure including a core insulating layer and a first insulating layer, the core insulating layer including the first thermoelectric member and the second thermoelectric member, the first insulating layer including neither the first thermoelectric member nor the second thermoelectric member,
   the first insulating layer is located at a side in which the first surface of the insulating substrate is positioned,
   the core insulating layer is located at a side in which the second surface of the insulating substrate is positioned, and
   a thermal conductivity of the first insulating layer is greater than a thermal conductivity of the core insulating layer.

6. The thermoelectric conversion substrate according to claim 3, wherein:
   the insulating substrate includes a multilayer structure including a core insulating layer, a first insulating layer, and a second insulating layer, the core insulating layer including the first thermoelectric member and the second thermoelectric member, the first insulating layer including neither the first thermoelectric member nor the second thermoelectric member, the second insulating layer including neither the first thermoelectric member nor the second thermoelectric member, the core insulating layer is located between the first insulating layer and the second insulating layer, the first insulating layer is located at a side in which the first surface of the insulating substrate is positioned, the second insulating layer is located at a side in which the second surface of the insulating substrate is positioned, and a thermal conductivity of each of the first insulating layer and the second insulating layer is greater than a thermal conductivity of the core insulating layer.

7. The thermoelectric conversion substrate according to claim 6, wherein a wiring layer is disposed in at least one of a boundary between the core insulating layer and the first insulating layer and a boundary between the core insulating layer and the second insulating layer.

8. A thermoelectric conversion module comprising:
the thermoelectric conversion substrate according to claim 1;
an insulating film disposed on at least one of the first surface and the second surface of the insulating substrate of the thermoelectric conversion substrate; and
an electronic component mounted to the thermoelectric conversion substrate via the insulating film.

9. The thermoelectric conversion substrate according to claim 1, wherein an area of the second opening portion gradually increases from the bottom surface of the second opening portion to the first surface of the insulating substrate.

10. The thermoelectric conversion substrate according to claim 4, wherein an area of the third opening portion gradually increases from the bottom surface of the third opening portion to the second surface of the insulating substrate.

11. The thermoelectric conversion substrate according to claim 4, wherein an area of the fourth opening portion gradually increases from the bottom surface of the fourth opening portion to the second surface of the insulating substrate.

12. The thermoelectric conversion substrate according to claim 1, wherein the first electrode has a first part disposed on the first surface of the insulating substrate, a second part continuous from the first part and disposed on an inner wall surface of the first opening portion and a third part continuous from the second part and electrically connected to the first semiconductor of the first thermoelectric member.

13. The thermoelectric conversion substrate according to claim 12, wherein the first electrode has a fourth part continuous from the first part and disposed on an inner wall surface of the second opening portion and a fifth part continuous from the fourth part and electrically connected to the second semiconductor of the second thermoelectric member.

* * * * *